US009365921B2

(12) United States Patent
Yamazaki et al.

(10) Patent No.: US 9,365,921 B2
(45) Date of Patent: Jun. 14, 2016

(54) METHOD FOR FABRICATING LIGHT-EMITTING ELEMENT USING CHAMBER WITH MASS SPECTROMETER

(71) Applicant: Semiconductor Energy Laboratory Co., Ltd., Kanagawa-ken (JP)

(72) Inventors: Shunpei Yamazaki, Tokyo (JP); Satoshi Seo, Kanagawa (JP); Tsunenori Suzuki, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 14/314,566

(22) Filed: Jun. 25, 2014

(65) Prior Publication Data
US 2015/0004722 A1 Jan. 1, 2015

(30) Foreign Application Priority Data

| Jun. 28, 2013 | (JP) | 2013-135919 |
| Aug. 30, 2013 | (JP) | 2013-179326 |
| Aug. 30, 2013 | (JP) | 2013-179343 |
| Aug. 30, 2013 | (JP) | 2013-179351 |

(51) Int. Cl.
| C23C 14/12 | (2006.01) |
| C23C 14/24 | (2006.01) |
| C23C 14/54 | (2006.01) |
| H01L 51/00 | (2006.01) |
| H01L 51/56 | (2006.01) |

(52) U.S. Cl.
CPC .............. *C23C 14/12* (2013.01); *C23C 14/243* (2013.01); *C23C 14/548* (2013.01); *H01L 51/001* (2013.01); *H01L 51/56* (2013.01)

(58) Field of Classification Search
CPC .... C23C 14/12; C23C 14/548; C23C 14/243; H01L 51/001; H01L 51/56
See application file for complete search history.

(56) References Cited

U.S. PATENT DOCUMENTS

| 2007/0030466 A1* | 2/2007 | Shuichi ........................... 355/30 |
| 2007/0172698 A1* | 7/2007 | Iwakuma et al. ............. 428/690 |
| 2012/0298998 A1* | 11/2012 | Yamazaki et al. .............. 257/57 |

FOREIGN PATENT DOCUMENTS

JP 2011-216903 A 10/2011

* cited by examiner

*Primary Examiner* — Mohammad Islam
*Assistant Examiner* — John P Dulka
(74) *Attorney, Agent, or Firm* — Husch Blackwell LLP

(57) ABSTRACT

A light-emitting element and its fabrication method are provided. The light-emitting element includes an EL layer between a pair of electrode, and the EL layer is formed by evaporation of an organic compound. The evaporation is conducted so that the partial pressure of a component with a specific molecular weight in a film-formation chamber, which is monitored by a mass spectrometer, does not exceed a specific value during the evaporation. This method allows the formation of a light-emitting element having an improved lifetime.

15 Claims, 27 Drawing Sheets

METHOD FOR FABRICATING LIGHT-EMITTING ELEMENT USING CHAMBER WITH MASS SPECTROMETER

BACKGROUND OF THE INVENTION

1. Field of the Invention

The present invention relates to a semiconductor device, a display device, a light-emitting device, a lighting device, or a fabrication method thereof. One embodiment of the present invention particularly relates to a method for fabricating a light-emitting element and to the light-emitting element.

2. Description of the Related Art

A light-emitting element having a structure in which a light-emitting layer including an organic compound that is a light-emitting substance is provided between a pair of electrodes has attracted attention as a next-generation flat panel display in terms of characteristics such as being thin and light in weight, high speed response, and direct current low voltage driving. A display device including this light-emitting element is superior in contrast and image quality, and has a wide viewing angle.

The above-described light-emitting element is broadly classified into an inorganic EL element using an inorganic compound and an organic EL element using an organic compound. For example, in fabrication of an organic EL element, an organic compound has a major effect on characteristics of the organic EL element. Many kinds of organic compounds having a variety of characteristics have been synthesized.

However, in the case where an organic compound containing an impurity such as a solvent used in its synthesis is employed in a light-emitting element, the impurity considerably affects the characteristics of the light-emitting element. In other words, the characteristics (e.g., drive voltage, emission efficiency, and lifetime) of the light-emitting element are influenced significantly by the purity of the organic compound used in fabrication of the light-emitting element.

A material with a reduced amount of impurity, which is subjected to purification by sublimation, is generally used as an organic compound for a light-emitting element. The purification by sublimation can remove a solvent remaining after synthesis or a small amount of impurity (see, for example, Patent Document 1). However, in some cases, even when organic compounds subjected to the sublimation purification are used in light-emitting elements, the characteristics of the light-emitting elements may vary.

Thus, in addition to development of a method for synthesizing a high-purity organic compound, development of a method for fabricating a light-emitting element containing a high-purity organic compound is eagerly anticipated to obtain a light-emitting element having excellent characteristics.

PATENT DOCUMENT

Patent Document 1: Japanese Published Patent Application No. 2011-216903

SUMMARY OF THE INVENTION

One embodiment of the present invention provides a method for fabricating a light-emitting element that has high efficiency and a long lifetime, in which an EL layer containing an organic compound is interposed between a pair of electrodes, by reducing impurities in the organic compound. Another embodiment of the present invention provides a method for fabricating a light-emitting element that has high efficiency and a long lifetime, in which an EL layer containing organic compounds is interposed between a pair of electrodes, by reducing impurities in a first organic compound converting triplet excitation energy into luminescence, a second organic compound having an electron-transport property, and a third organic compound having a hole-transport property. Another embodiment of the present invention provides a novel light-emitting element. Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention is a method for fabricating a light-emitting element that has, between a pair of electrodes, an EL layer containing an organic compound, in which a first electrode of the light-emitting element is formed over a substrate, the organic compound is evaporated, and a second electrode is formed. The EL layer is formed by evaporating the organic compound after a partial pressure of a specific impurity component in a film formation chamber is confirmed to be in a certain range by using a mass spectrometer provided in the film formation chamber. The EL layer can include at least a light-emitting layer containing a light-emitting substance and can have a single-layer structure or a layered structure.

In the case where the EL layer has a layered structure, the first electrode of the light-emitting element is formed over the substrate, a plurality of organic compounds are independently evaporated, and the second electrode is formed. The plurality of organic compounds is evaporated after the partial pressure of the specific impurity component in the film formation chamber is confirmed to be in a certain range by using a mass spectrometer provided in the film formation chamber.

In the light-emitting element fabricated by the fabrication method of one embodiment of the present invention, the light-emitting layer may contain a first organic compound (guest material) emitting fluorescence and a second organic compound (host material). In this case, the first organic compound and the second organic compound may be selected so that the second organic compound becomes a singlet exciton from a ground state or by triplet-triplet annihilation (TTA), and the first organic compound is excited by energy transfer from the singlet exciton of the second organic compound. Here, TTA is a phenomenon in which energy and spin angular momentum are exchanged and delivered by collision between a plurality of triplet excitons, so that a singlet exciton is generated.

One embodiment of the present invention is a method for fabricating a light-emitting element which has, between a pair of electrodes, an EL layer containing a first organic compound converting triplet excitation energy into luminescence, a second organic compound having an electron-transport property, and a third organic compound having a hole-transport property, where the EL layer is formed by co-evaporating first organic compound, the second organic compound, and the third organic compound after the partial pressure of the specific impurity component in a film formation chamber is confirmed to be in a certain range by using a mass spectrometer provided in the film formation chamber.

One embodiment of the present invention is a method for fabricating a light-emitting element that includes steps of: forming a first electrode; forming an EL layer over the first electrode; and forming a second electrode over the EL layer. The EL layer contains an organic compound and is formed by evaporating the organic compound after the partial pressure of each component with a mass number of 46 or more and 200 or less in a film formation chamber is confirmed to be higher than or equal to $1\times10^{-12}$ Pa and lower than $5\times10^{-8}$ Pa.

Another embodiment of the present invention is a method for fabricating a light-emitting element that includes steps of: forming a first electrode; forming an EL layer over the first electrode; and forming a second electrode over the EL layer. The EL layer contains a first organic compound emitting fluorescence and a second organic compound and is formed by co-evaporating the first organic compound and the second organic compound after the partial pressure of each component with a mass number of 46 or more and 200 or less in a film formation chamber is confirmed to be higher than or equal to $1\times10^{-12}$ Pa and lower than $5\times10^{-8}$ Pa.

Another embodiment of the present invention is a method for fabricating a light-emitting element that includes steps of: fruiting a first electrode; forming an EL layer over the first electrode; and forming a second electrode over the EL layer. The EL layer contains an organic compound and is formed by evaporating the organic compound after the partial pressure of each component with a mass number of 46 or more and 130 or less in a film formation chamber is confirmed to be higher than or equal to $1\times10^{-12}$ Pa and lower than $5\times10^{-8}$ Pa.

Another embodiment of the present invention is a method for fabricating a light-emitting element that includes steps of: forming a first electrode; forming an EL layer over the first electrode; and forming a second electrode over the EL layer. The EL layer contains a first organic compound emitting fluorescence and a second organic compound and is formed by co-evaporating the first organic compound and the second organic compound after the partial pressure of each component with a mass number of 46 or more and 130 or less in a film formation chamber is confirmed to be higher than or equal to $1\times10^{-12}$ Pa and lower than $5\times10^{-8}$ Pa.

Another embodiment of the present invention is a method for fabricating a light-emitting element that includes steps of: forming a first electrode; forming an EL layer over the first electrode; and forming a second electrode over the EL layer. The partial pressure of each component with a mass number of 46 or more and 200 or less in a film formation chamber at the time of evaporation of the organic compound is higher than or equal to $1\times10^{-12}$ Pa and lower than $5\times10^{-8}$ Pa.

Another embodiment of the present invention is a method for fabricating a light-emitting element that includes steps of forming a first electrode, forming an EL layer over the first electrode, and forming a second electrode over the EL layer. The partial pressure of each component with a mass number of 46 or more and 130 or less in a film formation chamber at the time of evaporation of the organic compound is higher than or equal to $1\times10^{-12}$ Pa and lower than $5\times10^{-8}$ Pa.

Another embodiment of the present invention is a method for fabricating a light-emitting element that includes steps of forming a first electrode, forming an EL layer containing an organic compound over the first electrode, and forming a second electrode over the EL layer. The partial pressure of a component with a mass number of 92 in a film formation chamber is less than or equal to 0.1% of the total pressure at the time of evaporation of the organic compound.

Another embodiment of the present invention is a method for fabricating a light-emitting element that includes steps of forming a first electrode, forming an EL layer containing an organic compound over the first electrode, and forming a second electrode over the EL layer. The partial pressure of toluene in a film formation chamber is less than or equal to 0.1% of the total pressure at the time of evaporation of the organic compound.

Another embodiment of the present invention is a method for fabricating a light-emitting element that includes steps of forming a first electrode, forming an EL layer over the first electrode, and forming a second electrode over the EL layer. The EL layer contains a first organic compound emitting fluorescence and a second organic compound and is formed by co-evaporating the first organic compound and the second organic compound when the partial pressure of toluene in a film formation chamber is less than or equal 0.1% of the total pressure.

Another embodiment of the present invention is a light-emitting element that includes an EL layer between a pair of electrodes, where the EL layer contains an organic compound and is formed by evaporating the organic compound when the partial pressure of each component with a mass number of 46 or more and 200 or less in a film formation chamber is higher than or equal to $1\times10^{-12}$ Pa and lower than $5\times10^{-8}$ Pa. Note that in the case where the initial luminance is set to 5000 cd/m$^2$, the luminance of the light-emitting element after continuous operation for 24 hours is greater than or equal to 90% of the initial luminance.

Another embodiment of the present invention is a light-emitting element that includes an EL layer between a pair of electrodes. The EL layer contains a plurality of organic compound films, and at least one of the organic compound films is formed by evaporating an organic compound when the partial pressure of each component with a mass number of 46 or more and 130 or less in a film formation chamber is higher than or equal to $1\times10^{-12}$ Pa and lower than $5\times10^{-8}$ Pa. Note that in the case where the initial luminance is set to 5000 cd/m$^2$, the luminance of the light-emitting element after continuous operation for 24 hours is greater than or equal to 90% of the initial luminance.

Another embodiment of the present invention is a light-emitting element that includes an EL layer between a pair of electrodes. The EL layer includes a light-emitting layer containing a first organic compound emitting fluorescence and a second organic compound. The light-emitting layer is formed by co-evaporating the first organic compound and the second organic compound when the partial pressure of each component with a mass number of 46 or more and 200 or less in a film formation chamber is higher than or equal to $1\times10^{-12}$ Pa and lower than $5\times10^{-8}$ Pa.

Another embodiment of the present invention is a light-emitting element that includes an EL layer between a pair of electrodes. The EL layer includes a light-emitting layer containing a first organic compound emitting fluorescence and a second organic compound. The light-emitting layer is formed by co-evaporating the first organic compound and the second organic compound when the partial pressure of each component with a mass number of 46 or more and 130 or less in a film formation chamber is higher than or equal to $1\times10^{-12}$ Pa and lower than $5\times10^{-8}$ Pa.

Another embodiment of the present invention is a light-emitting element that includes an EL layer between a pair of electrodes. The EL layer includes a light-emitting layer containing a first organic compound emitting fluorescence and a second organic compound. The light-emitting layer is formed by co-evaporating the first organic compound and the second organic compound when the partial pressure of a component with a mass number of 92 in a film formation chamber is less than or equal to 0.1% of the total pressure.

Another embodiment of the present invention is a light-emitting element that includes an EL layer between a pair of electrodes. The EL layer includes a light-emitting layer containing a first organic compound emitting fluorescence and a second organic compound. The light-emitting layer is formed by co-evaporating the first organic compound and the second organic compound when the partial pressure of toluene in a film formation chamber is less than or equal to 0.1% of the total pressure.

The luminance of the above-described light-emitting element after continuous operation for 100 hours is greater than or equal to 90% of the initial luminance, which is set to 5000 cd/m$^2$.

In each of the above-described structures, the $T_1$ level of the first organic compound is higher than that of the second organic compound.

Another embodiment of the present invention is a method for fabricating a light-emitting element that includes the steps of: forming a first electrode; forming, over the first electrode, an EL layer containing a first organic compound converting triplet excitation energy into luminescence, a second organic compound having an electron-transport property, and a third organic compound having a hole-transport property; and forming a second electrode over the EL layer. The EL layer is formed by co-evaporating the first organic compound, the second organic compound, and the third organic compound when the partial pressure of each component with a mass number of 46 or more and 200 or less in a film formation chamber is higher than or equal to $1 \times 10^{-12}$ Pa and lower than $1 \times 10^{-9}$ Pa.

Another embodiment of the present invention is a method for fabricating a light-emitting element that includes the steps of: forming a first electrode; forming, over the first electrode, an EL layer containing a first organic compound converting triplet excitation energy into luminescence, a second organic compound having an electron-transport property, and a third organic compound having a hole-transport property; and forming a second electrode over the EL layer. The EL layer is formed by co-evaporating the first organic compound, the second organic compound, and the third organic compound when the partial pressure of each component with a mass number of 46 or more and 130 or less in a film formation chamber is higher than or equal to $1 \times 10^{-12}$ Pa and lower than $1 \times 10^{-9}$ Pa.

Another embodiment of the present invention is a method for fabricating a light-emitting element that includes the steps of: forming a first electrode; forming, over the first electrode, an EL layer containing a first organic compound converting triplet excitation energy into luminescence, a second organic compound having an electron-transport property, and a third organic compound having a hole-transport property; and forming a second electrode over the EL layer. The EL layer is formed by co-evaporating the first organic compound, the second organic compound, and the third organic compound when the partial pressure of a component with a mass number of 84 in a film formation chamber is less than or equal to 0.001% of the total pressure.

Another embodiment of the present invention is a method for fabricating a light-emitting element that includes the steps of: forming a first electrode; forming, over the first electrode, an EL layer containing a first organic compound converting triplet excitation energy into luminescence, a second organic compound having an electron-transport property, and a third organic compound having a hole-transport property; and forming a second electrode over the EL layer. The EL layer is formed by co-evaporating the first organic compound, the second organic compound, and the third organic compound when the partial pressure of dichloromethane in a film formation chamber is less than or equal to 0.001% of the total pressure.

Another embodiment of the present invention is a light-emitting element that includes, between a pair of electrodes, an EL layer containing a first organic compound converting triplet excitation energy into luminescence, a second organic compound having an electron-transport property, and a third organic compound having a hole-transport property. The EL layer is formed by co-evaporating the first organic compound, the second organic compound, and the third organic compound when the partial pressure of each component with a mass number of 46 or more and 200 or less in a film formation chamber is higher than or equal to $1 \times 10^{-12}$ Pa and lower than $1 \times 10^{-9}$ Pa.

Another embodiment of the present invention is a light-emitting element that includes, between a pair of electrodes, an EL layer containing a first organic compound converting triplet excitation energy into luminescence, a second organic compound having an electron-transport property, and a third organic compound having a hole-transport property. The EL layer is formed by co-evaporating the first organic compound, the second organic compound, and the third organic compound when the partial pressure of each component with a mass number of 46 or more and 130 or less in a film formation chamber is higher than or equal to $1 \times 10^{-12}$ Pa and lower than $1 \times 10^{-9}$ Pa.

In each of the above-described structures, it is preferable that an excited complex (also referred to as an exciplex) be formed by the second organic compound having an electron-transport property and the third organic compound having a hole-transport property. In addition, it is preferable that the excitation energy of the exciplex be transferred to the first organic compound so that the first organic compound emits light.

According to one embodiment of the present invention, in the case where the initial luminance is set to 5000 cd/m$^2$, the luminance of the above-described light-emitting element after continuous operation for 240 hours is greater than or equal to 90% of the initial luminance.

In each of the above-described structures, a mass-to-charge ratio (m/z) obtained by the mass spectrometric analysis may be employed as the mass number of the component in the film formation chamber.

If an impurity is contained in an organic compound, a film of the evaporated organic compound is likely to contain the impurity. However, the partial pressure of the impurity before or during the evaporation can be measured by using a mass spectrometer as in the embodiments of the invention. In other words, the organic compound is evaporated only when the partial pressure of the impurity is in a certain range, whereby an organic compound film having high purity can be prepared. Therefore, it is possible to form an organic compound film that contains fewer impurities that adversely affect element characteristics of the light-emitting element than ever, and to increase the reliability of the light-emitting element. According to one embodiment of the present invention, impurities in a first organic compound converting triplet excitation energy into luminescence, a second organic compound having an electron-transport property, and a third organic compound having a hole-transport property can be reduced in fabrication of a light-emitting element in which an EL layer containing the organic compounds is interposed between a pair of electrodes. Thus, a light-emitting element that has higher emission efficiency and a longer lifetime than a conventional light-emitting element and a highly efficient light-emitting element that utilizes TTA can be provided. In addition, the use of such a light-emitting element enables an electronic appliance and a lighting device that have high efficiency and a long lifetime to be provided.

DETAILED DESCRIPTION OF THE INVENTION

Hereinafter, embodiments of the present invention are described in detail with reference to the accompanying drawings. Note that the present invention is not limited to the following description, and various changes and modifications can be made without departing from the spirit and scope of the present invention. Therefore, the present invention should not be construed as being limited to the description in the following embodiments.

Embodiment 1

In this embodiment, an example of a method for fabricating a light-emitting element of one embodiment of the present invention is described with reference to FIG. 1 and FIG. 2.

Figure 1:
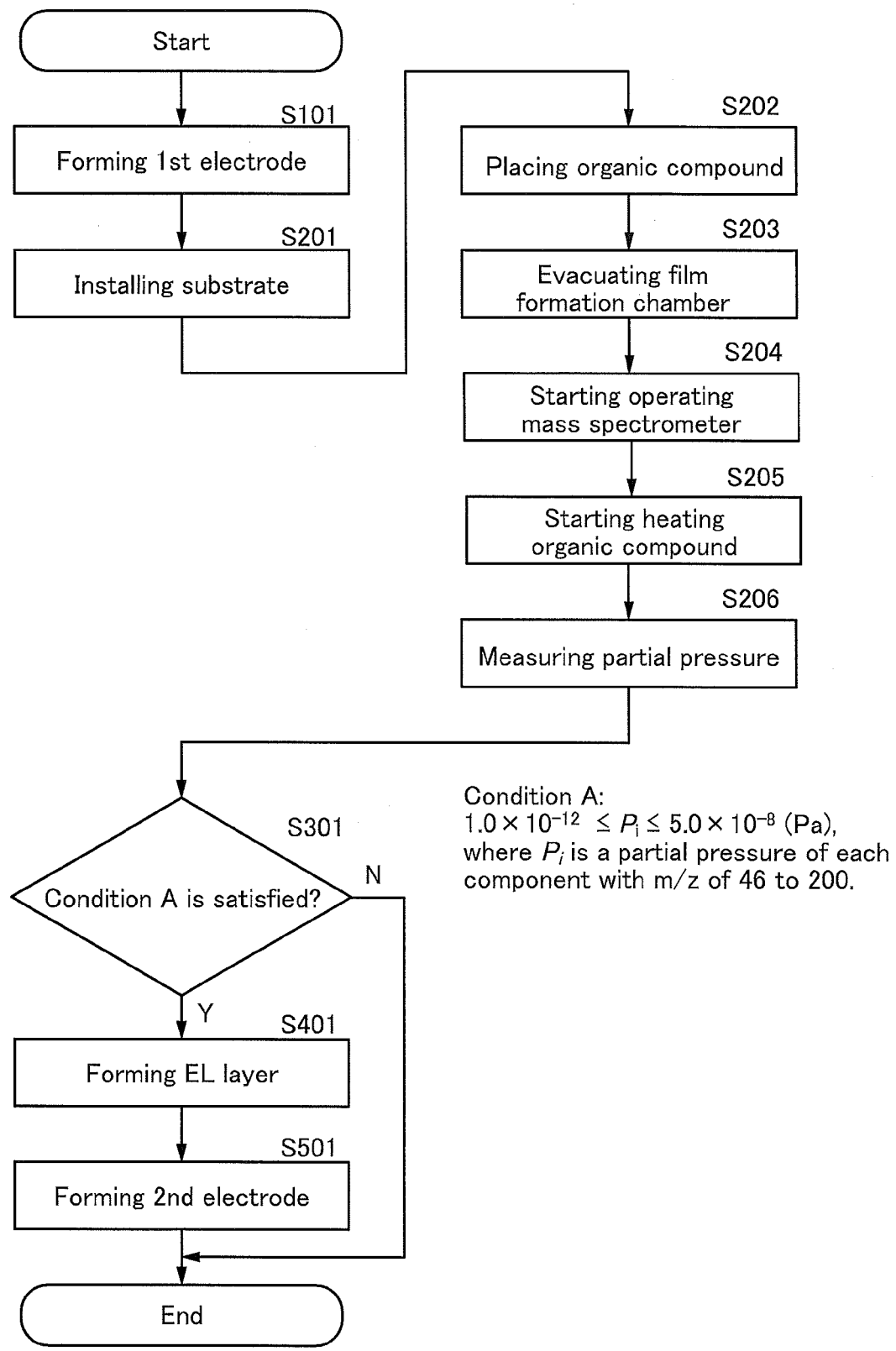
FIG. 1 is a flow chart showing a method for fabricating a light-emitting element.

FIG. 1 is a flow chart showing an example of a method for fabricating a light-emitting element of one embodiment of the present invention. FIG. 2 is a cross-sectional view illustrating a film formation apparatus that can be used for the method for fabricating a light-emitting element of one embodiment of the present invention.

<<Method for Fabricating Light-Emitting Element>>

<Step S101: Formation of First Electrode>

First, a first electrode that functions as an anode or a cathode of a light-emitting element is formed. For example, a glass substrate can be used as a surface where the first electrode is formed. For example, an element such as a transistor that controls driving of the light-emitting element may be formed over the glass substrate. Forming the first electrode over a flexible substrate allows the formation of a flexible light-emitting element which can be folded.

Materials and the formation method of the first electrode are described in Embodiment 4.

<Step S201: Installation of Substrate>

Next, the substrate on which the first electrode is formed is installed into a film formation apparatus (also referred to as an evaporation apparatus). Note that the step S201 is preferably performed concurrently with the step S101 including the formation of the first electrode, in which case the time taken for forming the light-emitting element can be shortened.

Figure 2:
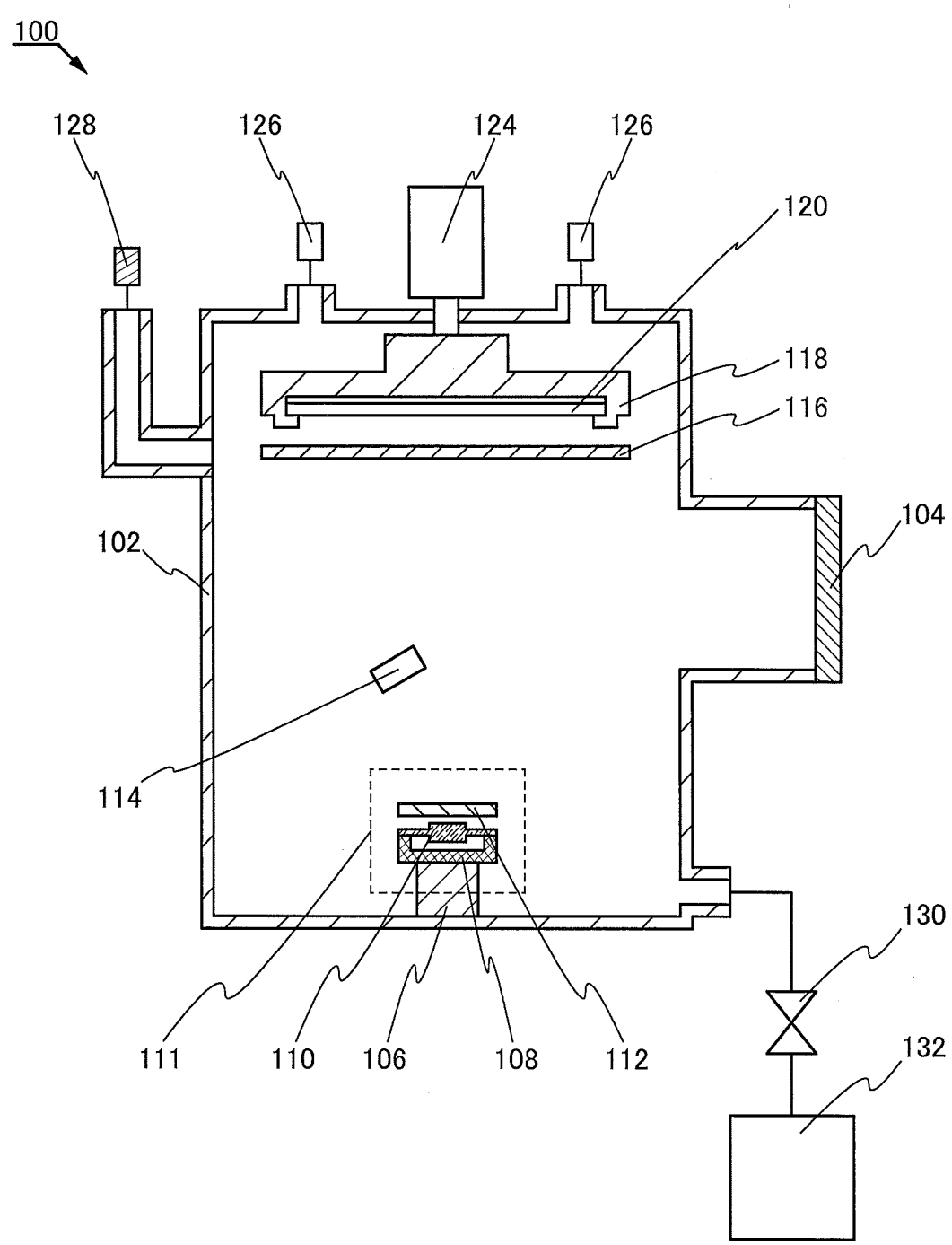
FIG. 2 illustrates a film formation apparatus.

FIG. 2 illustrates an example of the film formation apparatus (also referred to as an evaporation apparatus) that can be used in the method for fabricating a light-emitting element of one embodiment of the present invention.

<Film Formation Apparatus>

The film formation apparatus 100 illustrated in FIG. 2 includes a chamber 102; a gate valve 104 provided for the chamber 102; a table 106 provided in the chamber 102; a heating mechanism 108 provided over the table 106; a holding portion 110 that holds a film-formation material and is connected to the heating mechanism 108; a shutter 112 provided over the holding portion 110; a film-thickness meter 114 provided above the holding portion 110; a rotation mechanism 124 provided outside the chamber 102; a substrate holding mechanism 118 connected to the rotation mechanism 124; a shutter 116 provided to face the substrate holding mechanism 118; imaging devices 126 connected to the chamber 102; a mass spectrometer 128 connected to the chamber 102; a valve 130 connected to the chamber 102; and an exhaust mechanism 132 connected to the chamber 102 via the valve 130. Note that in FIG. 2, the substrate 120 is placed in the film formation apparatus 100 so as to be in contact with the substrate holding mechanism 118.

An evaporation mechanism 111 includes the heating mechanism 108, the holding portion 110, and the shutter 112. Although the structure in which only one evaporation mechanism 111 is provided is illustrated in FIG. 2, a plurality of evaporation mechanisms 111 may be provided in the chamber 102. Different organic compounds can be evaporated by the plurality of evaporation mechanisms 111, whereby the plurality of organic compounds can be evaporated at the same time (co-evaporation). Note that the shutter 112 included in the evaporation mechanism 111 is not necessarily provided.

Each component of the film formation apparatus 100 illustrated in FIG. 2 is described below in detail.

The chamber 102 may be formed of any material as long as the pressure therein can be reduced. However, it is preferable that the chamber 102 be formed of a material that causes little degasification. The gate valve 104 functions to separate the chamber 102 from a transfer chamber or the like connected to the film formation apparatus 100. Note that the outside of the gate valve 104 may be under atmospheric pressure. The table 106 functions to hold the heating mechanism 108. Note that the table 106 is not necessarily provided.

The chamber 102 may include a gas introduction mechanism that can adjust the atmosphere inside the chamber 102. A mechanism that heats an inner wall of the chamber 102 or a mechanism that cools the inner wall may be additionally provided. When the temperature of the inner wall of the chamber 102 is increased, impurities such as moisture are easily released from the inner wall and exhausted to the outside of the chamber 102. In contrast, when the temperature of the inner wall of the chamber 102 is decreased, impurities such as moisture are difficult to release from the inner wall and diffusion of the impurities into the chamber 102 can be suppressed.

As the heating mechanism 108, it is possible to use, for example, a small tube heater formed using a heating wire. As the holding portion 110, it is possible to use a container for keeping an organic compound used as a film formation material, for example, a crucible or a plate formed of a substance having low heat capacity (e.g., tungsten, molybdenum, or tantalum). An organic compound filled in the holding portion 110 can be heated by the heating mechanism 108.

The shutters 112 and 116 function to control evaporation of a vaporized film formation material (organic compound). The shutters 112 and 116 can prevent deposition of the organic compound on the substrate at the initial stage of evaporation. The shutters 112 and 116 can also prevent deposition of the organic compound on the substrate until the vaporization speed of the organic compound is stabilized. Although FIG. 2 illustrates the structure in which the shutters 112 and 116 are provided, one embodiment of the present invention is not limited thereto. For example, any of the following structures may be employed: a structure in which only the shutter 112 is provided, a structure in which only the shutter 116 is provided, and a structure in which neither the shutter 112 nor the shutter 116 is provided.

The film-thickness meter 114 may include, for example, a crystal oscillator. Note that although FIG. 2 illustrates the structure in which the film-thickness meter 114 is provided in the chamber 102, one embodiment of the present invention is not limited thereto. For example, a structure in which the film-thickness meter 114 is provided outside the chamber 102 may be employed.

The rotation mechanism 124 functions to rotate the substrate holding mechanism 118. The rotation mechanism 124 includes, for example, a motor. The substrate 120 and/or an evaporation mask (not illustrated) held by the substrate holding mechanism 118 are/is rotated by rotating the substrate holding mechanism 118, so that the uniformity of film formation can be increased. Note that the substrate holding mechanism 118 may also function as a substrate transfer mechanism. Although FIG. 2 illustrates the structure in which the rotation mechanism 124 is provided, the rotation mechanism 124 is not necessarily provided.

As the imaging device 126, for example, an imaging device such as a charge coupled device (CCD) camera can be provided. It is possible to confirm the locations of the substrate 120 and an evaporation mask (not illustrated) by using the imaging device 126. Note that the imaging device 126 is not necessarily provided.

As the mass spectrometer 128, for example, a deflection (magnetic) mass spectrometer or a non-deflection mass spectrometer can be used. Examples of the deflection mass spectrometer include a single-focusing mass spectrometer, a double-focusing mass spectrometer, and a cycloidal mass spectrometer, and examples of the non-deflection mass spectrometer include a time-of-flight mass spectrometer, an omegatron-type mass spectrometer, and a quadrupole mass spectrometer. As the mass spectrometer 128, a quadrupole mass spectrometer is preferably used. A quadrupole mass spectrometer includes a small analysis unit and thus is easily placed in a desired position. In addition, a quadrupole mass spectrometer can scan at high speed and has high sensitivity in a low-mass region.

As the valve 130, for example, a gate valve, a variable leak valve, or a conductance valve can be used. The exhaust mechanism 132 reduces the pressure in the chamber 102. As the exhaust mechanism 132, for example, a cryopump, a sputtering ion pump, a mechanical booster pump, or a turbo molecular pump can be used. A cryopump is preferable as the exhaust mechanism 132 in consideration of capability of releasing water or the like. Alternatively, a turbo molecular pump or the like provided with an adsorption unit (e.g., a cold trap) may be used as the exhaust mechanism 132.

Note that although the film formation apparatus 100 that includes one chamber is illustrated in FIG. 2, one embodiment of the present invention is not limited thereto. For example, a plurality of pieces of the film formation apparatus 100 may be combined to form a multi-chamber film formation apparatus provided with a transfer chamber, a substrate heating chamber, and the like. The method for fabricating a light-emitting element of one embodiment of the present invention can be employed as long as at least one film formation chamber includes a mass spectrometer and a heating mechanism for heating an organic compound.

<Step S202: Placement of Organic Compound>

An organic compound is placed in Step S202 by placing the organic compound serving as a material for the EL layer in the holding portion 110 illustrated in FIG. 2. In this case, atmospheric components such as moisture and water might be attached to the organic compound.

<Step S203: Evacuation of Film Formation Chamber>

Next, the pressure in the film formation chamber is reduced in Step S203 by operating the exhaust mechanism 132 via the valve 130 connected to the chamber 102 illustrated in FIG. 2. By reducing the pressure in the film formation chamber, the atmospheric components such as moisture and oxygen in the film formation chamber are exhausted to the outside of the film formation chamber. Note that the pressure in the film formation chamber is preferably set to be lower than or equal to $1.0 \times 10^{-4}$ Pa.

<Step S204: Start of Operation of Mass Spectrometer>

Next, operation of the mass spectrometer is started in Step S204. The operation of the mass spectrometer may be started at a pressure in the film formation chamber of, for example, lower than or equal to $1.0 \times 10^{-4}$ Pa, preferably lower than or equal to $5.0 \times 10^{-5}$ Pa.

<Step S205: Start of Heating of Organic Compound>

Next, heating of the organic compound is started in Step S205. Specifically, the heating mechanism 108 illustrated in FIG. 2 is operated.

<Step S206: Measurement of Partial Pressure>

Next, a partial pressure of each component is measured on the basis of the results of the mass analysis in Step S206. Focus is placed on not only an atmospheric component (m/z=1 to 44) but also an organic solvent that might be contained in the organic compound used for the EL layer in this embodiment. Specifically, the partial pressures of the components of m/z=46 to 200, preferably m/z=46 to 130 are measured. Note that in the specification and the claims, the partial pressure is obtained from a ratio of the total intensity of the peaks in a specific m/z range to that in the m/z range of 1 to 200 and the inner pressure of the chamber 102.

An organic solvent is often used when the organic compound used for the EL layer is synthesized. Examples of the organic solvent include ethanol (m/z=46), hexane (m/z=86), dichloromethane (m/z=84), and toluene (m/z=92). In the case where a large amount of organic solvent is contained in the organic compound, the organic solvent can significantly affect initial characteristics and reliability of a light-emitting element including the EL layer. In particular, even when a large amount of organic solvent is contained in the organic compound used for the EL layer, the organic solvent might be difficult to identify after the EL layer is formed. Thus, the organic solvent needs to be certainly removed before forming the EL layer.

<Step S301: Determination Whether Condition A is Satisfied>

Next, it is determined whether Condition A is satisfied in Step S301. The determination may be performed automatically <Condition A>

Condition A is as follows: the partial pressure ($P_i$) of every component with m/z in the range of 46 to 200 is higher than or equal to $1.0 \times 10^{-12}$ Pa and lower than $5.0 \times 10^{-8}$ Pa. In the case where Condition A is satisfied, the process proceeds to Step S301.

In the case where Condition A is not satisfied, that is, in the case where the partial pressure of at least one component with m/z in the range of 46 to 200 is higher than or equal to $5.0 \times 10^{-8}$ Pa, the process stops until the partial pressure reaches less than $5.0 \times 10^{-8}$ Pa. If the partial pressure does not reach less than $5.0 \times 10^{-8}$ Pa, the process proceeds to termination. In this case, the organic compound placed in Step S202 is not evaporatively deposited on the first electrode.

The partial pressure of every component is checked before forming an EL layer in Step S301 and contamination by the impurity having a specific m/z is avoided as described above, so that an EL layer with high purity can be formed.

<Step S401: Formation of EL Layer>

Next, an EL layer is formed in the case where Condition A is satisfied in Step S301. Formation of the EL layer can be started by, for example, opening the shutters 112 and 116. The heating temperature of the organic compound prior to Step S401 is preferably different from that in Step S401. For example, it is preferable that the heating temperature of the organic compound before the formation of the EL layer be a temperature at which the organic compound is not vaporized (i.e., a low temperature) and that the heating temperature at the time of the formation of the EL layer is a temperature at which the organic compound is vaporized (i.e., a high temperature).

Note that, after the EL layer is formed to a desired thickness, the formation of the EL layer is terminated by cooling the heating mechanism 108 to a temperature at which the organic compound used for the EL layer is not vaporized or sublimated or by closing any one of or both of the shutters 112 and 116 after the EL layer is formed to a desired thickness. The thickness of the EL layer can be adjusted with, for example, the film-thickness meter 114 illustrated in FIG. 2.

<Step S501: Formation of Second Electrode>

Next, a second electrode is formed in Step S501. For example, the second electrode can be formed using an evaporation mechanism 111 additionally provided to the film formation apparatus 100 illustrated in FIG. 2. For materials that can be used for the second electrode is described in Embodiment 4.

As described with reference to FIG. 1 and FIG. 2, in the method for fabricating a light-emitting element of one embodiment of the present invention, the first electrode of the light-emitting element is formed over the substrate, the organic compound to be contained in the EL layer is evaporated, and finally, the second electrode is formed. The organic compound is evaporated after a partial pressure of a specific impurity in a film formation chamber before or at the time of evaporation is confirmed to be in a certain range by using a mass spectrometer provided in the film formation chamber. Such a fabrication method can prevent the contamination of the EL layer by the impurity such as an organic solvent that might be contained in the organic compound, which contributes to the formation of a highly reliable light-emitting element.

As described above, a feature of the method for fabricating a light-emitting element of one embodiment of the present invention lies in the step of evaporating an organic compound to be contained in an EL layer. One embodiment of the present invention may be applied only to a step of evaporating an organic compound to be included in an EL layer or a step of evaporating a plurality of organic compounds to be contained in an EL layer. It is particularly preferable that one embodiment of the present invention be applied to formation of all layers included in an EL layer. Examples of the structure and material of a light-emitting element that can be fabricated according to one embodiment of the present invention are described in Embodiment 4 in detail.

The structure described above in this embodiment can be combined as appropriate with any of the structures described in the other embodiments.

Embodiment 2

Figure 28:
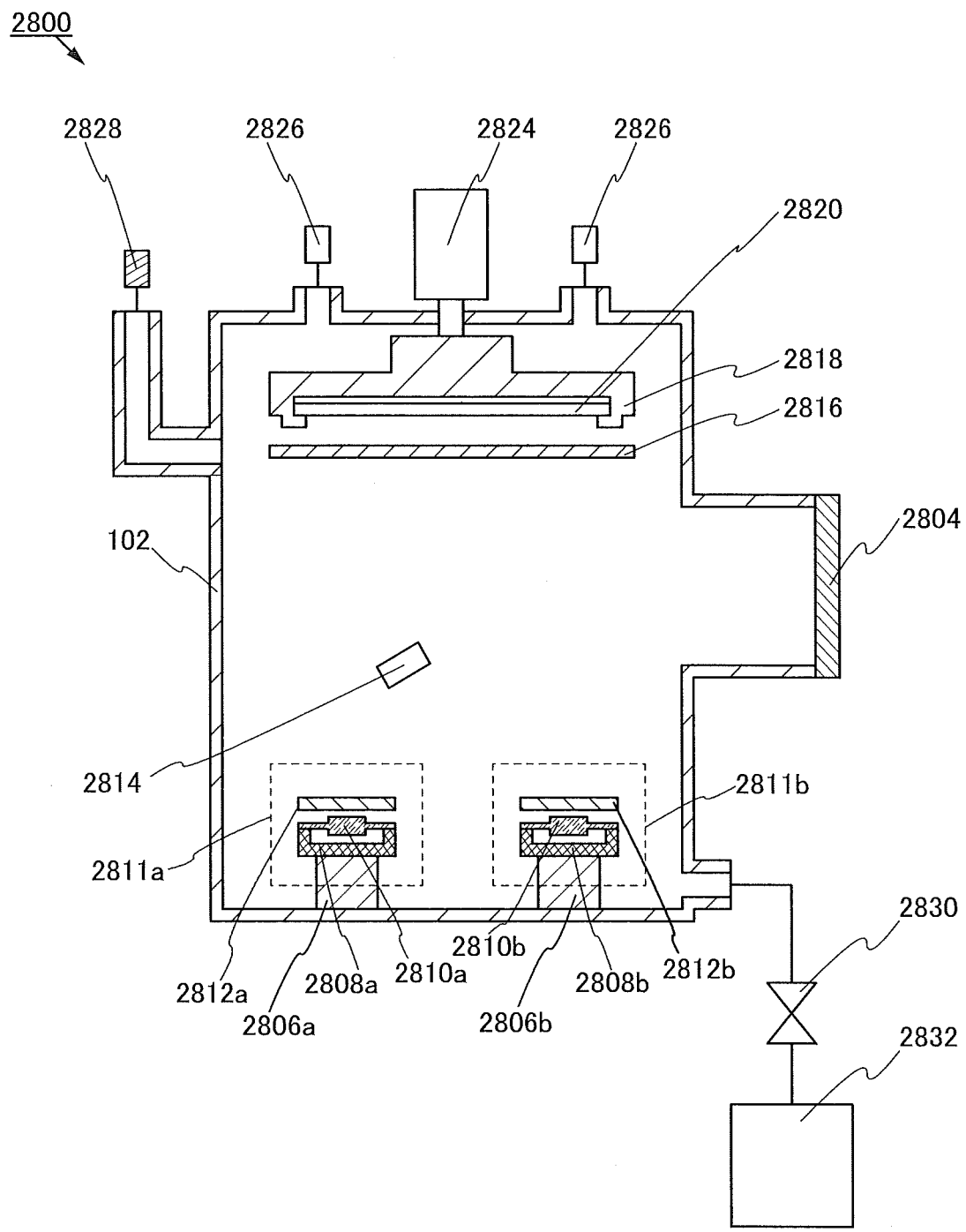
FIG. 28 illustrates a film formation apparatus.

In this embodiment, a method for fabricating a light-emitting element that is one embodiment of the present invention and has a different structure from the light-emitting element described in Embodiment 1 is described with reference to FIG. 1 and FIG. 28. Note that many parts of the description in Embodiment 1 can be referred to for the flow chart of the fabrication method, which is shown in FIG. 1; therefore, simple description is given in this embodiment. FIG. 28 is a cross-sectional view of a film formation apparatus that is used for fabrication of the light-emitting element described in this embodiment.

<Film Formation Apparatus>

A film formation apparatus 2800 illustrated in FIG. 28 includes a chamber 2802; a gate valve 2804 provided for the chamber 2802; tables 2806a and 2806b provided in the chamber 2802; heating mechanisms 2808a and 2808b provided over the tables 2806a and 2806b; holding portions 2810a and 2810b which hold film-formation materials and are connected to the heating mechanisms 2808a and 2808b, respectively; shutters 2812a and 2812b provided over the holding portions 2810a and 2810b; a film-thickness meter 2814 provided above the holding portions 2810a and 2810b, a rotation mechanism 2824 provided outside the chamber 2802; a substrate holding mechanism 2818 connected to the rotation mechanism 2824; a shutter 2816 provided to face the substrate holding mechanism 2818; an imaging device 2826 connected to the chamber 2802; a mass spectrometer 2828 connected to the chamber 2802; a valve 2830 connected to the chamber 2802; and an exhaust mechanism 2832 connected to the chamber 2802 via the valve 2830. Note that in FIG. 28, a substrate 2820 is placed in the film formation apparatus 2800 so as to be in contact with the substrate holding mechanism 2818.

The evaporation mechanisms 2811a and 2811b each include the heating mechanisms 2808a and 2808b, the holding portions 2810a and 2810b, and the shutters 2812a and 2812b. Although the structure in which only two evaporation mechanisms 2811a and 2811b are provided is illustrated in FIG. 28, three or more evaporation mechanisms may be provided in the chamber 2802. Different organic compounds can be evaporated by the plurality of evaporation mechanisms, whereby the plurality of organic compounds can be evaporated at the same time (co-evaporation). Note that the shutters 2812a and 2812b included in the evaporation mechanisms are not necessarily provided.

The details of the components in the film formation apparatus 2800 illustrated in FIG. 28 are similar to those in Embodiment 1, and therefore are not described here.

<Step S202: Placement of Organic Compound>

Organic compounds are placed in Step S202 by placing a first organic compound (guest material) emitting fluorescence and a second organic compound (host material) in the holding portions 2810a and 2810b, respectively.

<Step S203: Evacuation of Film Formation Chamber>

Next, the pressure in the film formation chamber is reduced in Step S203 by operating the exhaust mechanism 2832 via the valve 2830, by which atmospheric components such as moisture and oxygen in the film formation chamber are exhausted to the outside of the film formation chamber. Note that the pressure in the film formation chamber is preferably lower than or equal to $1.0 \times 10^{-4}$ Pa.

<Step S204: Start of Operation of Mass Spectrometer>

Next, operation of the mass spectrometer is started in Step S204. The operation of the mass spectrometer may be started at a pressure in the film formation chamber of, for example, lower than or equal to $1.0 \times 10^{-4}$ Pa, preferably lower than or equal to $5.0 \times 10^{-5}$ Pa.

<Step S205: Start of Heating of Organic Compound>

Next, heating of the organic compound is started in Step S205. Specifically, the heating mechanisms 2808a and 2808b illustrated in FIG. 28 and are operated.

<Step S206: Measurement of Partial Pressure>

Next, a partial pressure of each component is measured on the basis of the results of the mass analysis in Step S206. Focus is placed on not only an atmospheric component (m/z=1 to 44) but also an organic solvent that might be contained in each of the organic compounds used for EL layers. Specifically, the partial pressures of the components of m/z=46 to 200, preferably m/z=46 to 130 are measured.

An organic solvent is often used when the organic compound used for the EL layer is synthesized. Examples of the organic solvent include ethanol (m/z=46), hexane (m/z=86), dichloromethane (m/z=84), and toluene (m/z=92). In the case where a large amount of organic solvent is contained in the organic compound, the organic solvent can significantly affect initial characteristics and reliability of a light-emitting element including the EL layer. In particular, even when a large amount of organic solvent is contained in the organic compound used for the EL layer, the organic solvent might be difficult to identify after the EL layer is formed. Thus, the organic solvent needs to be certainly removed before forming the EL layer.

<Step S301: Determination Whether Condition A is Satisfied>

Next, it is determined whether Condition A is satisfied in Step S301. The determination may be performed automatically <Condition A>

Condition A is as follows: the partial pressure ($P_1$) of every component with m/z in the range of 46 to 200 is higher than or equal to $1.0 \times 10^{-12}$ Pa and lower than $5.0 \times 10^{-8}$ Pa. In the case where Condition A is satisfied, the process proceeds to Step S301.

In the case where Condition A is not satisfied, that is, in the case where the partial pressure of at least one component with m/z in the range of 46 to 200 is higher than or equal to $5.0 \times 10^{-8}$ Pa, the process is terminated. In this case, the organic compounds placed in Step S202 are not evaporatively deposited on the first electrode.

The partial pressure of every component is checked before forming an EL layer in Step S301 and evaporation of an organic compound is not performed in the case where Condition A is not satisfied as described above, so that formation of an EL layer containing impurities can be prevented.

<Step S401: Formation of EL Layer>

Next, an EL layer is formed in the case where Condition A is satisfied in Step S301. For example, the EL layer can be formed in such a manner that the shutters 2812a and 2812b and the shutter 2816 are opened to allow the first organic compound and the second organic compound to be co-evaporated. The heating temperature of the organic compounds prior to Step S401 is preferably different from that in Step S401. For example, it is preferable that the heating temperature of the organic compounds before the formation of the EL layer be a temperature at which the organic compound is not vaporized (i.e., a low temperature) and that the heating temperature at the time of the formation of the EL layer is a temperature at which the organic compound is vaporized (i.e., a high temperature).

Note that, after the EL layer is formed to a desired thickness, the formation of the EL layer is terminated by cooking the heating mechanism 2808 to a temperature at which the organic compound used for the EL layer is not vaporized or sublimated or by closing any one of or both of the shutters 2812 (2812a and 2812b) and 2816 after the EL layer is formed to a desired thickness. The thickness of the EL layer can be adjusted with, for example, the film-thickness meter 2814 illustrated in FIG. 28.

<Step S501: Formation of Second Electrode>

Next, a second electrode is formed in Step S501. The details thereof are similar to those in Embodiment 1.

In the above-described fabrication method, the EL layer that contains reduced impurities can be formed. Thus, impurities in the EL layer can be reduced, so that a highly reliable light-emitting element can be fabricated.

The structure described above in this embodiment can be combined as appropriate with any of the structures described in the other embodiments.

Embodiment 3

In this embodiment, a method for fabricating a light-emitting element of one embodiment of the present invention that is different from the method for fabricating a light-emitting element described in each of Embodiment 1 and Embodiment 2 is described with reference to FIG. 29 and FIG. 30. Note that portions that are the same as the portions in the fabrication method described in the above embodiments are not described in detail here.

Figure 29:
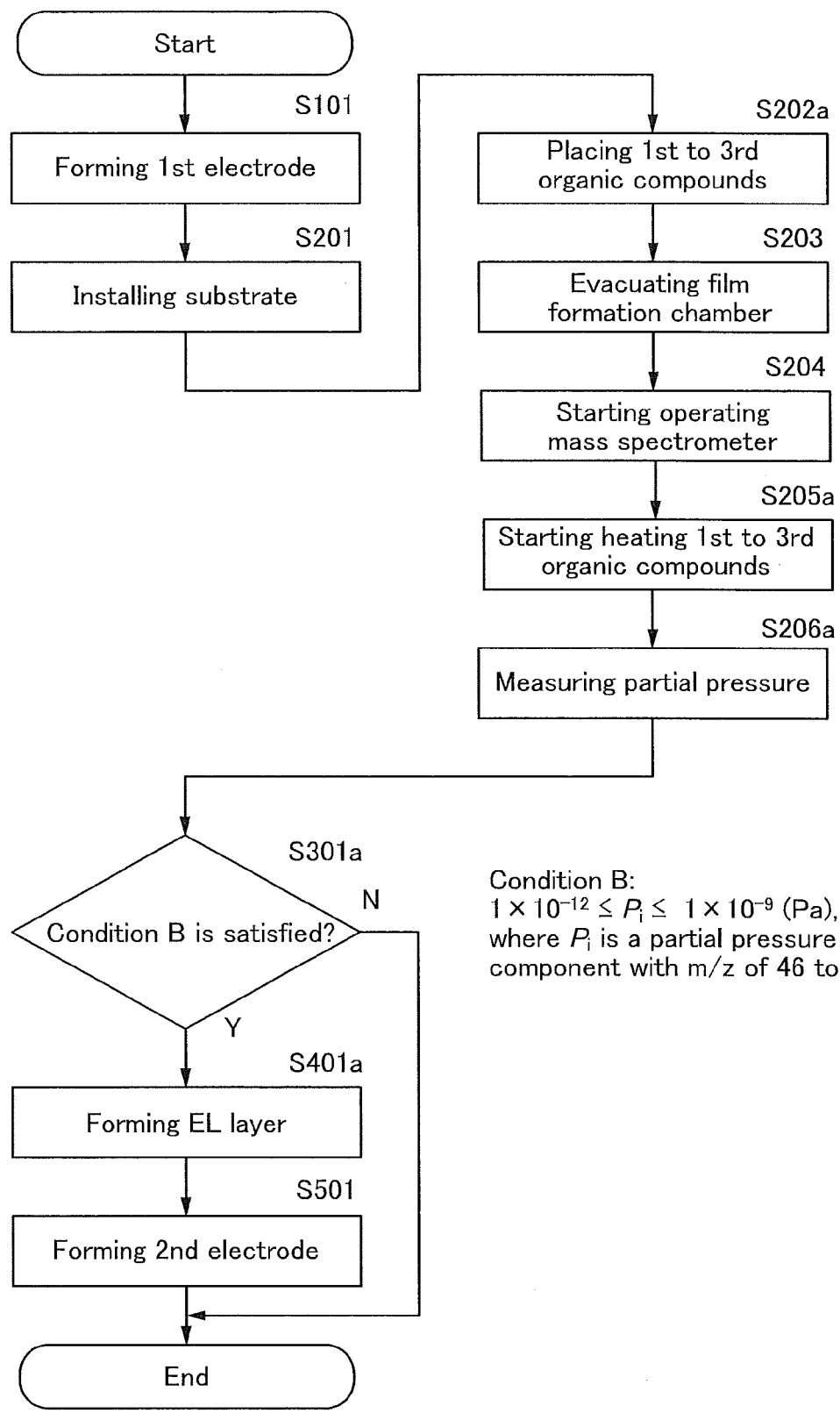
FIG. 29 is a flow chart showing a method for fabricating a light-emitting element.

FIG. 29 is a flow chart showing an example of a method for fabricating a light-emitting element of one embodiment of the present invention. FIG. 30 is a cross-sectional view illustrating a film formation apparatus that can be used for the method for fabricating a light-emitting element of one embodiment of the present invention.

<<Method for Fabricating Light-Emitting Element>>
<Step S101: Formation of First Electrode>

For Step S101, the description of Step S101 shown in FIG. 1, which is given in Embodiment 1, can be referred to.

<Step S201: Installation of Substrate>

For Step S201, the description of Step S201 shown in FIG. 1, which is given in Embodiment 1, can be referred to.

Figure 30:
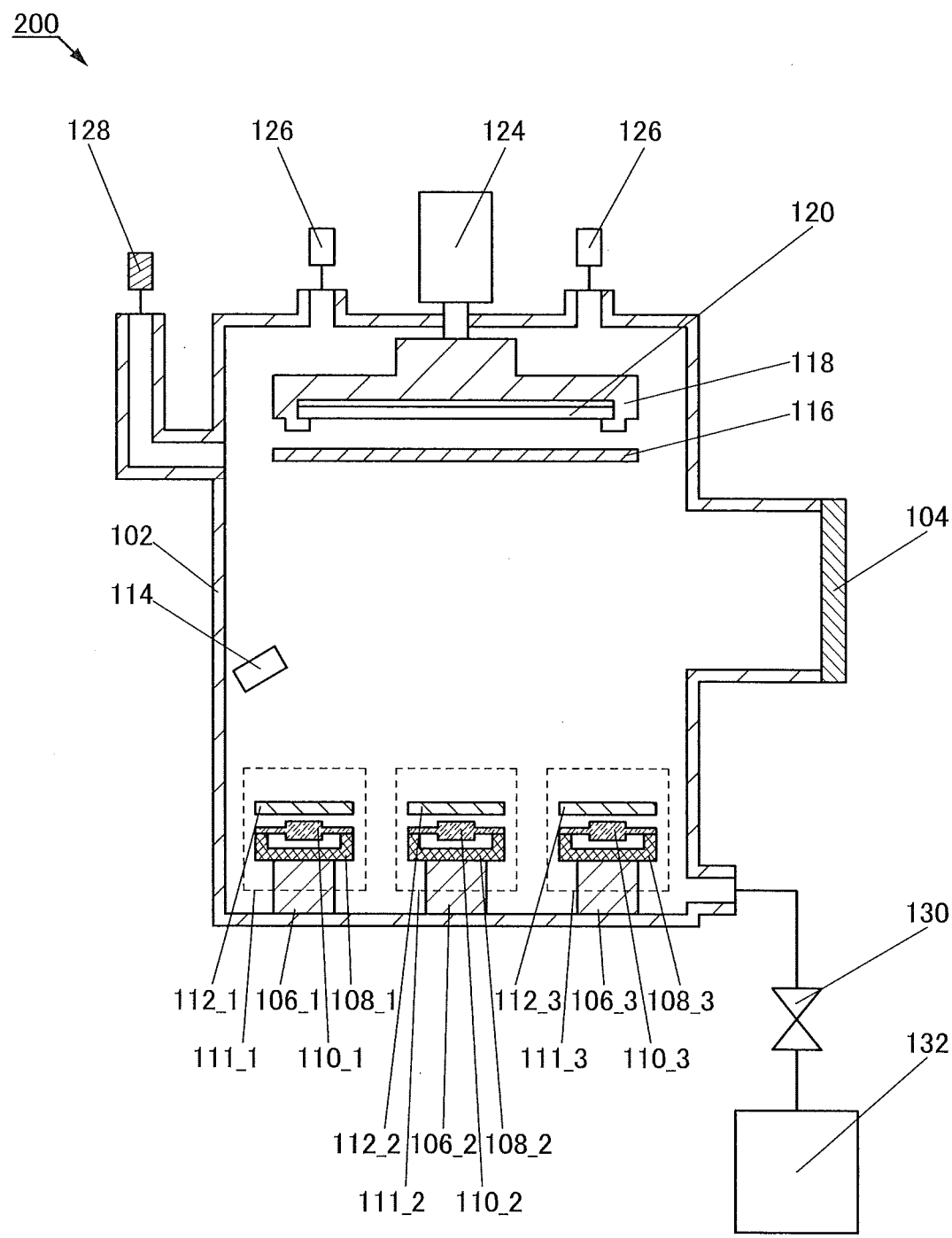
FIG. 30 illustrates a film formation apparatus.

FIG. 30 illustrates an example of a film formation apparatus that can be used in the method for fabricating a light-emitting element of one embodiment of the present invention.

<Film Formation Apparatus>

A film formation apparatus 200 illustrated in FIG. 30 includes a chamber 102; a gate valve 104 provided for the chamber 102; tables 106_1, 106_2, and 106_3 provided in the chamber 102; heating mechanisms 108_1, 108_2, and 108_3 provided over the tables 106_1, 106_2, and 106_3, respectively; holding portions 110_1, 110_2, and 110_3 that hold film-formation materials and are connected to the heating mechanisms 108_1, 108_2, and 108_3, respectively; shutters 112_1, 112_2, and 112_3 provided over the holding portions 110_1, 110_2, and 110_3, respectively; a film-thickness meter 114 provided above the holding portions 110_1, 110_2, and 110_3; a rotation mechanism 124 provided outside the chamber 102; a substrate holding mechanism 118 connected to the rotation mechanism 124; a shutter 116 provided to face the substrate holding mechanism 118; imaging devices 126 connected to the chamber 102; a mass spectrometer 128 connected to the chamber 102; a valve 130 connected to the chamber 102; and an exhaust mechanism 132 connected to the chamber 102 via the valve 130. Note that in FIG. 30, a substrate 120 is placed in the film formation apparatus 200, specifically so as to be in contact with the substrate holding mechanism 118.

An evaporation mechanism 111_1 includes the heating mechanism 108_1, the holding portion 110_1, and the shutter 112_1. An evaporation mechanism 111_2 includes the heating mechanism 108_2, the holding portion 110_2, and the shutter 112_2. An evaporation mechanism 111_3 includes the heating mechanism 108_3, the holding portion 110_3, and the shutter 112_3. Different organic compounds are evaporated by the deposition mechanisms 111_1, 111_2, and 111_3, whereby a plurality of organic compounds, three organic compounds here, can be evaporated at the same time (co-evaporation). Note that although the structure in which the film formation apparatus 200 includes the three evaporation mechanisms 111_1, 111_2, and 111_3 is illustrated in FIG. 30, one embodiment of the present invention is not limited thereto. For example, the film formation apparatus 200 may include four or more evaporation mechanisms. The shutters 112_1, 112_2, and 112_3 included in the evaporation mechanism 111_1, 111_2, and 111_3, respectively are not necessarily provided.

Each component of the film formation apparatus 200 illustrated in FIG. 30 is described in detail. Note that components denoted by the same reference numerals as the components in the film formation apparatus 100 illustrated in FIG. 1 are not described in detail here.

As the heating mechanisms 108_1, 108_2, and 108_3, it is possible to use, for example, a small tube heater faulted using a heating wire. As the holding portions 110_1, 110_2, and 110_3, it is possible to use a container for keeping an organic compound used as a film formation material, for example, a crucible or a plate formed of a substance having low heat capacity (e.g., tungsten, molybdenum, or tantalum). An organic compound filled in the holding portions 110_1, 110_2, and 110_3 can be heated by the heating mechanisms 108_1, 108_2, and 108_3.

The shutters 112_1, 112_2, and 112_3 and the shutter 116 function to control evaporation of a vaporized film formation material (organic compound). The shutters 112_1, 112_2, and 112_3 and the shutter and 116 can prevent deposition of the organic compound on the substrate at the initial stage of evaporation. The shutters 112_1, 112_2, and 112_3 and the shutter 116 can also prevent deposition of an organic compound over a substrate until the vaporization speed of the organic compound is stabilized. Although FIG. 30 illustrates the structure in which the shutters 112_1, 112_2, and 112_3 and the shutter 116 are provided, one embodiment of the present invention is not limited thereto. For example, any of the following structures may be employed: a structure in which the shutters 112_1, 112_2, and 112_3 are not provided, a structure in the shutter 116 is not provided, and a structure in which neither the shutters 112_1, 112_2, and 112_3 and the shutter 116 is not provided.

Note that although the film formation apparatus 200 that includes one chamber illustrated in FIG. 30, one embodiment of the present invention is not limited thereto. For example, a plurality of the film formation apparatuses 200 may be combined to form a multi-chamber film formation apparatus provided with a transfer chamber, a substrate heating chamber, and the like. The method for fabricating a light-emitting element of one embodiment of the present invention can be employed as long as at least one film formation chamber includes a mass spectrometer and a heating mechanism for heating an organic compound.

<Step S202a: Placement of First to Third Organic Compounds>

First to third organic compounds are placed in Step S202a by placing the first to third organic compounds in the holding portions 110_1, 110_2, and 110_3, respectively. In this case, atmospheric components such as moisture and water might be attached to the first to third organic compounds.

<Step S203: Evacuation of Film Formation Chamber>

For Step S203, the description of Step S203 shown in FIG. 1, which is given in Embodiment 1, can be referred to.

<Step S204: Start of Operation of Mass Spectrometer>

For Step S204, the description of Step S204 shown in FIG. 1, which is given in Embodiment 1, can be referred to.

<Step S205a: Start of Heating of First to Third Organic Compounds>

Next, heating of the first to third organic compounds is started in Step S205a. Specifically, the heating mechanisms 108_1 to 108_3 illustrated in FIG. 30 are operated. Note that the heating of the first to third organic compounds may be started at the same time or started separately.

<Step S206a: Measurement of Partial Pressure>

Next, a partial pressure of each component is measured on the basis of the results of the mass analysis in Step S206a. Focus is placed on not only on an atmospheric component (m/z=1 to 44) but also an organic solvent that might be contained in each of the first to third organic compounds used for the EL layer in this embodiment. Specifically, the partial pressures of the components of m/z=46 to 200, preferably m/z=46 to 130 are measured.

An organic solvent is often used when the first to third organic compounds used for the EL layer are synthesized. Examples of the organic solvent include ethanol (m/z=46), hexane (m/z=86), dichloromethane (m/z=85), and toluene (m/z=92). In the case where a large amount of organic solvent is contained in each of the first to third organic compounds, the organic solvent can significantly affect initial characteristics and reliability of a light-emitting element including an EL layer. In particular, even when a large amount of organic solvent is contained in each of the first to third organic compounds used for the EL layer, the organic solvent might be difficult to identify after EL layer is formed. Thus, the organic solvent needs to be certainly removed before forming the EL layer.

<Step S301a: Determination Whether Condition B is Satisfied>

Next, it is determined whether Condition B is satisfied in Step S301a. The determination may be performed automatically.

<Condition B>

Condition B is as follows: the partial pressure ($P_i$) of every component with m/z in the range of 46 to 200 is higher than or equal to $1 \times 10^{-12}$ Pa and lower than $1 \times 10^{-9}$ Pa. In the case where Condition A is satisfied, the process proceeds to Step S401a.

In the case where Condition B is not satisfied, that is, in the case where the partial pressure of at least one component with m/z in the range of 46 to 200 is higher than or equal to $1 \times 10^{-9}$ Pa, the process proceeds to termination. In this case, the first to third organic compounds placed in Step S202a are not evaporatively deposited on the first electrode.

The partial pressure of every impurity having a mass number in the specific range is measured, and contamination by the impurity is avoided, so that an EL layer with high purity can be formed.

<Step S401a: Formation of EL Layer (Co-Evaporation)>

Next, an EL layer is formed in the case where Condition B is satisfied in Step S301a. For example, the shutters 112_1 to 112_3 are appropriately selected and opened. After that, the shutter 116 near the substrate 120 is opened to form the EL layer on the first electrode formed over the substrate 120. The heating temperature of the first to third organic compounds at the time of the formation of the EL layer prior to Step S401a is preferably different from that in Step S401a. For example, it is preferable that the heating temperature of the first to third organic compounds before the formation of the EL layer be a temperature at which the first to third organic compounds are not vaporized (i.e., a low temperature) and that the heating temperature in the formation of the EL layer is a temperature at which the first to third organic compounds are vaporized (i.e., a high temperature).

In this embodiment, the first to third organic compounds are evaporated at the same time (co-evaporation); thus, an organic compound film in which the first to third organic compounds are mixed can be formed.

Note that the formation of the EL layer is terminated by cooling the heating mechanisms 108_1, 108_2, and 108_3 to temperatures at which the first to third organic compounds are not vaporized or sublimated or by closing any one of or both of the shutters 112 and 116 after the EL layer is formed to a desired thickness. The thickness of the EL layer can be adjusted with, for example, the film-thickness meter 114 illustrated in FIG. 30.

<Step S501: Formation of Second Electrode>

For Step S501, the description of Step S501 shown in FIG. 1, which is given in Embodiment 1, can be referred to.

In the above-described fabrication method, the first to third organic compounds to be contained in the EL layer are formed after impurities having specific mass-numbers are sufficiently removed from the first to third organic compounds and the film formation chamber. Thus, the impurities such as an organic solvent that might be contained in the first to third organic compounds can be prevented from entering the EL layer, so that a highly reliable light-emitting element can be fabricated.

As described above, a feature of the method for fabricating a light-emitting element of one embodiment of the present invention lies in the step of evaporating the first to third organic compounds to be contained in an EL layer. Examples of the structure and material of a light-emitting element that can be fabricated according to one embodiment of the present invention are described in detail later.

The structure described above in this embodiment can be combined as appropriate with any of the structures described in the other embodiments.

Embodiment 4

In this embodiment, a light-emitting element fabricated by the fabrication method of one embodiment of the present invention that is described in Embodiment 1 is described with reference to FIG. 3A.

Figure 3A:
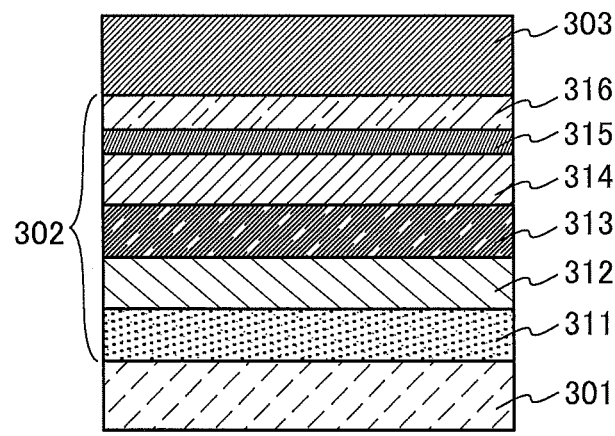
FIGS. 3A and 3B each illustrate a structure of a light-emitting element.

In the light-emitting element described in this embodiment, as illustrated in FIG. 3A, an EL layer 302 including a light-emitting layer 313 is provided between a pair of electrodes (a first electrode (anode) 301 and a second electrode (cathode) 303), and the EL layer 302 includes a hole-injection layer 311, a hole-transport layer 312, an electron-transport layer 314, an electron-injection layer 315, a charge-generation layer (E) 316, and the like in addition to the light-emitting layer 313.

By application of voltage to such a light-emitting element, holes injected from the first electrode 301 side and electrons injected from the second electrode 303 side recombine in the light-emitting layer 313 to lead a light-emitting substance contained in the light-emitting layer 313 to an excited state. Light is emitted when the light-emitting substance in the excited state returns to the ground state.

The hole-injection layer 311 included in the EL layer 302 is a layer containing a substance having a high hole-transport property and an acceptor substance. When electrons are abstracted from the substance having a high hole-transport property owing to the acceptor substance, holes are generated. Thus, holes are injected from the hole-injection layer 311 into the light-emitting layer 313 through the hole-transport layer 312.

The charge-generation layer (E) 316 is a layer containing a substance having a high hole-transport property and an acceptor substance. Note that although the structure in which the charge-generation layer (E) 316 is provided is illustrated as an example in FIGS. 3A and 3B, the structure in which the charge-generation layer (E) 316 is not provided may be employed.

A specific example of other layers of the light-emitting element described in this embodiment is described below.

As the first electrode (anode) 301 and the second electrode (cathode) 303, a metal, an alloy, an electrically conductive compound, a mixture thereof, and the like can be used. Specific examples are indium oxide-tin oxide (indium tin oxide (ITO)), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti). In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like can be used. Note that the first electrode (anode) 301 and the second electrode (cathode) 303 can be formed by, for example, a sputtering method or an evaporation method (including a vacuum evaporation method).

Examples of the substance having a high hole-transport property that is used for the hole-injection layer 311, the hole-transport layer 312, and the charge-generation layer (E) 316 include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'biphenyl]-4,4'-diamine (abbreviation: TPD), 4,4',4"-tris (carbazol-9-yl)triphenylamine (abbreviation: TCTA), 4,4', 4"-tris(N,N-diphenylamino)triphenylamine (abbreviation: TDATA), 4,4',4"-tris[N-(3-methylphenyl)-N-phenylamino] triphenylamine (abbreviation: MTDATA), and 4,4'-bis[N-(spiro-9,9'-bifluoren-2-yl)-N-phenylamino]biphenyl (abbreviation: BSPB); [N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Other examples include carbazole derivatives such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). The substances given here are mainly ones that have a hole mobility of $10^{-6}$ $cm^2/Vs$ or higher. Note that any substance other than the substances given above may be used as long as the hole-transport property is higher than the electron-transport property.

A high molecular compound such as poly(N-vinylcarbazole) (abbreviation: PVK), poly(4-vinyltriphenylamine) (abbreviation: PVTPA), poly[N-(4-{N'-[4-(4-diphenylamino) phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can also be used.

As examples of the acceptor substance that is used for the hole-injection layer 311 and the charge-generation layer (E) 316, a transition metal oxide or an oxide of a metal belonging to any of Group 4 to Group 8 of the periodic table can be given. Specifically, molybdenum oxide is particularly preferable.

The light-emitting layer 313 is a layer containing a light-emitting substance. The light-emitting layer 313 may contain only a light-emitting substance; alternatively, a light-emitting substance may be dispersed as a guest material in a host material. In this case, a substance that has high triplet excitation energy is preferably used as the host material.

There is no particular limitation on the material that can be used as the light-emitting substance in the light-emitting layer 313. A light-emitting substance converting singlet excitation energy into luminescence (hereinafter, referred to as fluorescent substance) or a light-emitting substance converting triplet excitation energy into luminescence (hereinafter, referred to as phosphorescent substance) can be used. Described below are examples of the light-emitting substance and the emission center substance.

Examples of the fluorescent substance include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis [N,N,N-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N'-triphenyl-1, 4-phenylenediamine (abbreviation: 2DPAPPA), N,N,N',N', N",N",N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9, 10-bis(1,1'-biphenyl-2-yl)-2-anthryl]-N,N',N'-triphenyl-1,4-phenylenediamine (abbreviation: 2DPABPhA), 9,10-bis(1, 1'-biphenyl-2-yl)-N-[4-(9H-carbazol-9-yl)phenyl]-N- phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). Note that a substance emitting a thermally activated delayed fluorescence (TADF) can be used as a fluorescent substance.

Examples of the phosphorescent substance include bis[2-(3',5'-bistrifluoromethylphenyl)pyridinato-N,$C^{2'}$]iridium (III) picolinate (abbreviation: Ir($CF_3$ppy)$_2$(pic)), bis[2-(4',6'-difluorophenyl)pyridinato-N,$C^{2'}$]iridium(III) acetylacetonate (abbreviation: FIracac), tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), tris(acetylacetonato)(monophenanthroline)terbium (III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-N,$C^{2'}$)iridium(III) acetylacetonate (abbreviation: Ir(dpo)$_2$(acac)), bis{2-[4'-(perfluorophenyl)phenyl]pyridinato-N,$C^{2'}$}iridium (III) acetylacetonate (abbreviation: Ir(p-PF-ph)$_2$(acac)), bis (2-phenylbenzothiazolato-N,$C^{2'}$)iridium(III) acetylacetonate (abbreviation: Ir(bt)$_2$(acac)), bis[2-(2'-benzo[4,5-α]thienyl)pyridinato-N,$C^{3'}$]iridium(III) acetylacetonate (abbreviation: Ir(btp)$_2$(acac)), bis(1-phenylisoquinolinato-N,$C^{2'}$)iridium (III) acetylacetonate (abbreviation: Ir(piq)$_2$(acac)), (acetylacetonato)bis[2,3-bis(4-fluorophenyl)quinoxalinato]iridium (III) (abbreviation: Ir(Fdpq)$_2$(acac)), (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: [Ir(mppr-iPr)$_2$(acac)]), (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium (III) (abbreviation: [Ir(tppr)$_2$(dpm)], (acetylacetonato)bis(6-tert-butyl-4-phenylpyrimidinato)iridium(III) (abbreviation: [Ir(tBuppm)$_2$(acac)]), (acetylacetonato)bis(4,6-diphenylpyrimidinato)iridium(III) (abbreviation: [Ir(dppm)$_2$(acac)]), 2,3,7,8,12,13,17,18-octaethyl-21H,23H-porphyrin platinum (II) (abbreviation: PtOEP), tris(1,3-diphenyl-1,3-propanedionato)(monophenanthroline)europium(III) (abbreviation: Eu(DBM)$_3$(Phen)), and tris[1-(2-thenyl)-3,3,3-trifluoroacetonato](monophenanthroline)europium(III) (abbreviation: Eu(TTA)$_3$(Phen)).

Preferable examples of the substance (i.e., host material) used for dispersing any of the above light-emitting substances include: compounds having an arylamine skeleton, such as 2,3-bis(4-diphenylaminophenyl)quinoxaline (abbreviation: TPAQn) and NPB, carbazole derivatives such as CBP and TCTA, and metal complexes such as bis[2-(2-hydroxyphenyl)pyridinato]zinc (abbreviation: Znpp$_2$), bis[2-(2-hydroxyphenyl)benzoxazolato]zinc (abbreviation: Zn(BOX)$_2$), bis (2-methyl-8-quinolinolato)(4-phenylphenolato)aluminum (abbreviation: BAlq), and tris(8-quinolinolato)aluminum (abbreviation: Alq$_3$). A high molecular compound such as PVK can also be used.

Note that "delayed fluorescence" refers to light emission having the same spectrum as normal fluorescence and an extremely long lifetime. The lifetime is $10^{-6}$ seconds or longer or $10^{-3}$ seconds or longer. Specific examples of the TADF material include fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$ (Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP). Alternatively, a heterocyclic compound including a π-electron rich heteroaromatic ring and a π-electron deficient heteroaromatic ring can be used, such as 2-(biphenyl-4-yl)-4,6-bis(12-phenylindolo[2,3-a]carbazol-11-yl)-1,3,5-triazine (abbreviation: PIC-TRZ). Note that a material in which the π-electron rich heteroaromatic ring is directly bonded to the π-electron deficient heteroaromatic ring is particularly preferably used, in which case the donor property of the π-electron rich heteroaromatic ring and the acceptor property of the π-electron deficient heteroaromatic ring are both increased and the energy difference between the S$_1$ level and the T$_1$ level becomes small.

Any of the above light-emitting substances and host materials can be used to form the light-emitting layer 313, so that highly efficient emission can be obtained from the light-emitting layer 313.

The electron-transport layer 314 is a layer containing a substance having a high electron-transport property. For the electron-transport layer 314, a metal complex such as Alq$_3$, tris(4-methyl-8-quinolinolato)aluminum (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), Zn(BOX)$_2$, or bis[2-(2-hydroxyphenyl)benzothiazolato]zinc (II) (abbreviation: Zn(BTZ)$_2$) can be used. A heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used. A high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can also be used. The substances given here are mainly ones that have an electron mobility of $1 \times 10^{-6}$ cm$^2$/Vs or higher. Note that any substance other than the substances given above may be used for the electron-transport layer 314 as long as the electron-transport property is higher than the hole-transport property.

The electron-transport layer 314 is not limited to a single layer, and may be a stack of two or more layers containing any of the substances given above.

The electron-injection layer 315 is a layer containing a substance having a high electron-injection property. For the electron-injection layer 315, an alkali metal, an alkaline earth metal, or a compound thereof, such as lithium (Li), cesium (Cs), calcium (Ca), lithium fluoride (LiF), cesium fluoride (CsF), calcium fluoride ($CaF_2$), or lithium oxide ($LiO_x$), can be used. A rare earth metal compound like erbium fluoride ($ErF_3$) can also be used. Any of the above substances for forming the electron-transport layer 314 can also be used.

A composite material in which an organic compound and an electron donor (donor) are mixed may also be used for the electron-injection layer 315. Such a composite material is excellent in an electron-injection property and an electron-transport property because electrons are generated in the organic compound by the electron donor. In this case, the organic compound is preferably a material that is excellent in transporting the generated electrons. Specifically, for example, the substances for forming the electron-transport layer 314 (e.g., a metal complex and a heteroaromatic compound), which are described above, can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, and ytterbium are exemplified. In addition, an alkali metal oxide and an alkaline earth metal oxide are preferable, and lithium oxide, calcium oxide, and barium oxide are given. A Lewis base such as magnesium oxide can also be used. An organic compound such as tetrathiafulvalene (abbreviation: TTF) can also be used.

It is preferable that at least one of the above-described hole-injection layer 311, hole-transport layer 312, light-emitting layer 313, electron-transport layer 314, electron-injection layer 315, and charge-generation layer (E) 316 be formed by the method described in any of Embodiments 1 to 3.

In the above-described light-emitting element, current flows because of a potential difference applied between the first electrode 301 and the second electrode 303 and holes and electrons are recombined in the EL layer 302, whereby light is emitted. This emitted light is extracted outside through one or both of the first electrode 301 and the second electrode 303. Therefore, one or both of the first electrode 301 and the second electrode 303 are electrodes having light-transmitting properties.

The above-described light-emitting element is fabricated by the fabrication method of one embodiment of the present invention, and thus can have a longer lifetime than a conventional light-emitting element.

Note that a light-emitting element having a microcavity structure in which the optical path between electrodes of the light-emitting element is adjusted for the wavelength of light emitted from a light-emitting layer may be fabricated.

The structure described above in this embodiment can be combined as appropriate with any of the structures described in the other embodiments.

Embodiment 5

In this embodiment, a light-emitting element fabricated by the fabrication method of one embodiment of the present invention that is described in Embodiment 2 is described with reference to FIG. 3A.

In the light-emitting element of this embodiment illustrated in FIG. 3A, like the light-emitting element described in Embodiment 4, an EL layer 302 including a light-emitting layer 313 is provided between a pair of electrodes (first electrode (anode) 301 and second electrode (cathode) 303), and the EL layer 302 includes a hole-injection layer 311, a hole-transport layer 312, an electron-transport layer 314, an electron-injection layer 315, a charge-generation layer (E) 316, and the like in addition to the light-emitting layer 313. Note that in the case of the light-emitting element described in this embodiment, at least a first organic compound (guest material) emitting fluorescence and a second organic compound (host material) are contained in the light-emitting layer 313.

In the case of the light-emitting element described in this embodiment, by application of voltage to the light-emitting element, holes injected from the first electrode 301 side and electrons injected from the second electrode 303 side recombine in the light-emitting layer 313 to lead the second organic compound to an excited state. Fluorescence from the first organic compound due to energy transfer from a singlet exciton of the second organic compound can be obtained. Furthermore, fluorescence from the first organic compound due to energy transfer from a singlet exciton generated by triplet-triplet annihilation (TTA) of the second organic compound is obtained.

A method for fabricating the light-emitting element described in this embodiment is specifically described below. Note that portions that are the same as the portions in Embodiment 4 are not described here. Thus, materials and formation methods of the first electrode 301, the second electrode 303, the hole-injection layer 311, the hole-transport layer 312, the charge-generation layer (E) 316, the electron-transport layer 314, and the electron-injection layer 315 are not described.

The light-emitting layer 313 is a layer containing at least the first organic compound emitting fluorescence and the second organic compound. Note that the light-emitting layer 313 may contain another organic compound as long as TTA occurs therein. The population of the second organic compound is higher than that of the first organic compound in the light-emitting layer. The $T_1$ level of the second organic compound is arranged to be lower than that of the first organic compound so that the energy transfer from the triplet exciton of the second organic compound, which is formed in the light-emitting layer, to the first organic compound does not occur. Such an arrangement prevents a reduction of the collision probability of the triplet excitons of the second organic compound, leading to an increase in occurrence of TTA.

Specific examples of an organic compound that can be used as the first organic compound include pyrene compounds such as N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N-bis[4-(9-phenyl-9H-fluoren-9-yl)phenyl]-N,N'-diphenylpyrene-1,6-diamine (abbreviation: 1,6FLPAPrn), N,N'-bis(dibenzofuran-2-yl)-N,N-diphenylpyrene-1,6-diamine (abbreviation: 1,6FrAPrn), and N,N'-bis(dibenzothiophen-2-yl)-N,N-diphenylpyrene-1,6-diamine (abbreviation: 1,6ThAPrn); anthracene compounds; triphenylene compounds; fluorene compounds; carbazole compounds: dibenzothiophene compounds; dibenzofuran compounds; dibenzoquinoxaline compounds; quinoxaline compounds; pyridine compounds; pyrimidine compounds; phenanthrene compounds; and naphthalene compounds. In particular, the pyrene compound is preferable because of its high luminescence quantum yield.

Specific examples of an organic compound that can be used as the second organic compound include anthracene compounds such as 9-phenyl-3-[4-(10-phenyl-9-anthryl)phenyl]-

9H-carbazole (abbreviation: PCzPA), 3-[4-(1-naphthyl)-phenyl]-9-phenyl-9H-carbazole (abbreviation: PCPN), CzPA, 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). The anthracene compound is preferable because of its high $S_1$ level and low $T_1$ level.

Note that the first organic compound and the second organic compound are selected so that the $T_1$ level of the second organic compound is higher than that of the first organic compound. However, another light-emitting layer may be additionally provided by freely using known organic compounds.

In the above-described light-emitting element, current flows by applying potential difference between the first electrode 301 and the second electrode 303 and holes and electrons are recombined in the EL layer 302, whereby light is emitted. This emitted light is extracted outside through one or both of the first electrode 301 and the second electrode 303. Therefore, one or both of the first electrode 301 and the second electrode 303 are electrodes having light-transmitting properties.

The above-described light-emitting element is fabricated by the fabrication method of one embodiment of the present invention; thus, impurities in the light-emitting layer can be reduced. Furthermore, the above-described light-emitting element is a fluorescent element that emits fluorescence utilizing a singlet exciton generated by TTA of a triplex exciton which generally does not contribute to luminescence, and thus can have a long lifetime and high efficiency.

Note that the light-emitting element described in this embodiment may be fabricated so as to have a microcavity structure in which the optical path between electrodes of the light-emitting element is adjusted for the wavelength of light emitted from a light-emitting layer.

Figure 3B:
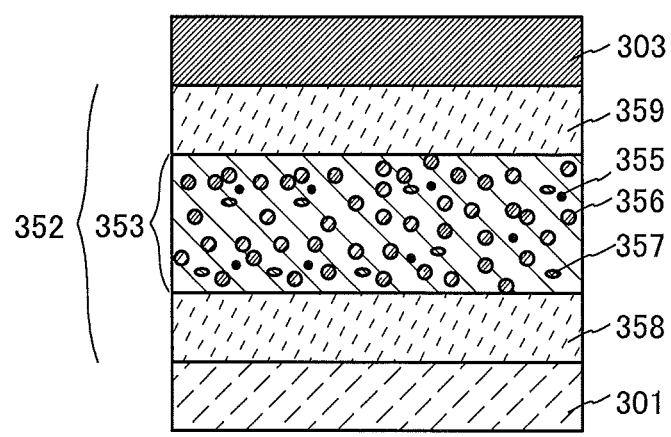

The light-emitting element described in this embodiment can have a structure illustrated in FIG. 3B. The light-emitting element illustrated in FIG. 3B is a light-emitting element fabricated by the fabrication method of one embodiment of the present invention, in which a light-emitting layer containing a first organic compound converting triplet excitation energy into luminescence (i.e., first phosphorescent organic compound), a second organic compound having an electron-transport property, and a third organic compound having a hole-transport property is included in an EL layer.

Specifically, the light-emitting element illustrated in FIG. 3B includes an EL layer 352 between a pair of electrodes (a first electrode 301 and a second electrode 303). Note that the EL layer 352 includes at least a light-emitting layer 353 and may include a hole-injection layer, a hole-transport layer, an electron-transport layer, an electron-injection layer, a charge-generation layer, and the like. Note that in FIG. 3B, the above-described hole-injection layer, hole-transport layer, electron-transport layer, electron-injection layer, and charge-generation layer, and the like can be provided as appropriate in a region 358 between the first electrode 301 and light-emitting layer 353 and in a region 359 between the second electrode 303 and the light-emitting layer 353. The substances given above can be used for the hole-injection layer, the hole-transport layer, the electron-transport layer, the electron-injection layer, and the charge-generation layer.

The light-emitting layer 353 contains the first phosphorescent organic compound 355, a second organic compound 356, and a third organic compound 357. Note that the first phosphorescent organic compound 355 is a guest material in the light-emitting layer 353. One of the second organic compound 356 and the third organic compound 357, the content of which is higher than that of the other in the light-emitting layer 353, is a host material.

When the light-emitting layer 353 has the structure in which the guest material is dispersed in the host material, crystallization of the light-emitting layer can be suppressed. In addition, it is possible to suppress concentration quenching due to high concentration of the guest material, and thus the light-emitting element can have higher emission efficiency.

Note that it is preferable that the $T_1$ level of each of the second organic compound 356 and the third organic compound 357 be higher than that of the first phosphorescent organic compound 355. This is because, when the $T_1$ level of the second organic compound 356 (or the third organic compound 357) is lower than that of the first phosphorescent organic compound 355, the triplet excitation energy of the first phosphorescent organic compound 355, which contributes to luminescence, is quenched by the second organic compound (or the third organic compound 357), resulting in a reduction in emission efficiency.

Here, for improvement in efficiency of energy transfer from a host material to a guest material, Förster mechanism (dipole-dipole interaction) which is known as a mechanism of energy transfer between molecules is considered. According to the mechanisms, it is preferable that an emission of a host material largely overlap with an absorption of a guest material. In particular, in the case of where the guest material is a phosphorescent material, it is preferable that fluorescence of the host material largely overlap with an absorption of the guest material, which is located on the longest wavelength side (i.e., an absorption originating from triplet MLCT transition). However, in the case of a phosphorescent light-emitting element, it is difficult to obtain an overlap between the fluorescence of the host material and the absorption of the guest material on the longest wavelength side. This is because, if the fluorescence of the host material overlaps with the absorption of the guest material on the longest wavelength side, phosphorescence of the host material is located on a much longer wavelength side than the absorption of the guest material on the longest wavelength side. In other words, the $T_1$ level of the host material becomes lower than the $T_1$ level of the gest material, which inhibits the energy transfer from the host material to the guest material. On the other hands, when the host material is designed in such a manner that the $T_1$ level of the host material is higher than the $T_1$ level of the guest material, the fluorescence of the host material is shifted to the shorter wavelength side, resulting in negligibly small overlapping with the absorption of the guest material on the longest wavelength side.

Thus, in the structure illustrated in FIG. 3B, the second organic compound 356 and the third organic compound 357 are preferably combined so as to form an exciplex (also referred to as a heteroexcimer). In this case, the second organic compound 356 and the third organic compound 357 form an exciplex upon recombination of carriers (electrons and holes) in the light-emitting layer 353. Because the exciplex exhibits fluorescence on a longer wavelength side than the second organic compound 356 and the third organic compound 357, the second organic compound 356 and the third organic compound 357 are able to give fluorescence which sufficiently overlaps with the absorption band of the guest material on the longest wavelength side in spite of their higher $T_1$ levels than that of the guest material. Hence, the efficiency of the energy transfer from a singlet excited state of the exciplex to the triplex excited state of the guest material can be maximized. Note that, because the $S_1$ level of the exciplex is close to its $T_1$ level, energy transfer from the triplex excited state of the exciplex is assumed to occur.

For the second organic compound 356 and the third organic compound 357, a combination of an electron-accepting compound and a hole-accepting compound is preferably used.

Examples of the hole-accepting compound include 4-phenyl-4'-(9-phenyl-9H-carbazol-3-yl)triphenylamine (abbreviation: PCBA1BP), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-N,N-diphenylamino-9H-fluoren-7-yl)-N,N-diphenylamine (abbreviation: DPNF), 4-phenyldiphenyl-(9-phenyl-9H-carbazol-3-yl)amine (abbreviation: PCA1BP), N,N',N''-triphenyl-N,N',N''-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N-di(biphenyl-4-yl)-N-(9-phenyl-9H-carbazol-3-yl)amine (abbreviation: PCzBBA1), N,N'-bis[4-(carbazol-9-yl)phenyl]-N,N'-diphenyl-9,9-dimethylfluorene-2,7-diamine (abbreviation: YGA2F), 4,4'-bis[N-(3-methylphenyl)-N-phenylamino]biphenyl (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N'-(3-methylphenyl)-N'-phenylamino]phenyl}-N-phenylamino)biphenyl (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2).

The above-described combination of the second organic compound 356 and the third organic compound 357 is an example of the combination that enables an exciplex to be formed. The following combination can be available where the fluorescence of the exciplex overlaps with the absorption of the first phosphorescent organic compound 355 on the longest wavelength side or and the peak of the fluorescent spectrum of the exciplex has a longer wavelength than the peak of the absorption spectrum of the first phosphorescent organic compound 355 on the longest wavelength side.

Note that in the case where an electron-accepting compound and a hole-accepting compound are used for the second organic compound 356 and the third organic compound 357, carrier balance can be controlled by the mixture ratio of the compounds. Specifically, the weight ratio of the second organic compound to the third organic compound is preferably 1:9 to 9:1.

In the light-emitting element illustrated in FIG. 3B, energy transfer efficiency can be improved owing to energy transfer utilizing an overlap between an emission spectrum of an exciplex and an absorption spectrum of a phosphorescent compound; thus, the light-emitting element can have high external quantum efficiency.

Note that in another structure of the present invention, the light-emitting layer 353 can be formed using two kinds of organic compound, that is, an electron-accepting host molecule and a hole-accepting host molecule, other than the first phosphorescent organic compound 355 (guest material) so that a phenomenon (guest coupled with complementary hosts: GCCH) occurs in which holes and electrons are introduced to a guest molecule existing in the two kinds of host molecules and the guest molecules are brought into an excited state.

At this time, the electron-accepting host molecule and the hole-accepting host molecule can be respectively selected from the above-described hole-accepting compounds and the above-described electron-accepting compounds.

The structure described above in this embodiment can be combined as appropriate with any of the structures described in the other embodiments.

Embodiment 6

In this embodiment, as an example of a light-emitting element fabricated by the fabrication method of one embodiment of the present invention, a light-emitting element in which a charge-generation layer is provided between a plurality of EL layers (the light-emitting element is hereinafter referred to as a tandem light-emitting element) is described.

Figure 4A:
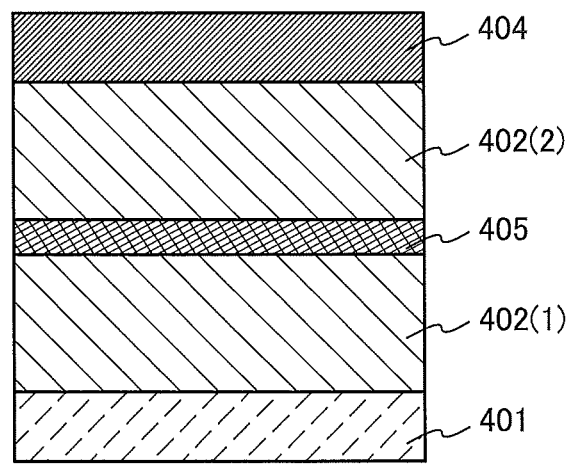
FIGS. 4A and 4B each illustrate a structure of a light-emitting element.

As illustrated in FIG. 4A, the light-emitting element described in this embodiment is a tandem light-emitting element including a plurality of EL layers (a first EL layer 402(1) and a second EL layer 402(2)) between a pair of electrodes (a first electrode 401 and a second electrode 404).

In this embodiment, the first electrode 401 functions as an anode, and the second electrode 404 functions as a cathode. Note that the first electrode 401 and the second electrode 404 can each have a structure similar to that in Embodiment 2. In addition, all or any of the plurality of EL layers (the first EL layer 402(1) and the second EL layer 402(2)) may have structures similar to those described in Embodiments 4 and 5. In other words, the structures of the first EL layer 402(1) and the second EL layer 402(2) may be the same or different from each other and can be similar to those of the EL layers described in Embodiments 4 and 5.

A charge-generation layer (I) 405 is provided between the plurality of EL layers (the first EL layer 402(1) and the second EL layer 402(2)). The charge-generation layer (I) 405 has a function of injecting electrons into one of the EL layers and injecting holes into the other of the EL layers when a voltage is applied between the first electrode 401 and the second electrode 404. In this embodiment, when voltage is applied such that the potential of the first electrode 401 is higher than that of the second electrode 404, the charge-generation layer (I) 405 injects electrons into the first EL layer 402(1) and injects holes into the second EL layer 402(2).

Note that in terms of light extraction efficiency, the charge-generation layer (I) 405 preferably has a light-transmitting property with respect to visible light (specifically, the charge-generation layer (I) 405 has a visible light transmittance of 40% or more). The charge-generation layer (I) 405 functions even if it has lower conductivity than the first electrode 401 or the second electrode 404.

The charge-generation layer (I) 405 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, the organic compound having a high hole-transport property can be, for example, an aromatic amine compound such as NPB, TPD, TDATA, MTDATA, or BSPB, or the like. The compounds given here are mainly ones that have a hole mobility of $10^{-6}$ cm$^2$/(Vs) or higher. Note that any organic compounds other than the compounds given here may be used as long as the hole-transport property is higher than the electron-transport property.

As the electron acceptor, 7,7,8,8-tetracyano-2,3,5,6-tetrafluoroquinodimethane (abbreviation: $F_4$-TCNQ), chloranil, and the like can be given. Oxides of transition metals that belong to Group 4 to Group 8 of the periodic table can be given. Specifically, it is preferable to use vanadium oxide, niobium oxide, tantalum oxide, chromium oxide, molybdenum oxide, tungsten oxide, manganese oxide, and rhenium oxide because of their high electron accepting properties. Among these oxides, molybdenum oxide is particularly preferable because it is stable in the air, has a low hygroscopic property, and is easy to handle.

On the other hand, in the case of the structure in which an electron donor is added to an organic compound having a high electron-transport property, as the organic compound having a high electron-transport property, for example, a metal complex having a quinoline skeleton or a benzoquinoline skeleton, such as Alq, Almq$_3$, BeBq$_2$, or BAlq, or the like can be used. Alternatively, a metal complex having an oxazole-based ligand or a thiazole-based ligand, such as Zn(BOX)$_2$ or Zn(BTZ)$_2$ can be used. Alternatively, in addition to such a metal complex, PBD, OXD-7, TAZ, BPhen, BCP, or the like can be used. The substances given here are mainly ones that have an electron mobility of $10^{-6}$ cm$^2$/(Vs) or higher. Note that any substance other than the substances given above may be used as long as the electron-transport property is higher than the hole-transport property.

As the electron donor, it is possible to use an alkali metal, an alkaline earth metal, a rare earth metal, a metal belonging to any of Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

Figure 4B:
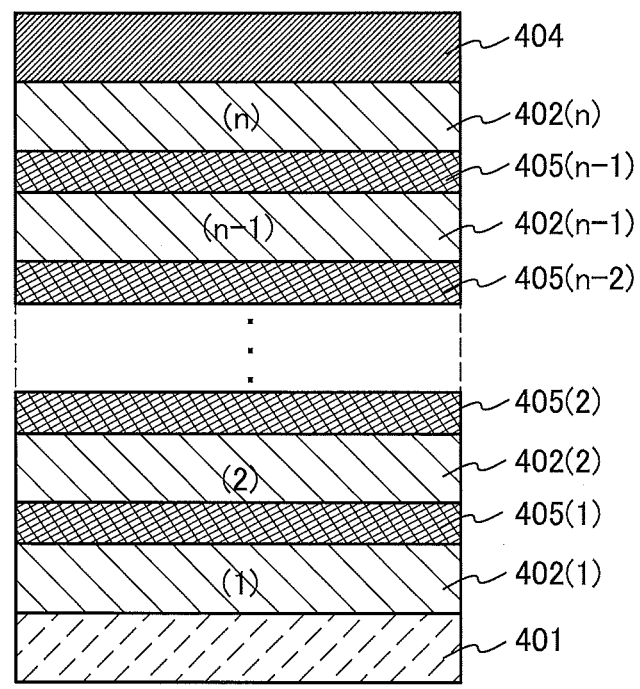

Although the light-emitting element including two EL layers is described in this embodiment, the present invention can be similarly applied to a light-emitting element in which n EL layers (402(1) to 402(n)) (n is three or more) are stacked as illustrated in FIG. 4B. In the case where a plurality of EL layers are included between a pair of electrodes as in the light-emitting element according to this embodiment, by providing charge-generation layers (I) (405(1) to 405(n−1)) between the EL layers, light emission in a high luminance region can be obtained with current density kept low. Since the current density can be kept low, the element can have a long lifetime. When the light-emitting element is applied to light-emitting devices, electronic apparatus, and lighting devices each having a large light-emitting area, voltage drop due to resistance of an electrode material can be reduced, thereby achieving homogeneous light emission in the whole of the light-emitting area.

When the EL layers have different emission colors, a desired emission color can be obtained from the whole light-emitting element. For example, in the light-emitting element having two EL layers, when an emission color of the first EL layer and an emission color of the second EL layer are made to be complementary colors, a light-emitting element emitting white light as a whole light-emitting element can also be obtained. Note that "complementary colors" refer to colors which produce an achromatic color when mixed. In other words, mixing light of complementary colors allows white emission to be obtained.

The same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined as appropriate with any of the structures described in the other embodiments.

Embodiment 7

In this embodiment, a light-emitting device that includes a light-emitting element fabricated by a fabrication method of one embodiment of the present invention is described.

The light-emitting device may be either a passive matrix type light-emitting device or an active matrix type light-emitting device. Note that any of the light-emitting elements described in the other embodiments can be applied to the light-emitting device described in this embodiment.

In this embodiment, an active matrix type light-emitting device is described with reference to FIGS. 5A and 5B.

Figure 5A:
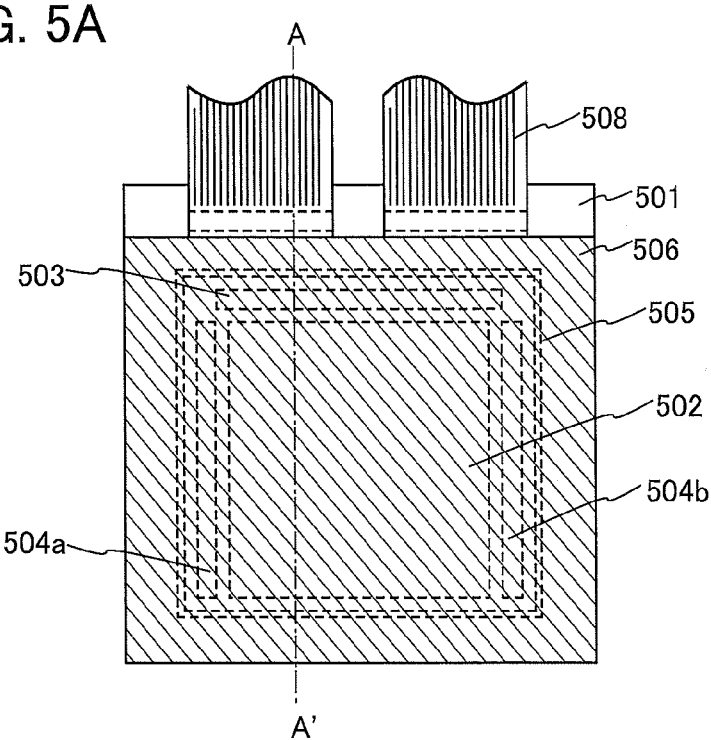
FIGS. 5A and 5B illustrate a light-emitting device.
Figure 5B:
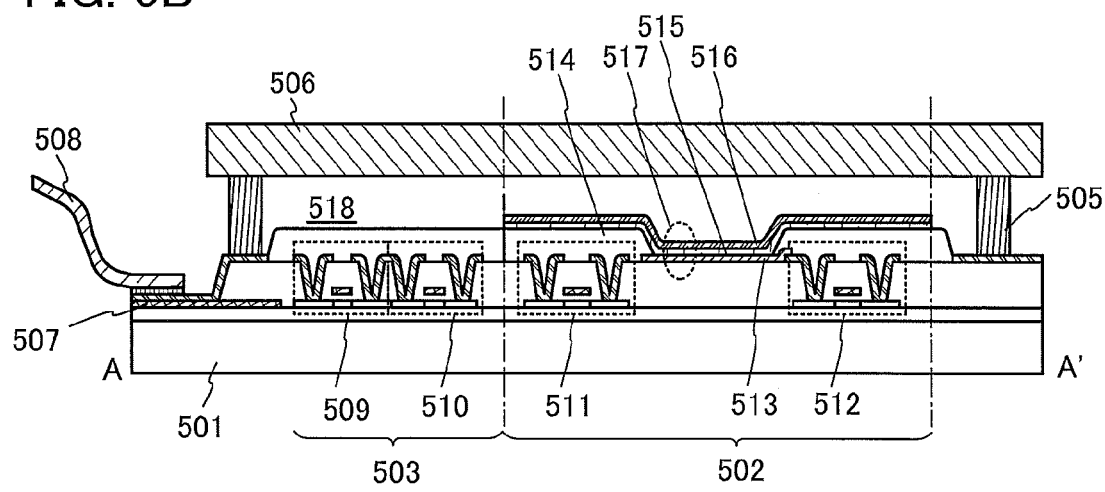

Note that FIG. 5A is a top view illustrating a light-emitting device and FIG. 5B is a cross-sectional view taken along the chain line A-A' in FIG. 5A. The active matrix type light-emitting device according to this embodiment includes a pixel portion 502 provided over an element substrate 501, a driver circuit portion (a source line driver circuit) 503, and driver circuit portions (gate line driver circuits) 504a and 504b. The pixel portion 502, the driver circuit portion 503, and the driver circuit portion 504a and 504b are sealed with a sealant 505 between the element substrate 501 and a sealing substrate 506.

In addition, over the element substrate 501, a lead wiring 507 for connecting an external input terminal, through which a signal (e.g., a video signal, a clock signal, a start signal, a reset signal, or the like) or electric potential from the outside is transmitted to the driver circuit portion 503 and the driver circuit portions 504a and 504b, is provided. Here, an example is described in which a flexible printed circuit (FPC) 508 is provided as the external input terminal. Although only the FPC is illustrated here, the FPC may be provided with a printed wiring board (PWB). The light-emitting device in this specification includes, in its category, not only the light-emitting device itself but also the light-emitting device provided with the FPC or the PWB.

Next, a cross-sectional structure is described with reference to FIG. 5B. The driver circuit portion and the pixel portion are formed over the element substrate 501; the driver circuit portion 503 that is the source line driver circuit and the pixel portion 502 are illustrated here.

The driver circuit portion 503 is an example in which an FET 509 and an FET 510 are combined. Note that the driver circuit portion 503 that includes the FET 509 and the FET 510 may be formed with a circuit including transistors having the same conductivity type (either an n-channel transistor or a p-channel transistor) or a CMOS circuit including an n-channel transistor and a p-channel transistor. Although a driver integrated type in which the driver circuit is formed over the substrate is described in this embodiment, the driver circuit is not necessarily formed over the substrate, and the driver circuit can be formed outside.

The pixel portion 502 is formed of a plurality of pixels each of which includes a switching FET 511, a current control FET 512, and a first electrode (anode) 513 which is electrically connected to a wiring (a source electrode or a drain electrode) of the current control FET 512. Although the pixel portion 502 includes two FETs, the switching FET 511 and the current control FET 512, in this embodiment, one embodiment of the present invention is not limited thereto. The pixel portion 502 may include, for example, three or more FETs and a capacitor in combination.

As the FETs 509, 510, 511, and 512, for example, a staggered transistor or an inverted staggered transistor can be used. Examples of a semiconductor material that can be used for the FETs 509, 510, 511, and 512 include Group IV semiconductors (e.g., silicon and gallium), compound semiconductors, oxide semiconductors, and organic semiconductors. In addition, there is no particular limitation on the crystallinity of the semiconductor material, and an amorphous semiconductor or a crystalline semiconductor can be used. In particular, an oxide semiconductor is preferably used for the FETs 509, 510, 511, and 512. Examples of the oxide semiconductor include an In—Ga oxide and an In-M-Zn oxide (M is Al, Ga, Y, Zr, La—Ce, or Nd). For example, an oxide semiconductor that has an energy gap of 2 eV or more, preferably 2.5 eV or more, further preferably 3 eV or more is used for the FETs 509, 510, 511, and 512, so that the off-state current of the transistors can be reduced.

In addition, an insulator 514 is formed to cover end portions of the first electrode (anode) 513. In this embodiment, the insulator 514 is formed using a positive photosensitive acrylic resin. The first electrode 513 is used as an anode in this embodiment.

The insulator 514 preferably has a curved surface at an upper end portion or a lower end portion thereof. This enables the coverage with a film to be formed over the insulator 514 to be favorable. The insulator 514 can be formed using, for example, either a negative photosensitive resin or a positive photosensitive resin. The material of the insulator 514 is not limited to an organic compound and an inorganic compound such as silicon oxide, silicon oxynitride, or silicon nitride can also be used.

An EL layer 515 and a second electrode (cathode) 516 are stacked over the first electrode (anode) 513. In the EL layer 515, at least a light-emitting layer is provided. In the EL layer 515, a hole-injection layer, a hole-transport layer, an electron-transport layer, an electron-injection layer, a charge-generation layer, and the like can be provided as appropriate in addition to the light-emitting layer.

A light-emitting element 517 is formed of a stacked structure of the first electrode (anode) 513, the EL layer 515, and the second electrode (cathode) 516. For the first electrode (anode) 513, the EL layer 515, and the second electrode (cathode) 516, the materials described in Embodiments 2 to 4 can be used. Although not illustrated, the second electrode (cathode) 516 is electrically connected to the FPC 508 which is an external input terminal.

In addition, although the cross-sectional view of FIG. 5B illustrates only one light-emitting element 517, a plurality of light-emitting elements are arranged in matrix in the pixel portion 502. Light-emitting elements that emit light of three kinds of colors (R, G, and B) are selectively formed in the pixel portion 502, whereby a light-emitting device capable of full color display can be obtained. Alternatively, a light-emitting device which is capable of full color display may be fabricated by a combination with color filters.

Furthermore, the sealing substrate 506 is attached to the element substrate 501 with the sealant 505, whereby a light-emitting element 517 is provided in a space 518 surrounded by the element substrate 501, the sealing substrate 506, and the sealant 505. Note that the space 518 may be filled with an inert gas (such as nitrogen and argon) or the sealant 505.

An epoxy-based resin or glass frit is preferably used for the sealant 505. The material preferably allows as little moisture and oxygen as possible to penetrate. As the sealing substrate 506, a glass substrate, a quartz substrate, or a plastic substrate formed of fiber-reinforced plastic (FRP), poly(vinyl fluoride) (PVF), a polyester, an acrylic resin, or the like can be used. In the case where glass frit is used as the sealant, the element substrate 501 and the sealing substrate 506 are preferably glass substrates in terms of adhesion.

As described above, an active matrix light-emitting device can be obtained.

Note that the structure described in this embodiment can be combined as appropriate with any of the structures described in the other embodiments.

Embodiment 8

In this embodiment, examples of a variety of electronic appliances are described with reference to FIGS. 6A to 6D. The electronic appliances are fabricated using a light-emitting device including a light-emitting element fabricated by a fabrication method of one embodiment of the present invention.

Examples of electronic appliances that include the light-emitting device include television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, and game machines such as pin-ball machines. Specific examples of these electronic appliances are illustrated in FIGS. 6A to 6D.

Figure 6A:
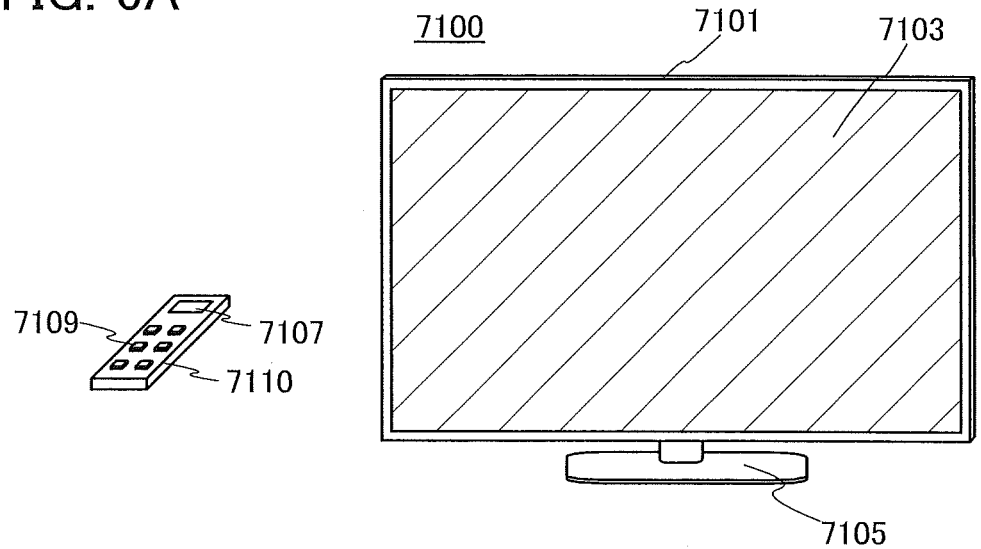
FIGS. 6A to 6D illustrate electronic appliances.

FIG. 6A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Channels can be switched and volume can be controlled with operation keys 7109 of the remote controller 7110, whereby an image displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wires via the modem, one-way (from a sender to a receiver) or two-way (between a sender and a receiver or between receivers) information communication can be performed.

Figure 6B:
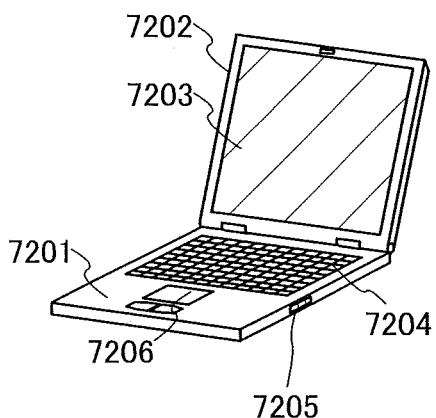

FIG. 6B illustrates a computer, which includes a main body 7201, a housing 7202, a display portion 7203, a keyboard 7204, an external connection port 7205, a pointing device 7206, and the like. Note that this computer can be manufactured using the light-emitting device for the display portion 7203.

Figure 6C:
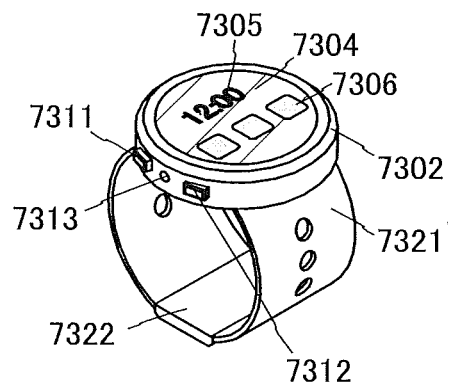

FIG. 6C illustrates a smart watch. The smart watch includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 can display an icon 7305 indicating time, another icon 7306, and the like.

The smart watch in FIG. 6C can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display panel 7304.

Figure 6D:
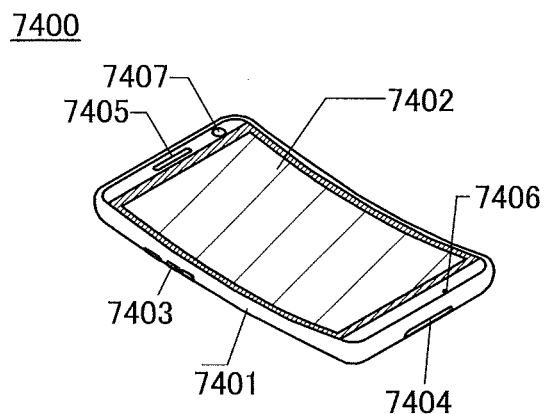

FIG. 6D illustrates an example of a mobile phone. A mobile phone 7400 includes a housing 7401 provided with a display portion 7402, a microphone 7406, a speaker 7405, a camera 7407, an external connection portion 7404, an operation button 7403, and the like. In the case where the light-emitting element of one embodiment of the present invention is formed over a flexible substrate, the light-emitting element can be used for the display portion 7402 having a curved surface as illustrated in FIG. 6D.

When the display portion 7402 of the mobile phone 7400 illustrated in FIG. 6D is touched with a finger or the like, data can be input into the mobile phone 7400. In addition, operations such as making a call and composing an e-mail can be performed by touch on the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device such as a gyro sensor or an acceleration sensor is provided inside the mobile phone 7400, display on the screen of the display portion 7402 can be automatically changed by determining the orientation of the mobile phone 7400 (whether the mobile phone is placed horizontally or vertically).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when it is determined that input by touch on the display portion 7402 is not performed within a specified period on the basis of a signal detected by an optical sensor in the display portion 7402, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. In addition, when a backlight or a sensing light source which emits near-infrared light is provided in the display portion, an image of a finger vein, a palm vein, or the like can be taken.

As described above, the electronic appliances can be obtained using the light-emitting device that includes the light-emitting element fabricated by the fabrication method of one embodiment of the present invention. Note that the light-emitting device can be used for electronic appliances in a variety of fields without being limited to the electronic appliances described in this embodiment.

Note that the structure described in this embodiment can be combined as appropriate with any of the structures described in the other embodiments.

Embodiment 9

In this embodiment, examples of lighting devices are described with reference to FIG. 7. The lighting devices include a light-emitting device including a light-emitting element fabricated by a fabrication method of one embodiment of the present invention.

Figure 7:
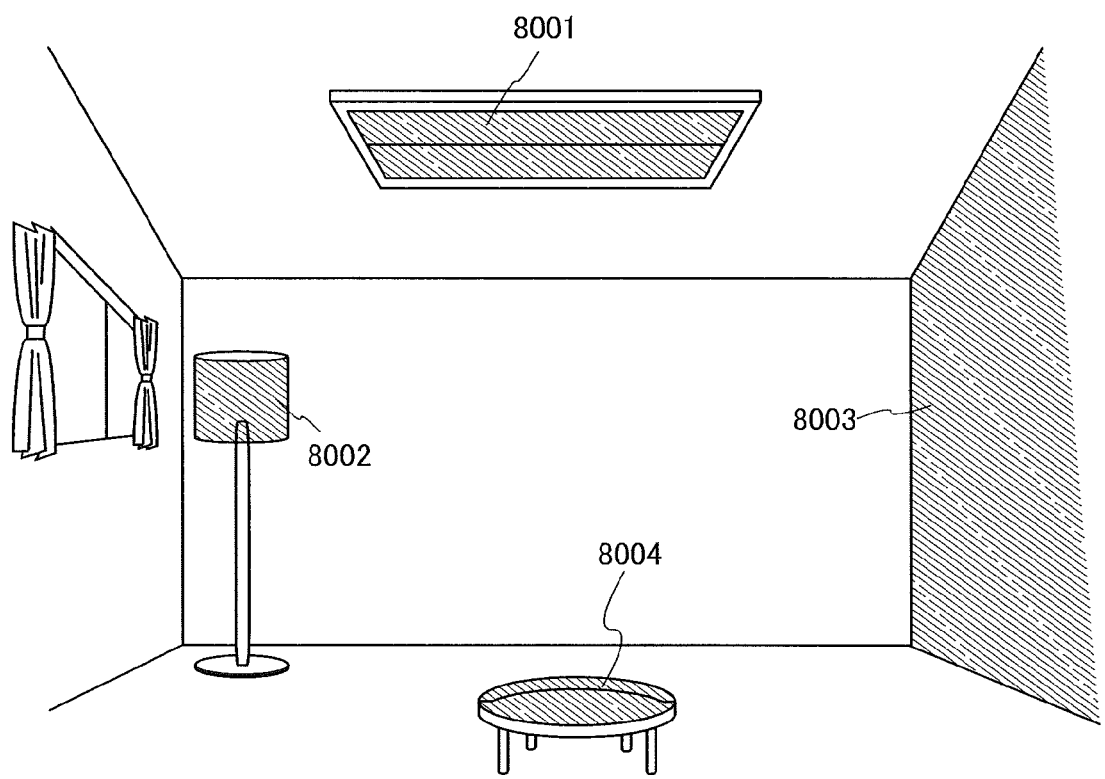
FIG. 7 illustrates lighting devices.

FIG. 7 illustrates an example in which the light-emitting device is used as an indoor lighting device 8001. Note that since the area of the light-emitting device can be increased, a lighting device having a large area can also be formed. In addition, a lighting device 8002 in which a light-emitting region has a curved surface can also be obtained with the use of a housing with a curved surface. Note that a light-emitting element included in the light-emitting device described in this embodiment is in a thin film form, which allows the housing to be designed more freely. Thus, the lighting device can be elaborately designed in a variety of ways. In addition, a wall of the room may be provided with a large-sized lighting device 8003.

When the light-emitting device is used for a table by being used as a surface of a table, a lighting device 8004 which has a function as a table can be obtained. When the light-emitting device is used as part of other furniture, a lighting device which has a function as the furniture can be obtained.

In this manner, a variety of lighting devices in which the light-emitting device is used can be obtained. Note that such lighting devices are also embodiments of the present invention.

Note that the structure described in this embodiment can be combined as appropriate with any of the structures described in the other embodiments.

Example 1

In this example, a light-emitting element 1 fabricated by a method of one embodiment of the present invention and a comparative light-emitting element 2 fabricated as a comparative example are described with reference to FIG. 8. Chemical formulae of materials used in this embodiment are shown below.

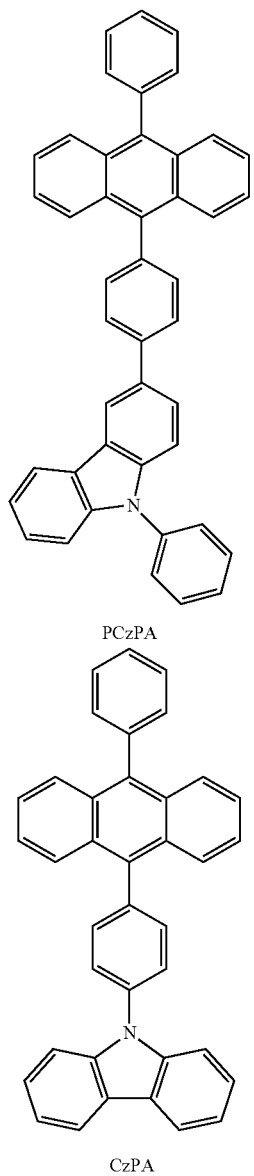

PCzPA

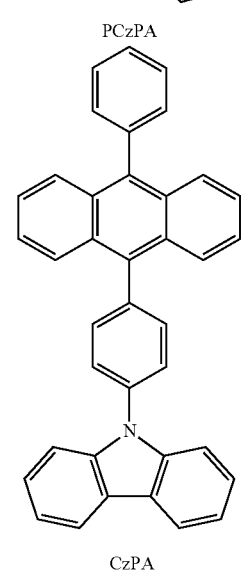

CzPA

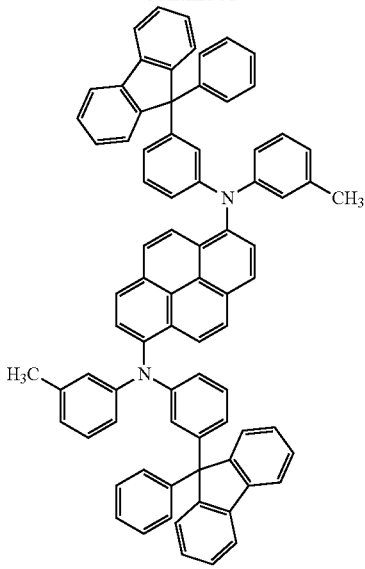

1,6mMemFLPAPrn

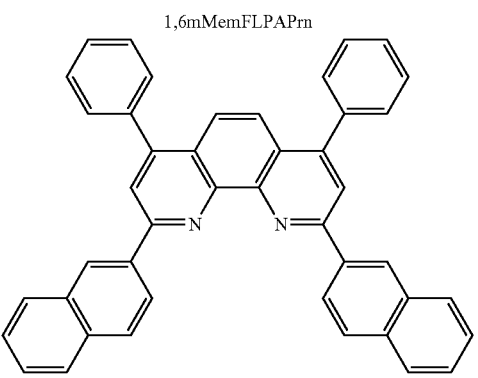

NBPhen

The light-emitting element 1 and the comparative light-emitting element 2 described in this example are provided over a substrate 1100 and have a structure in which an EL layer 1102 is provided between a first electrode 1101 and a second electrode 1103, and materials and thicknesses of the layers included in the EL layers 1102 are the same. However, as described below, a second electron-transport layer 1114b is different in formation condition between the light-emitting element 1 and the comparative light-emitting element 2.

<Method for Fabricating Light-Emitting Element 1 and Comparative Light-Emitting Element 2>

First, an indium oxide-tin oxide compound containing silicon or silicon oxide (ITO-SiO$_2$, hereinafter abbreviated to ITSO) was deposited by a sputtering method over a substrate 1100 that was a glass substrate to form a first electrode 1101. Note that the composition ratio of In$_2$O$_3$ to SnO$_2$ and SiO$_2$ in a target used was 85:10:5 [wt %]. The thickness of the first electrode 1101 was 110 nm and the electrode area was 2 mm×2 mm. Here, the first electrode 1101 functioned as an anode of each of the light-emitting elements.

Next, as pretreatment, after a substrate surface was cleaned, dry treatment was performed at 200° C. in a nitrogen atmosphere for 1 hour.

After that, the substrate was transferred into a vacuum evaporation apparatus where the pressure had been reduced to approximately $10^{-4}$ Pa, and subjected to vacuum baking at 150° C. for 30 minutes in a heating chamber of the vacuum evaporation apparatus, and then, the substrate was cooled down to room temperature.

Next, the substrate 1100 was fixed to a substrate holder in the vacuum evaporation apparatus so that a surface of the substrate 1100 on which the first electrode 1101 was formed faced downward. The pressure in the vacuum evaporation apparatus was reduced to about $10^{-4}$ Pa. Then, by an evaporation method using resistance heating, 9-phenyl-3-[4-(10-phenyl-9-anthryl)phenyl]-9H-carbazole (abbreviation: PCzPA) and molybdenum oxide were deposited by co-evaporation to form a hole-injection layer 1111. The thickness of the hole-injection layer 1111 was 50 nm. The mass ratio of PCzPA to molybdenum oxide was adjusted to 2:1 PCzPA:molybdenum oxide).

Next, PCzPA was deposited to a thickness of 10 nm on the hole-injection layer 1111 to form a hole-transport layer 1112.

Next, 9-[4-(10-phenyl-9-anthryl)phenyl]-9H-carbazole (abbreviation: CzPA) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) were co-deposited on the hole-transport layer 1112 to form a light-emitting layer 1113. The thickness of the light-emitting layer 1113 was 25 nm. The mass ratio of CzPA to 1,6mMemFLPAPrn was adjusted to 1:0.04 (=CzPA:1,6mMemFLPAPrn).

Next, on the light-emitting layer 1113, CzPA was deposited to a thickness of 10 nm to form a first electron-transport layer 1114a.

Next, on the first electron-transport layer 1114a, 2,9-bis(naphthalen-2-yl)-4,7-diphenyl-1,10-phenanthroline (abbreviation: NBPhen) was deposited to a thickness of 15 nm to form a second electron-transport layer 1114b. As to the formation of the second electron-transport layer 1114b, NBPhen was evaporated when the partial pressure of a gas with m/z of 92 in a film formation chamber was higher than or equal to $1\times10^{-12}$ Pa and lower than $5\times10^{-8}$ Pa in the case of the light-emitting element 1. In contrast, in the case of the comparative light-emitting element 2, the evaporation was carried out when the partial pressure was higher than or equal to $5\times10^{-8}$ Pa.

Figure 9:
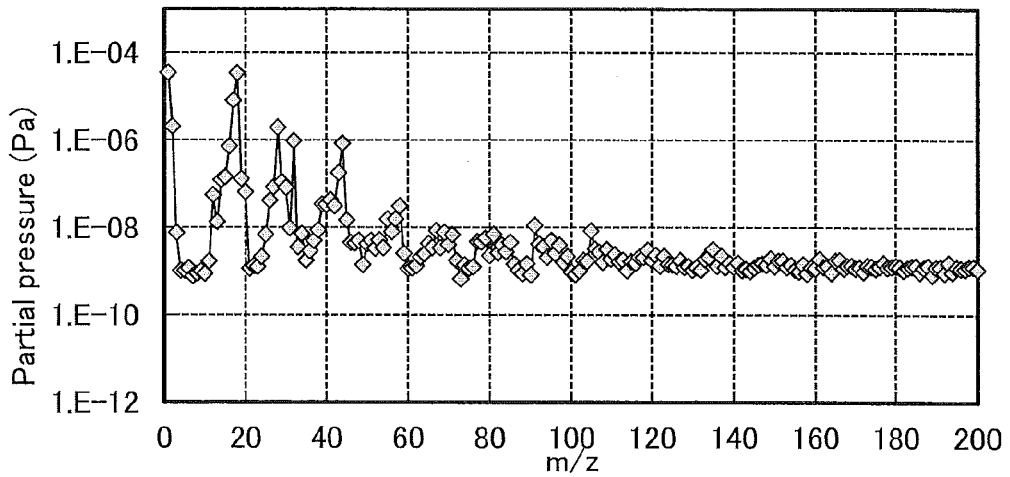
FIG. 9 shows analysis results of gases in a film-formation chamber before heating of NBPhen used in a light-emitting element 1.
Figure 10:
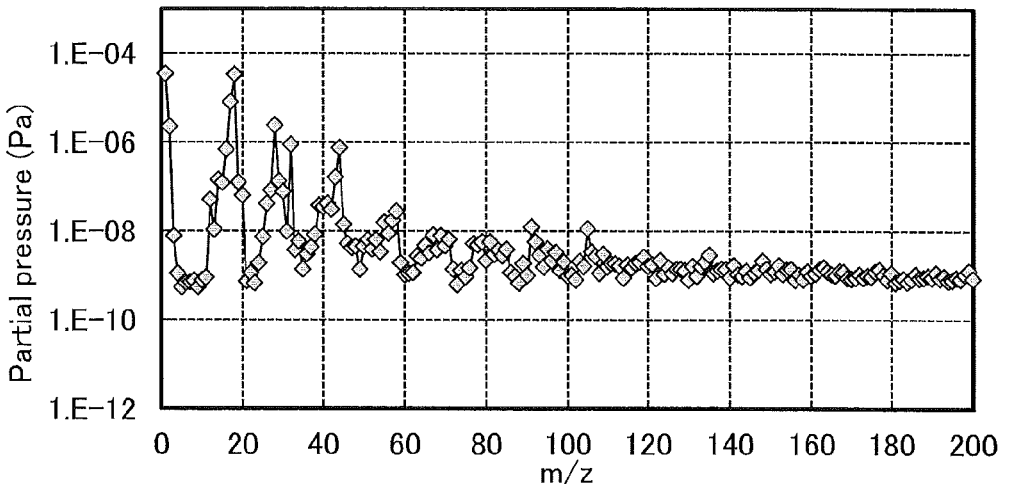
FIG. 10 shows analysis results of gases in the film-formation chamber in heating of NBPhen used in the light-emitting element 1.
Figure 11:
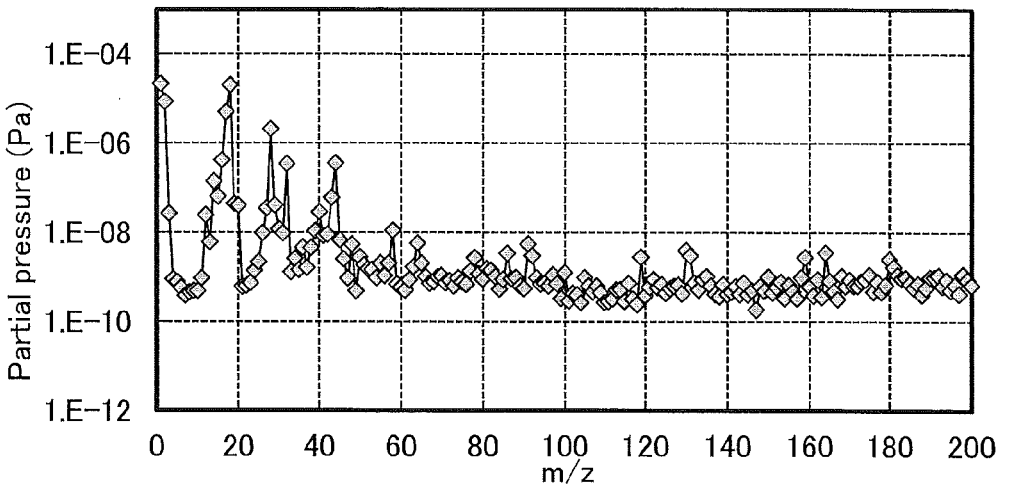
FIG. 11 shows analysis results of gases in the film-formation chamber at the time of evaporation of NBPhen used in the light-emitting element 1.

FIG. 9, FIG. 10, and FIG. 11 each show analysis results of the gases in the film formation chamber at the time when NBPhen was evaporated for the second electron-transport layer 1114b of the light-emitting element 1. Note that the gas analyses carried out in Examples described in this specification were carried out by a residual gas analyzer (Qulee, BGM-202, manufactured by ULVAC, Inc.). FIG. 9, FIG. 10, and FIG. 11 show measurement results before heating, during heating, and at the time of evaporation, respectively. The horizontal axis represents m/z and the vertical axis represents partial pressure of each component.

Figure 12:
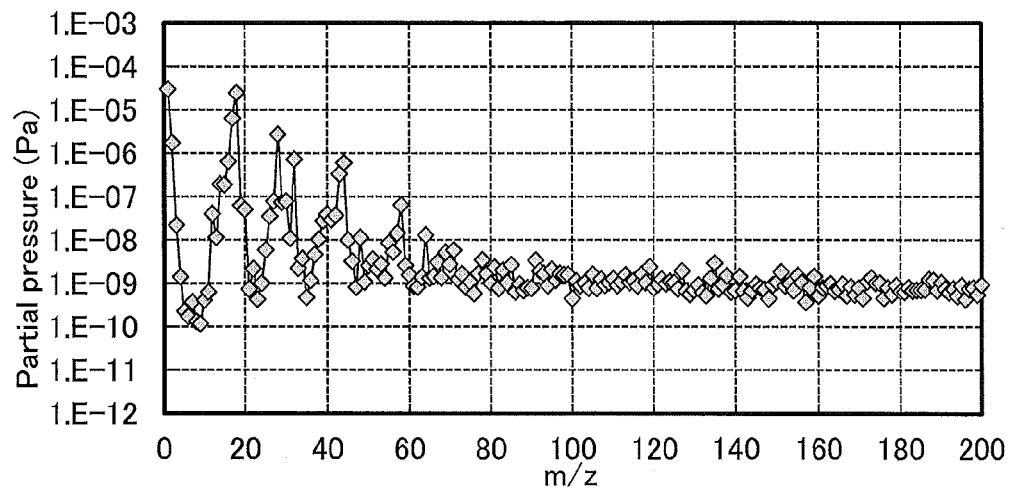
FIG. 12 shows analysis results of gases in a film-formation chamber before heating of NBPhen used in a comparative light-emitting element 2 (reference element 2).
Figure 13:
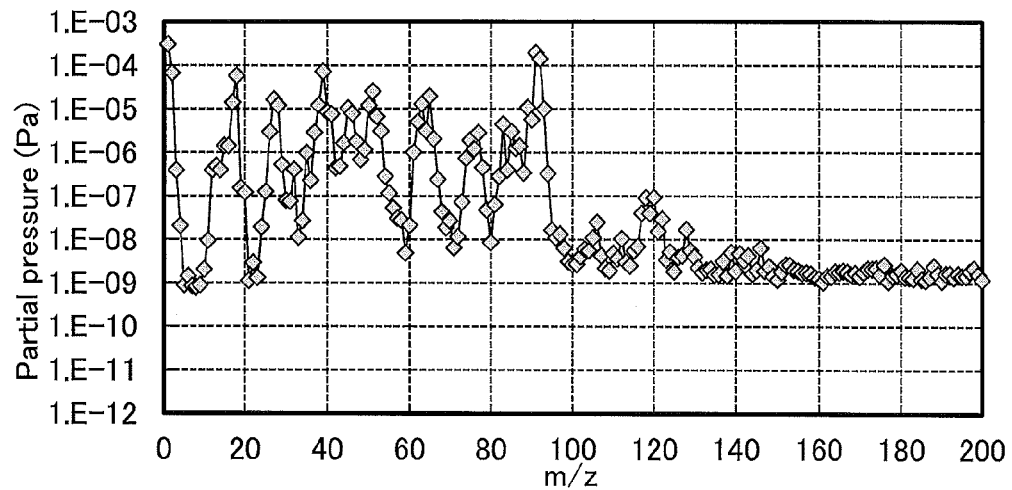
FIG. 13 shows analysis results of gases in the film-formation chamber in heating of NBPhen used in the comparative light-emitting element 2.
Figure 14:
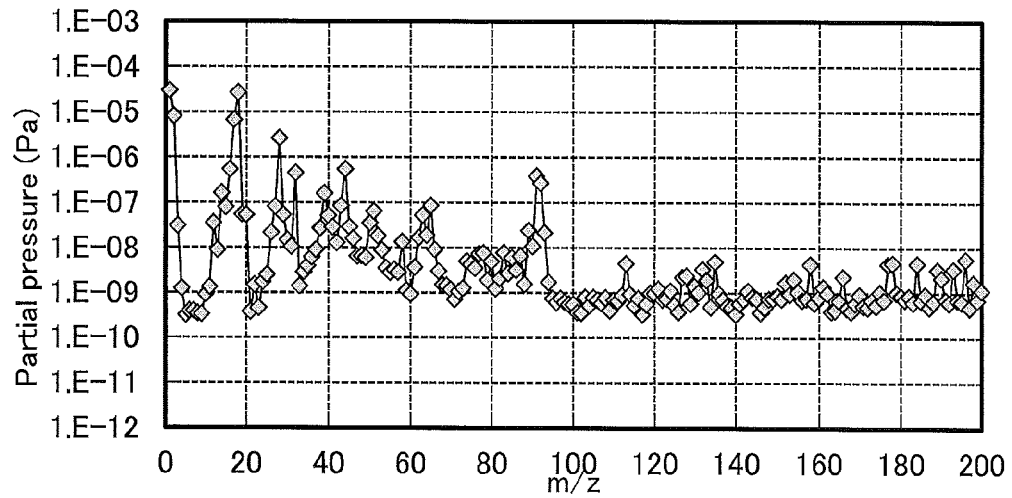
FIG. 14 shows analysis results of gases in the film-formation chamber at the time of evaporation of NBPhen used in the comparative light-emitting element 2.

FIG. 12, FIG. 13, and FIG. 14 each show analysis results of the gases in the film formation chamber at the time when NBPhen was evaporated for the second electron-transport layer 1114b of the comparative light-emitting element 2. The analysis was performed by the same instrument as that used for the light-emitting element 1. FIG. 12, FIG. 13, and FIG. 14 show measurement results before heating, during heating, and at the time of evaporation, respectively. The horizontal axis represents m/z and the horizontal axis represents partial pressure of each component.

In the case where the second electron-transport layer 1114b of the light-emitting element 1 was formed, no distinctive peak was detected before the heating, in the heating, and at the time of evaporation, and the partial pressure of each component with m/z ranging from 1 to 200 was higher than or equal to $1\times10^{-12}$ Pa and lower than $5\times10^{-8}$ Pa in each measurement. In contrast, in the case where the second electron-transport layer 1114b of the comparative light-emitting element 2 was formed, the partial pressure of a component with m/z of 92 exceeded $5\times10^{-8}$ Pa in the heating and at the time of evaporation. The results indicate that a larger amount of a component with m/z of 92 is contained in the second electron-transport layer 1114b of the comparative light-emitting element 2.

Table 1 shows measurement results of the total pressure in the film formation chamber, the partial pressure of the component with m/z of 92, and the ratio (%) of the partial pressure to the total pressure before the heating, in the heating, and at the time of evaporation in the case where the second electron-transport layer 1114b of each of the light-emitting element 1 and the comparative light-emitting element 2 was formed.

TABLE 1

Total pressure, partial pressure of a component with m/z of 92, and their ratios.

| Device | Run | Total pressure (Pa) | Partial pressure[d] (Pa) | Ratio[e] (%) |
|---|---|---|---|---|
| Light-emitting element 1 | a | 8.59E−05 | 4.25E−09 | 0.0049 |
| Light-emitting element 1 | b | 8.56E−05 | 5.73E−09 | 0.0067 |
| Light-emitting element 1 | c | 5.91E−05 | 3.00E−09 | 0.0051 |
| Reference element 2 | a | 6.92E−05 | 1.94E−09 | 0.0028 |
| Reference element 2 | b | 1.09E−03 | 1.42E−04 | 13.0275 |
| Reference element 2 | c | 7.80E−05 | 2.70E−07 | 0.3462 |

[a]Before heating.
[b]During heating.
[c]During evaporation.
[d]Partial Pressure of a component with m/z of 92.
[e]Partial pressure/Total pressure The above results demonstrate that the partial pressure of an impurity with m/z of 92 in the film formation chamber was higher than or equal to $1\times10^{-12}$ Pa and lower than $5\times10^{-8}$ Pa during evaporation (including the steps before the heating, in the heating, and at the time of evaporation) when the second electron-transport layer 1114b of the light-emitting element 1 was formed. In contrast, the partial pressure of the impurity with m/z of 92 in the film formation chamber was as high as $5\times10^{-8}$ Pa or higher in the measurement in the heating and at the time of evaporation when the second electron-transport layer 1114b of the comparative light-emitting element 2 was formed.

From the results in FIGS. 9 to 11 and Table 1, the light-emitting element 1 is a light-emitting element fabricated by the fabrication method of one embodiment of the present invention, in which an organic compound is evaporated when the partial pressure of each component with a mass number (e.g., m/z) of 46 or more and 200 or less in the film formation chamber is higher than or equal to $1\times10^{-12}$ Pa and lower than $5\times10^{-8}$ Pa. In contrast, the comparative light-emitting element 2 is considered to be a light-emitting element containing a large amount of impurity in the organic compound film formed by evaporating the organic compound, as compared to the light-emitting element fabricated by the fabrication method of one embodiment of the present invention.

Next, lithium fluoride (LiF) was deposited to a thickness of 1 nm on the second electron-transport layer 1114b to form electron-injection layer 1115.

Lastly, aluminum was deposited to a thickness of 200 nm to form the second electrode 1103 serving as a cathode. Thus, the light-emitting element 1 and the comparative light-emitting element 2 of this example were fabricated.

Note that in all the above evaporation steps, evaporation was performed by a resistance-heating method.

Table 2 shows element structures of the light-emitting element 1 and the comparative light-emitting element 2 that were fabricated as described above.

TABLE 2

Structure of light-emitting element 1 and comparative light-emitting element 2 (reference element 2)

| | Material | Thickness (nm) | Weight ratio |
|---|---|---|---|
| 2nd electrode | Al | 200 | — |
| Electron-injection layer | LiF | 1 | — |
| 2nd Electron-transport layer | NBPhen | 15 | — |
| 1st Electron-transport layer | CzPA | 10 | — |
| Light-emitting layer | CzPA:1,6mMemFLPAPrn | 25 | 1:0.04 |
| Hole-transport layer | PCzPA | 10 | — |

TABLE 2-continued

Structure of light-emitting element 1 and comparative light-emitting element 2 (reference element 2)

| | Material | Thickness (nm) | Weight ratio |
|---|---|---|---|
| Hole-injection layer | PCzPA:MoOx | 50 | 2:1 |
| 1st electrode | ITSO | 110 | — |

Next, the light-emitting element 1 and the comparative light-emitting element 2 were each sealed using a glass substrate in a glove box containing nitrogen so as not to be exposed to the air (specifically, a sealing material was applied onto an outer edge of the element and heat treatment was performed at 80° C. for 1 hour at the time of sealing). Then, the operation characteristics of the light-emitting elements were measured. The measurement was carried out at room temperature (in an atmosphere kept at 25° C.).

Figure 15:
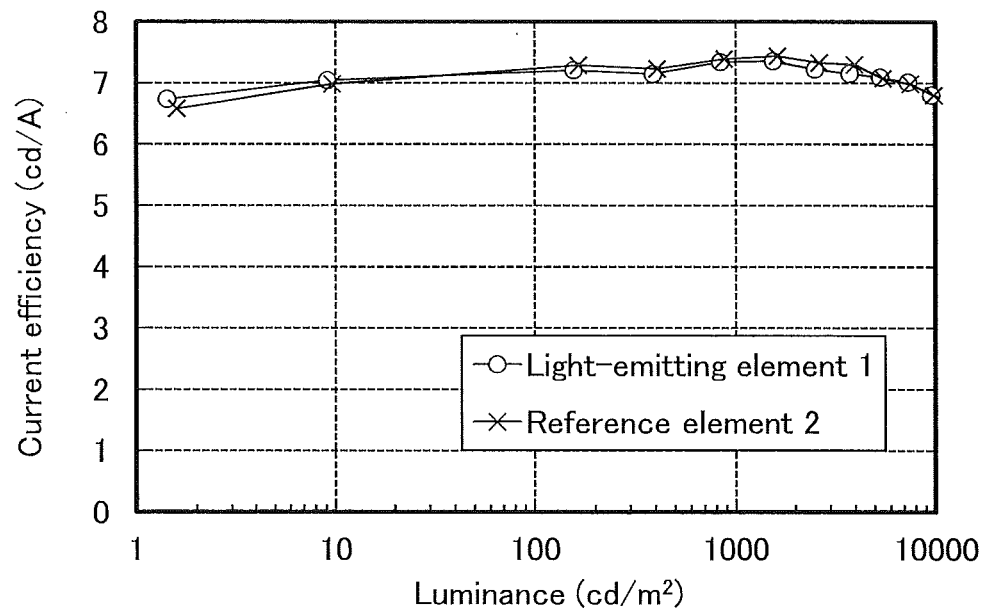
FIG. 15 shows luminance-current efficiency characteristics of the light-emitting element 1 and the comparative light-emitting element 2.
Figure 16:
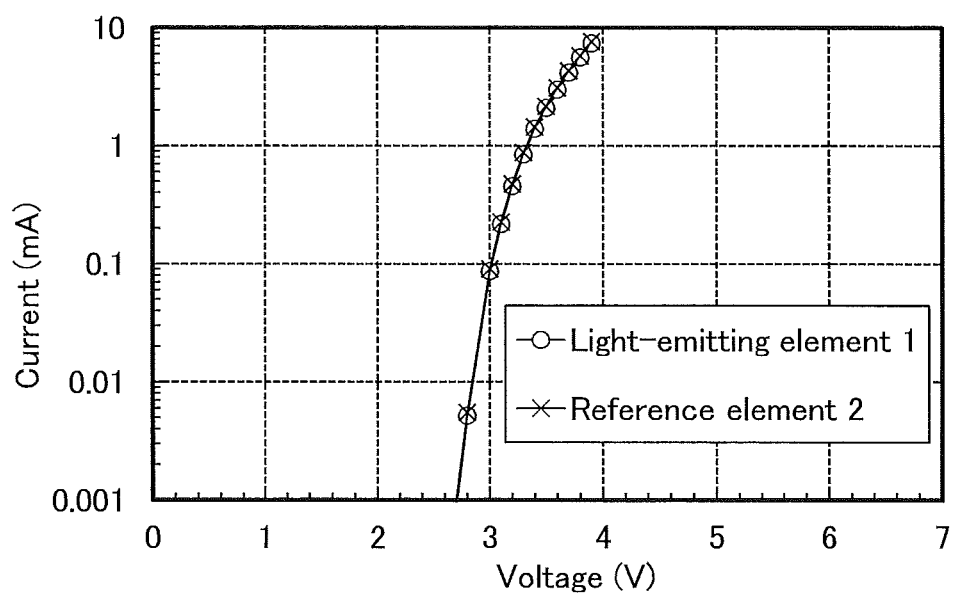
FIG. 16 shows voltage-current characteristics of the light-emitting element 1 and the comparative light-emitting element 2.
Figure 17:
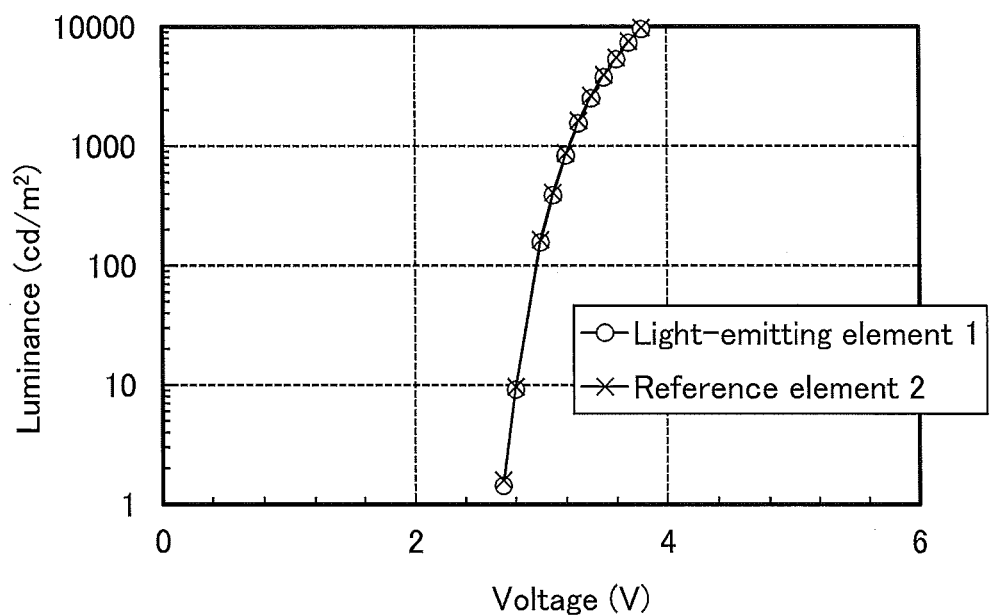
FIG. 17 shows voltage-luminance characteristics of the light-emitting element 1 and the comparative light-emitting element 2.
Figure 18:
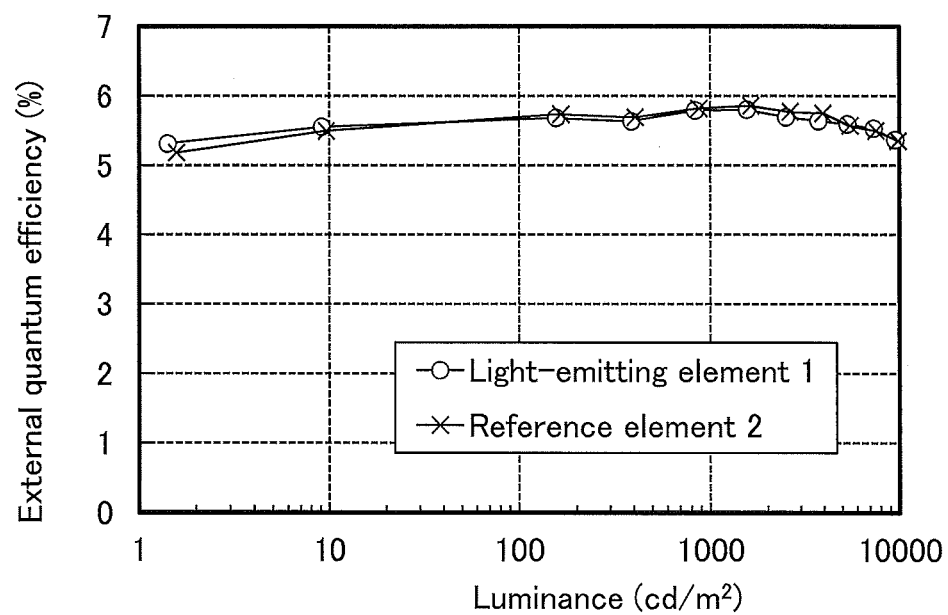
FIG. 18 shows luminance-external quantum efficiency characteristics of the light-emitting element 1 and the comparative light-emitting element 1.
Figure 19:
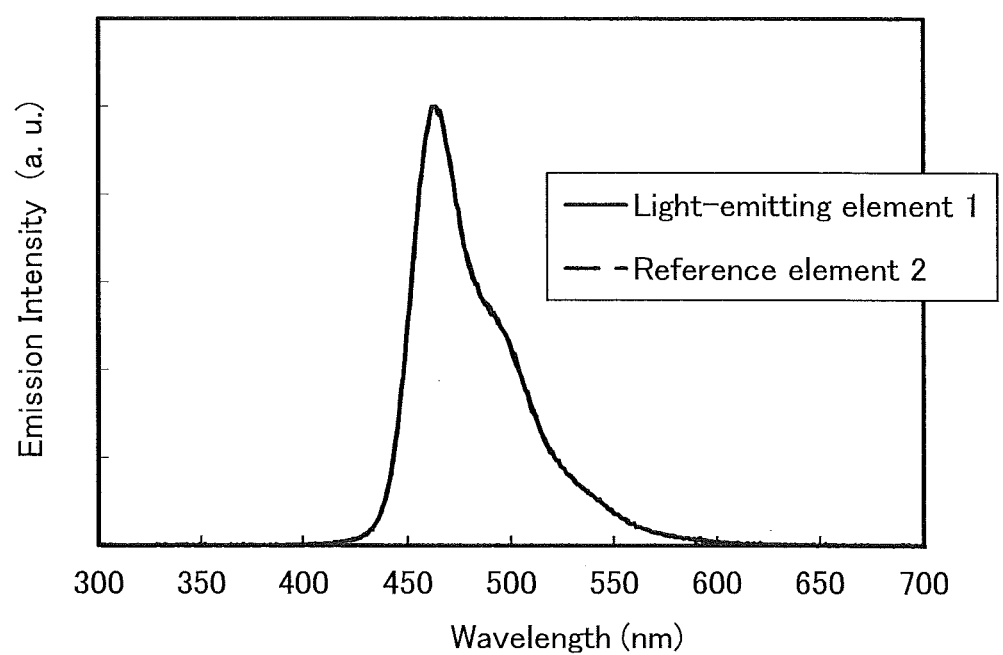
FIG. 19 shows emission spectra of the light-emitting element 1 and the comparative light-emitting element 2.

FIG. 15 shows luminance-current efficiency characteristics of the light-emitting element 1 and the comparative light-emitting element 2. In FIG. 15, the horizontal axis represents luminance (cd/m$^2$) and the vertical axis represents current efficiency (cd/A). FIG. 16 shows voltage-current characteristics of the light-emitting element 1 and the comparative light-emitting element 2. In FIG. 16, the horizontal axis represents voltage (V) and the vertical axis represents current (mA). FIG. 17 shows the voltage-luminance characteristics of the light-emitting element 1 and the comparative light-emitting element 2. In FIG. 17, the horizontal axis represents voltage (V) and the vertical axis represents luminance (cd/m$^2$). FIG. 18 shows luminance-external quantum efficiency characteristics of the light-emitting element 1 and the comparative light-emitting element 1. In FIG. 18, the horizontal axis represents luminance (cd/m$^2$) and the vertical axis represents external quantum efficiency (%). FIG. 19 shows emission spectra of the light-emitting element 1 and the comparative light-emitting element 2 that were obtained when a current of 1 mA was applied to the light-emitting elements. In FIG. 19, the horizontal axis represents wavelength (nm) and the vertical axis represents light emission intensity (arbitrary unit).

Table 3 shows the voltage (V), current density (mA/cm$^2$), CIE chromaticity coordinates (x, y), luminance (cd/m$^2$), current efficiency (cd/A), power efficiency (lm/W), and external quantum efficiency (%) of each light-emitting element at a luminance of around 1000 cd/m$^2$.

TABLE 3

Initial performance of light-emitting element 1 and comparative light-emitting element 2 (reference element 2)

| | Voltage (V) | Current density (mA/cm$^2$) | Chromaticity (x, y) | Luminance (cd/m$^2$) | Current efficiency (cd/A) | External quantum efficiency (%) |
|---|---|---|---|---|---|---|
| Light-emitting element 1 | 3.2 | 11 | (0.14, 0.18) | 837 | 7.3 | 5.8 |
| Reference element 2 | 3.2 | 12 | (0.14, 0.17) | 875 | 7.4 | 5.8 |

As shown in FIG. 15, FIG. 16, FIG. 17, FIG. 18, and Table 3, the luminance-current efficiency characteristics, the voltage-current characteristics, the voltage-luminance characteristics, and the luminance-external quantum efficiency characteristics of the light-emitting element 1 are almost the same as those of the comparative light-emitting element 2. In addition, as shown in FIG. 19, the light-emitting element 1 and the comparative light-emitting element 2 have almost the same emission spectra.

Figure 20A:
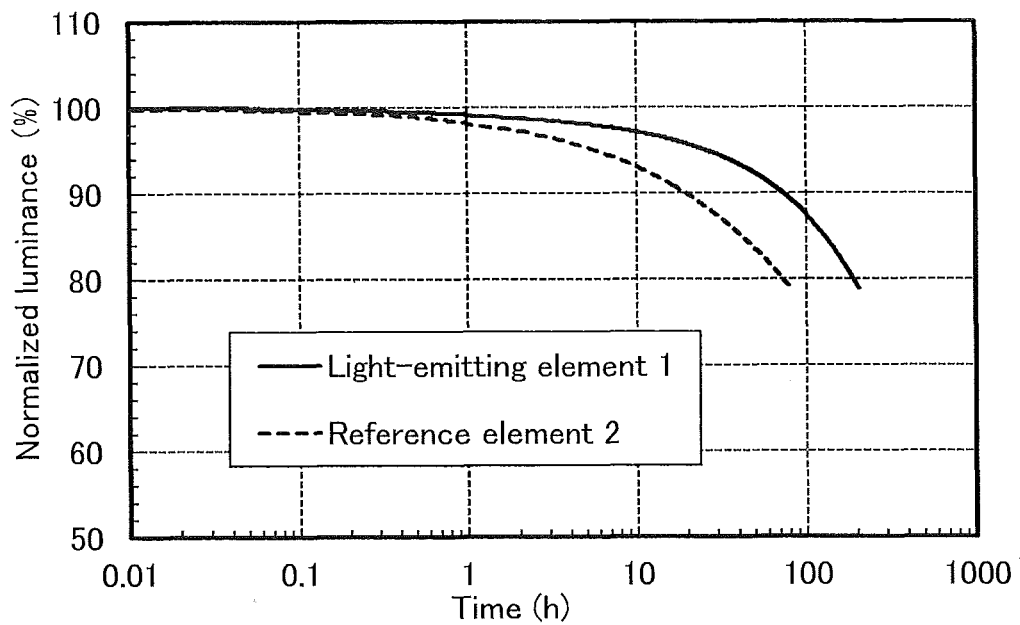
FIGS. 20A and 20B show reliability of the light-emitting element 1 and the comparative light-emitting element 2.
Figure 20B:
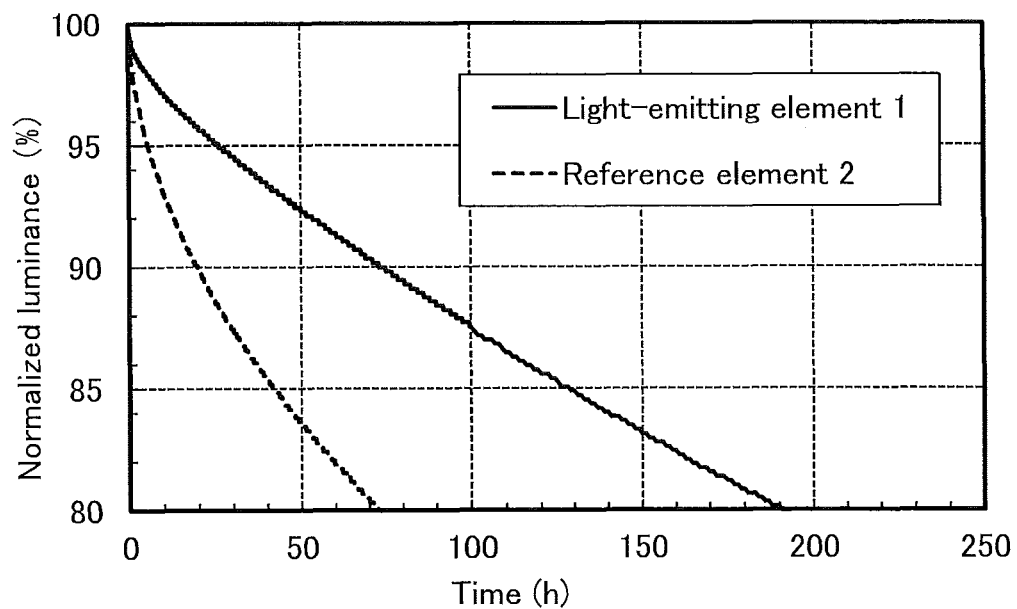

Next, the light-emitting element 1 and the comparative light-emitting element 2 were subjected to reliability tests. FIGS. 20A and 20B show results of the reliability tests. In FIGS. 20A and 20B, the vertical axis represents normalized luminance (%) with an initial luminance of 100% and the horizontal axis represents driving time (h) of the elements. In FIG. 20A, the horizontal axis is on a logarithmic scale. In FIG. 20B, the scales of the vertical and horizontal axes of FIG. 20A are expanded and the horizontal axis is on a linear scale.

In the reliability tests, the light-emitting element 1 and the comparative light-emitting element 2 of this example were driven under the conditions where the temperature was room temperature, the initial luminance was set to 5000 cd/m², and the current density was constant. According to the results shown in FIG. 20A, the light-emitting element 1 keeps 78% of the initial luminance after being driven for 208 hours, while the comparative light-emitting element 2 results in 78% of the initial luminance only after being driven for 83 hours. According to the results shown in FIG. 20B, the luminance of the light-emitting element 1 after 24 hours is 95.3% of the initial luminance; while the luminance of the comparative light-emitting element 2 after 24 hours is 88.9% of the initial luminance. As described above, a light-emitting element that keeps 90% or more of the initial luminance of 5000 cd/m² after 24 hours can be obtained by the method for fabricating a light-emitting element of one embodiment of the present invention.

The results of the reliability tests revealed that the light-emitting element 1 has a longer lifetime than the comparative light-emitting element 2. This example demonstrates that the light-emitting element having a long lifetime can be fabricated by the method of one embodiment of the present invention.

The difference in reliability tests between the light-emitting element 1 and the comparative light-emitting element 2 probably results from the fact that as shown in Table 1, the partial pressure of the impurity with m/z of 92 (corresponding to toluene) in the film formation chamber is higher than or equal to $1 \times 10^{-12}$ Pa and lower than $5 \times 10^{-8}$ Pa during evaporation including the steps before the heating, in the heating, and at the time of evaporation) when the second electron-transport layer 1114b of the light-emitting element 1 was formed, whereas that of the comparative light-emitting element 2 is higher than or equal to $5 \times 10^{-8}$ Pa. In other words, the reliability is influenced by the larger amount of the impurity in the second electron-transport layer 1114b of the comparative light-emitting element 2 than that in the second electron-transport layer 1114b of the light-emitting element 1.

The above results indicate that in fabrication of the light-emitting element, the partial pressure of the component with m/z of 92 is preferably higher than or equal to $1 \times 10^{-12}$ Pa and lower than $5 \times 10^{-8}$ Pa in heating of the material when the organic compound is evaporated.

Example 2

Figure 8:
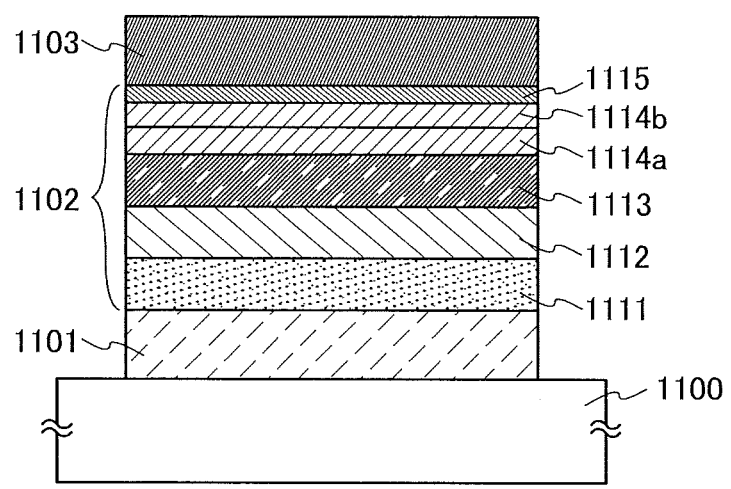
FIG. 8 illustrates a light-emitting element.

In this example, a light-emitting element 3 fabricated by the method according to one embodiment of the present invention and a comparative light-emitting element 4 fabricated as a comparative example are described in a manner similar to that in Example 1 with reference to FIG. 8 used in Example 1. Chemical formulae of materials used in this embodiment are shown below.

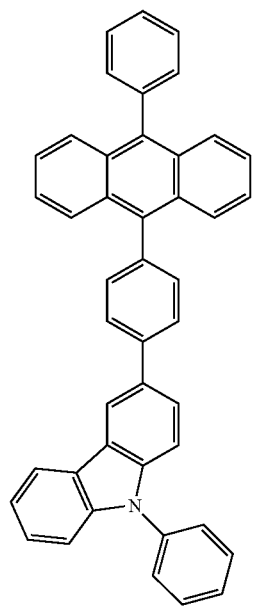

PCzPA

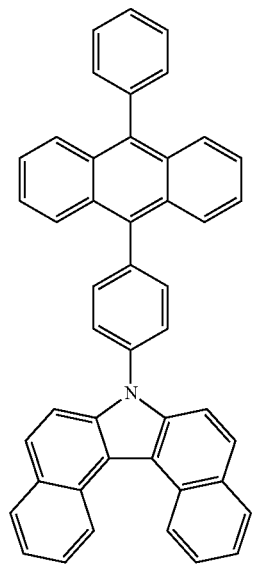

cgDBCzPA

-continued

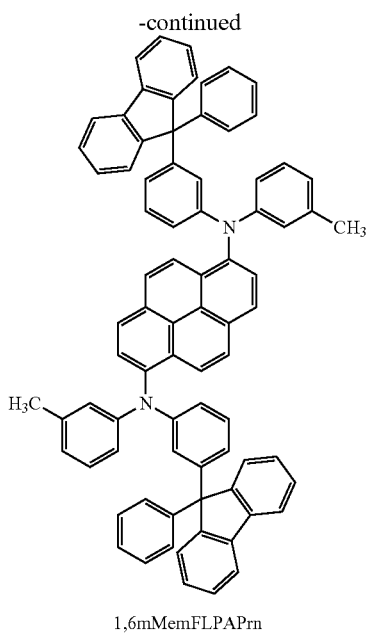

1,6mMemFLPAPrn

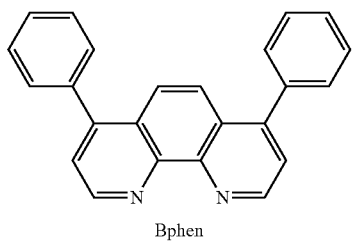

Bphen

The light-emitting element 3 and the comparative light-emitting element 4 described in this example are provided over a substrate 1100 and have a structure in which an EL layer 1102 is provided between a first electrode 1101 and a second electrode 1103, and materials and thicknesses of the layers included in the EL layers 1102 are the same. However, as described below, the light-emitting layer 1113 is different in formation condition between the light-emitting element 3 and the comparative light-emitting element 4.

<Method for Fabricating Light-Emitting Element 3 and Comparative Light-Emitting Element 4>

First, an indium oxide-tin oxide compound containing silicon or silicon oxide (ITSO) was deposited by a sputtering method over a substrate 1100 that was a glass substrate to form a first electrode 1101. Note that the composition ratio of $In_2O_3$ to $SnO_2$ and $SiO_2$ in a target used was 85:10:5 [wt %]. The thickness of the first electrode 1101 was 110 nm and the electrode area was 2 mm×2 mm. Here, the first electrode 1101 functioned as an anode of each of the light-emitting elements.

Next, as pretreatment, after a substrate surface was cleaned, dry treatment was performed at 200° C. in a nitrogen atmosphere for 1 hour.

After that, the substrate was transferred into a vacuum evaporation apparatus where the pressure had been reduced to approximately $10^{-4}$ Pa, and subjected to vacuum baking at 150° C. for 30 minutes in a heating chamber of the vacuum evaporation apparatus, and then, the substrate was cooled down to room temperature.

Next, the substrate 1100 was fixed to a substrate holder in the vacuum evaporation apparatus so that a surface of the substrate 1100 on which the first electrode 1101 was formed faced downward. The pressure in the vacuum evaporation apparatus was reduced to about $10^{-4}$ Pa. Then, by an evaporation method using resistance heating, 9-phenyl-3-[4-(10-phenyl-9-anthryl)phenyl]-9H-carbazole (abbreviation: PCzPA) and molybdenum oxide were deposited by co-evaporation to form a hole-injection layer 1111. The thickness of the hole-injection layer 1111 was 50 nm. The mass ratio of PCzPA to molybdenum oxide was adjusted to 2:1 (=PCzPA: molybdenum oxide).

Next, PCzPA was deposited to a thickness of 30 nm on the hole-injection layer 1111 to form a hole-transport layer 1112.

Next, the light-emitting layer 1113 was formed on the hole-transport layer 1112.

The light-emitting layer 1113 was formed by depositing N,N'-bis(3-methylphenyl)-N,N'-bis[3-(9-phenyl-9H-fluoren-9-yl)phenyl]-pyrene-1,6-diamine (abbreviation: 1,6mMemFLPAPrn) as a first organic compound emitting fluorescence and 7-[4-(10-phenyl-9-anthryl)phenyl]-7H-dibenzo[c,g]carbazole (abbreviation: cgDBCzPA) as a second organic compound by co-evaporation. The thickness of the light-emitting layer 1113 was 25 nm. The mass ratio of cgDBCzPA to 1,6mMemFLPAPrn was adjusted to 1:0.04 (=cgDBCzPA:1,6mMemFLPAPrn).

In the case where the light-emitting layer 1113 was formed, cgDBCzPA and 1,6mMemFLPAPrn were co-evaporated when the partial pressure of each component with m/z ranging from 46 to 200 in a film formation chamber was higher than or equal to $1\times10^{-12}$ Pa and lower than $1\times10^{-8}$ Pa in the case of the light-emitting element 3. In contrast, in the case of the comparative light-emitting element 4, the co-evaporation was carried out when the partial potential of at least one of the components was higher than or equal to $5\times10^{-8}$ Pa.

Figure 21A:
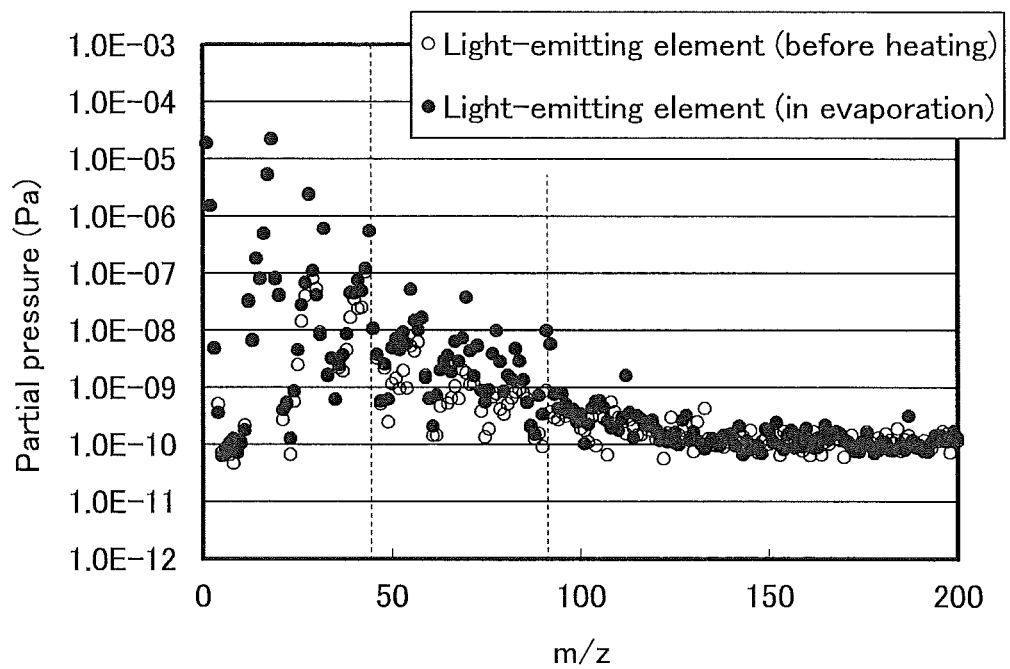
FIGS. 21A and 21B show analysis results of gases a film-formation chamber at the time of formation of light-emitting layers of a light-emitting element 3 and a comparative light-emitting element 4 (reference element 4).
Figure 21B:
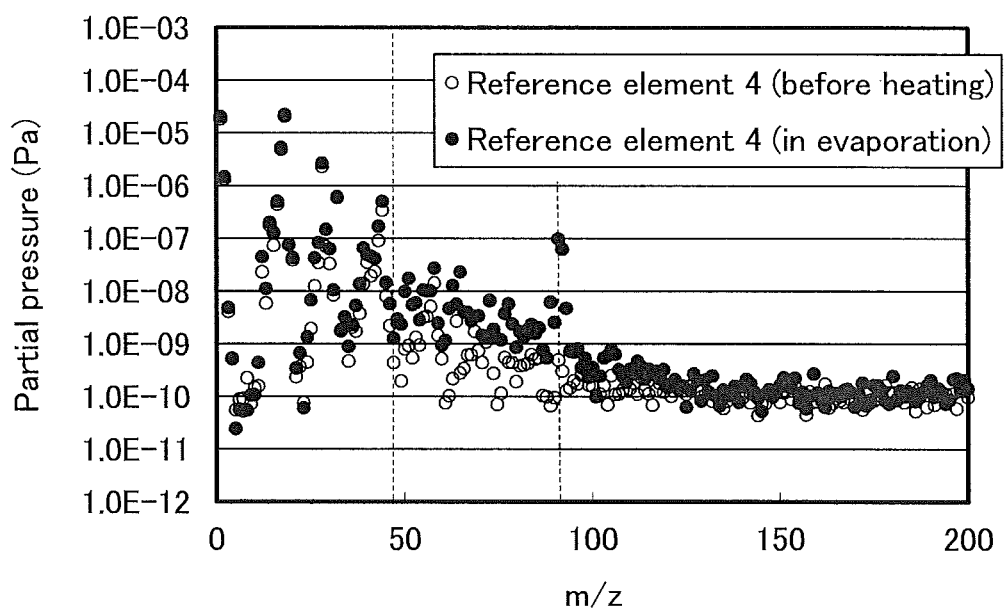

FIGS. 21A and 21B show the analysis results of the gasses in the film formation chamber at the time of the co-evaporation of cgDBCzPA and 1,6mMemFLPAPrn for the light-emitting element 3 and the comparative light-emitting element 4, respectively. Here, FIG. 21A shows the analysis results before the heating and during the co-evaporation of the materials for the light-emitting element 3, while FIG. 21B shows the corresponding analysis results for the comparative light-emitting element 4. In FIGS. 21A and 21B, the horizontal axis represents m/z and the vertical axis represents partial pressure of each component.

In the case where the light-emitting layer 1113 of the light-emitting element 3 was formed, no distinctive peak was detected before the heating and at the time of evaporation, and the partial pressure of each component with m/z ranging from 46 to 200 was higher than or equal to $1\times10^{-12}$ Pa and lower than $1\times10^{-8}$ Pa. In contrast, in the case where the light-emitting layer 1113 of the comparative light-emitting element 4 was formed, the partial pressure of a component with m/z of 92 was distinctive and exceeded $5\times10^{-8}$ Pa before the heating and at the time of evaporation. The results indicate that a component with m/z of 92 is contained in the light-emitting layer 1113.

Table 4 shows measurement results of the total pressure in the film formation chamber, the partial pressure of the component with m/z of 92, and the ratio (%) of the partial pressure to the total pressure before the heating and at the time of evaporation in the case where the light-emitting layer 1113 of each of the light-emitting element 3 and the comparative light-emitting element 4 was formed.

TABLE 4

Total pressure, partial pressure of a component with m/z of 92, and their ratios.

| Device | run | Total pressure (Pa) | Partial pressure[c] (Pa) | Ratio[d] (%) |
|---|---|---|---|---|
| Light-emitting element 3 | a | 5.44E−05 | 3.72E−10 | 0.0007 |
| Light-emitting element 3 | b | 5.38E−05 | 5.78E−09 | 0.0107 |
| Reference element 4 | a | 5.06E−05 | 3.04E−10 | 0.0006 |
| Reference element 4 | b | 5.65E−05 | 6.31E−08 | 0.1117 |

[a]Before heating.
[b]During heating.
[c]Partial Pressure of a component with m/z of 92.
[d]Partial pressure/total pressure The above results demonstrate that the partial pressure of an impurity with m/z of 92 (corresponding to toluene) in the film formation chamber was higher than or equal to $1\times10^{-12}$ Pa and lower than $1\times10^{-8}$ Pa in each measurement (the measurement before the heating and at the time of evaporation) when the light-emitting layer 1113 of the light-emitting element 3 was formed. In contrast, the partial pressure of the impurity with m/z of 92 in the film formation chamber was as high as $5\times10^{-8}$ Pa or higher in the measurement at the time of evaporation when the light-emitting layer 1113 of the comparative light-emitting element 4 was formed.

From the aforementioned results, the light-emitting element 3 is a light-emitting element fabricated by the fabrication method of one embodiment of the present invention, in which an organic compound is evaporated when the partial pressure of each component with a mass number (e.g., m/z) of 46 or more and 200 or less in a film formation chamber is higher than or equal to $1\times10^{-12}$ Pa and lower than $1\times10^{-8}$ Pa. In contrast, the comparative light-emitting element 4 is considered to be a light-emitting element containing a large amount of impurity in the organic compound film formed by evaporating the organic compound, as compared to the light-emitting element fabricated by the fabrication method of one embodiment of the present invention.

Next, cgDBCzPA was deposited to a thickness of 10 nm on the light-emitting layer 1113 to form a first electron-transport layer 1114a.

Next, Bphen was deposited to a thickness of 15 nm on the first electron-transport layer 1114a to form a second electron-transport layer 1114b.

Next, lithium fluoride (LiF) was deposited to a thickness of 1 nm on the second electron-transport layer 1114b to form an electron-injection layer 1115.

Lastly, aluminum was deposited to a thickness of 200 nm to form a second electrode 1103 serving as a cathode. Thus, the light-emitting element 3 and the comparative light-emitting element 4 of this example were fabricated.

Note that in all the above evaporation steps, evaporation was performed by a resistance-heating method.

Table 5 shows element structures of the light-emitting element 3 and the comparative light-emitting element 4 that were fabricated as described above.

TABLE 5

Structure of light-emitting element 3 and comparative light-emitting element 4 (reference element 4)

| | Material | Thickness (nm) | Weight ratio |
|---|---|---|---|
| 2nd electrode | Al | 200 | |
| Electron-injection layer | LiF | 1 | |
| 2nd Electron-transport layer | Bphen | 15 | |
| 1st Electron-transport layer | cgDBCzPA | 10 | |
| Light-emitting layer | cgDBCzPA:1,6mMemFLPAPrn | 25 | 1:0.04 |
| Hole-transport layer | PCzPA | 10 | |
| Hole-injection layer | PCzPA:MoOx | 50 | 2:1 |
| 1st electrode | ITSO | 110 | |

Next, the light-emitting element 3 and the comparative light-emitting element 4 were each sealed using a glass substrate in a glove box containing nitrogen so as not to be exposed to the air (specifically, a sealing material was applied onto an outer edge of the element and heat treatment was performed at 80° C. for 1 hour at the time of sealing). Then, the operation characteristics of the light-emitting elements were measured. The measurement was carried out at room temperature (in an atmosphere kept at 25° C.

Figure 22:
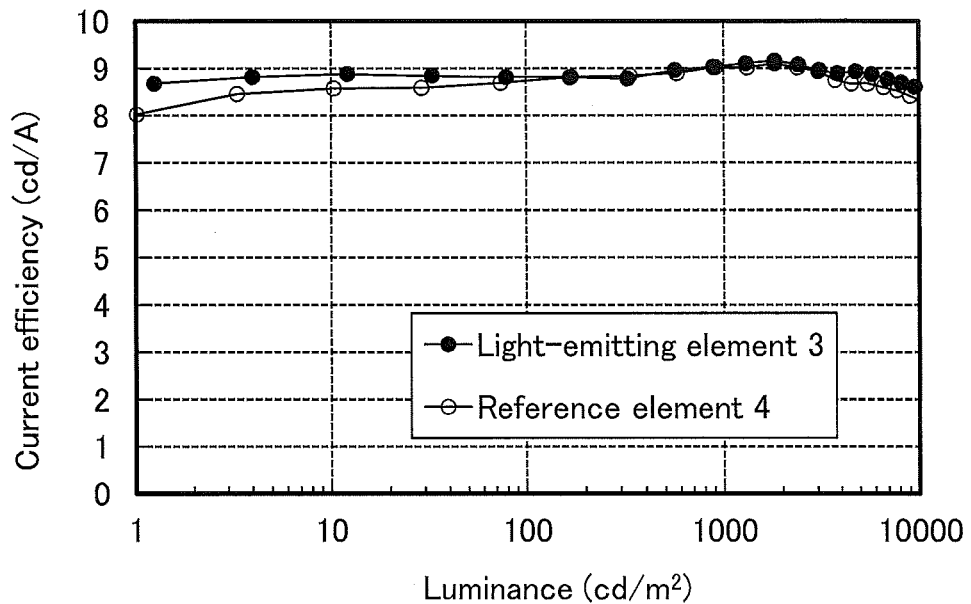
FIG. 22 shows luminance-current efficiency characteristics of the light-emitting element 3 and the comparative light-emitting element 4.
Figure 23:
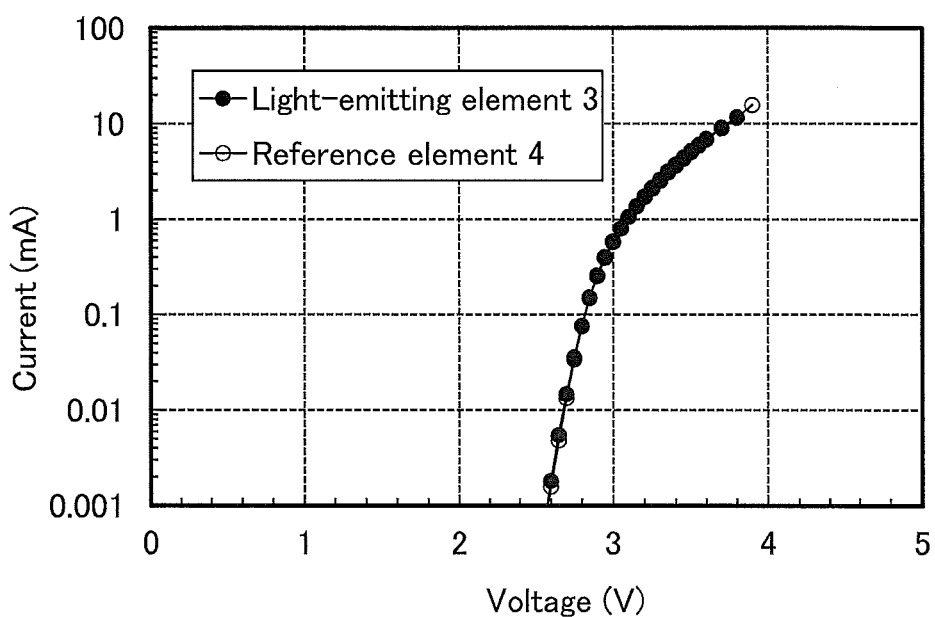
FIG. 23 shows voltage-current characteristics of the light-emitting element 3 and the comparative light-emitting element 4.
Figure 24:
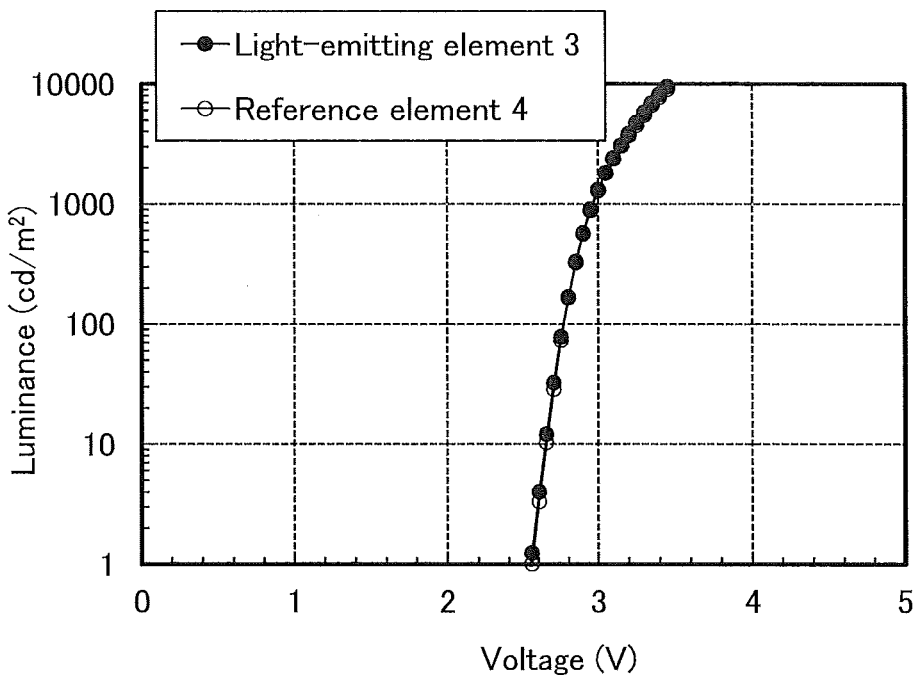
FIG. 24 shows voltage-luminance characteristics of the light-emitting element 3 and the comparative light-emitting element 4.
Figure 25:
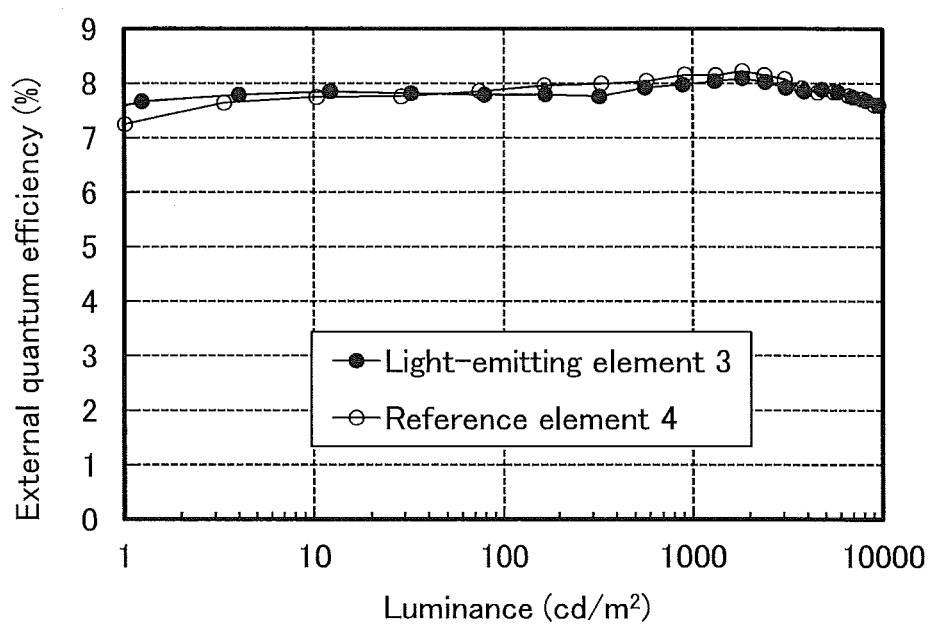
FIG. 25 shows luminance-external quantum efficiency characteristics of the light-emitting element 3 and the comparative light-emitting element 4.

FIG. 22 shows luminance-current efficiency characteristics of the light-emitting element 3 and the comparative light-emitting element 4. In FIG. 22, the horizontal axis represents luminance (cd/m$^2$) and the vertical axis represents current efficiency (cd/A). FIG. 23 shows voltage-current characteristics of the light-emitting element 3 and the comparative light-emitting element 4. In FIG. 23, the horizontal axis represents voltage (V) and the vertical axis represents current (mA). FIG. 24 shows the voltage-luminance characteristics of the light-emitting element 3 and the comparative light-emitting element 4. In FIG. 24, the horizontal axis represents voltage (V) and the vertical axis represents luminance (cd/m$^2$). FIG. 25 shows luminance-external quantum efficiency characteristics of the light-emitting element 3 and the comparative light-emitting element 4. In FIG. 25, the horizontal axis represents luminance (cd/m$^2$) and the vertical axis represents external quantum efficiency (%).

Table 6 shows initial values of main characteristics of the light-emitting elements at a luminance of approximately 1000 cd/m$^2$.

TABLE 6

Initial performance of light-emitting element 3 and comparative light-emitting element 4 (reference element 4)

| | Voltage (V) | Current (A) | Current density (mA/cm$^2$) | Chromaticity (x, y) | Luminance (cd/m$^2$) | Current efficiency (cd/A) | External quantum efficiency (%) |
|---|---|---|---|---|---|---|---|
| Light-emitting element 3 | 3.0 | 0.39 | 10 | (0.14, 0.16) | 890 | 9.0 | 8.0 |
| Reference element 4 | 3.0 | 0.40 | 10 | (0.14, 0.15) | 910 | 9.0 | 8.2 |

The above results demonstrate that the initial characteristics of the light-emitting element 3 and the comparative light-emitting element 4 that were fabricated in this example were almost the same.

Figure 26:
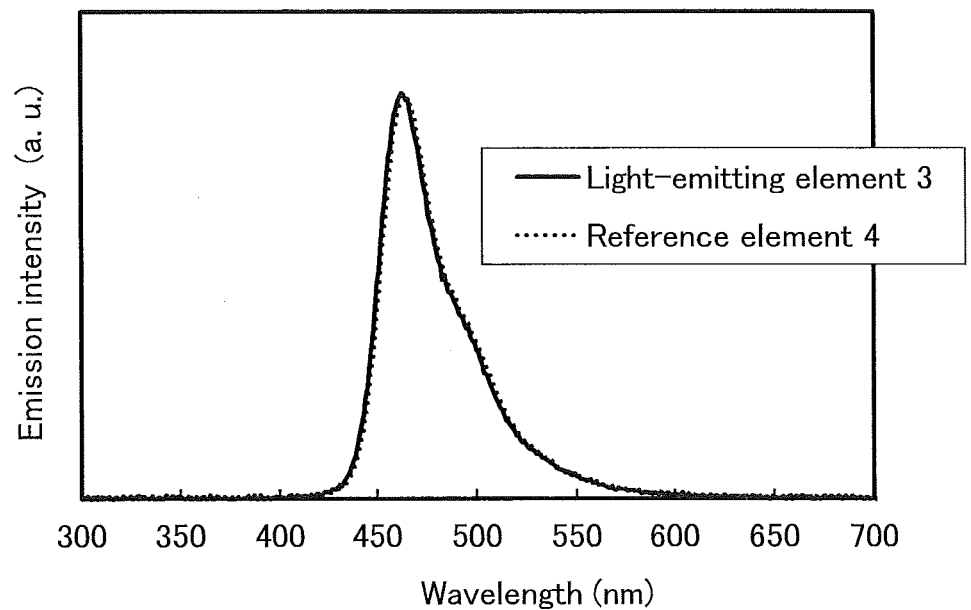
FIG. 26 shows emission spectra of the light-emitting element 3 and the comparative light-emitting element 4.

FIG. 26 shows emission spectra of the light-emitting element 3 and the comparative light-emitting element 4 that were obtained when a current of 0.1 mA was applied to the light-emitting elements. In FIG. 26, the horizontal axis represents wavelength (nm) and the vertical axis represents emission intensity (arbitrary unit). As shown in FIG. 26, the emission spectra of both of the light-emitting element 3 and the comparative light-emitting element 4 have peaks at 467 nm, which indicates that the peaks are derived from emission of 1,6mMemFLPAPrn.

Figure 27:
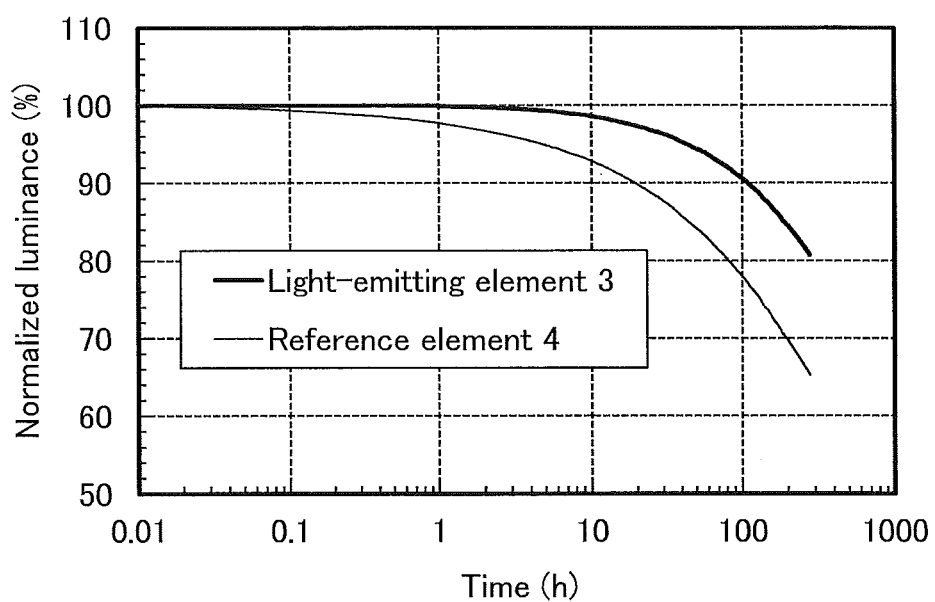
FIG. 27 shows reliability of the light-emitting element 3 and the comparative light-emitting element 4.

Next, the light-emitting element 3 and the comparative light-emitting element 4 were subjected to reliability tests. FIG. 27 shows results of the reliability tests. In FIG. 27, the vertical axis represents normalized luminance (%) with an initial luminance of 100% and the horizontal axis represents driving time (h) of the elements.

In the reliability tests, the light-emitting element 3 and the comparative light-emitting element 4 of this example were driven under the conditions where the temperature was room temperature, the initial luminance was set to 5000 cd/m$^2$, and the current density was constant. According to the results shown in FIG. 27, the light-emitting element 3 keeps 90% of the initial luminance after being driven for 100 hours, while the comparative light-emitting element 4 decreases in luminance to 78% of the initial value after being driven for 100 hours. As described above, a long-life light-emitting element that keeps 90% or more of the initial luminance of 5000 cd/m$^2$ after 100 hours can be obtained by the method for fabricating a light-emitting element of one embodiment of the present invention. This example demonstrates that the light-emitting element having a long lifetime can be fabricated by the method for fabricating a light-emitting element of one embodiment of the present invention.

The difference in reliability between the light-emitting element 3 and the comparative light-emitting element 4 probably results from the fact that as shown in Table 4, the partial pressure of the impurity with m/z of 92 (corresponding to toluene) in the film formation chamber is higher than or equal to $1 \times 10^{-12}$ Pa and lower than $1 \times 10^{-8}$ Pa during evaporation (including the steps before the heating and at the time of evaporation) when the light-emitting layer 1113 of the light-emitting element 3 was formed, whereas that of the comparative light-emitting element 4 is as high as $5 \times 10^{-8}$ Pa. In other words, the reliability is influenced by the larger amount of the impurity in the light-emitting layer 1113 of the comparative light-emitting element 4 than that in the light-emitting layer 1113 of the light-emitting element 3.

The above results indicate that in fabrication of a light-emitting element, the partial pressure of the residual gas with m/z of 92 is preferably higher than or equal to $1 \times 10^{-12}$ Pa and lower than $1 \times 10^{-8}$ Pa in heating of the material when the organic compound is evaporated.

Example 3

In this example, a light-emitting element 5 fabricated by a method for fabricating a light-emitting element of one embodiment of the present invention and a comparative light-emitting element 6 fabricated as a comparative example are described with reference to FIG. 8. Chemical formulae of materials used in this embodiment are shown below.

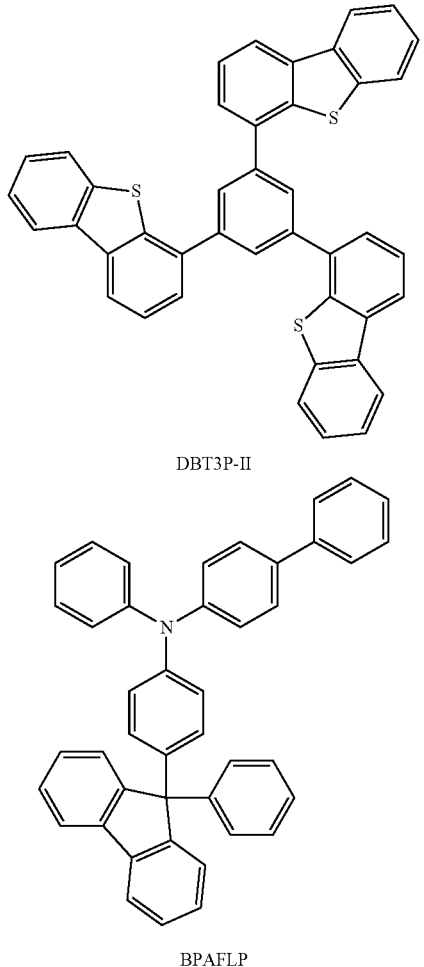

DBT3P-II

BPAFLP

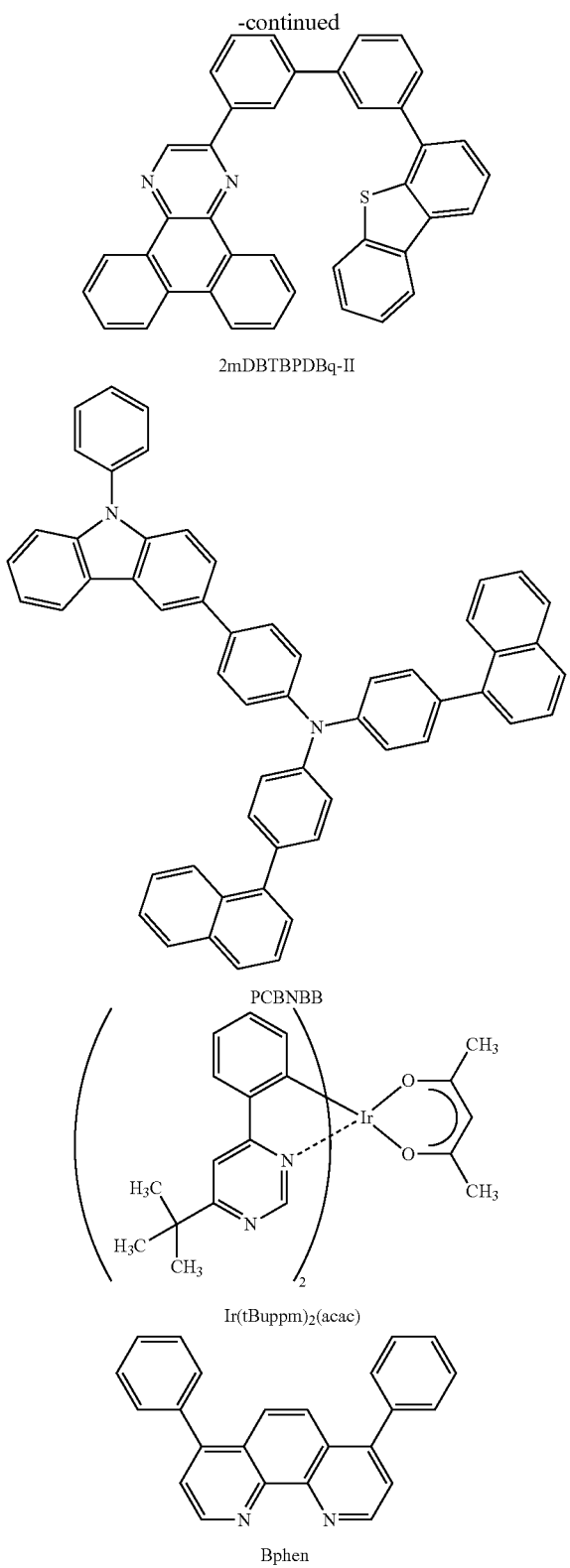

The light-emitting element 5 and the comparative light-emitting element 6 described in this example have the same structure as each other and are provided over a substrate 1100 in which an EL layer 1102 is provided between a first electrode 1101 and a second electrode 1103. The EL layer 1102 includes a hole-injection layer 1111, a hole-transport layer 1112, a light-emitting layer 1113, a first electron-transport layer 1114a, a second electron-transport layer 1114b, and an electron-injection layer 1115.

Note that the difference between the light-emitting element 5 and the light-emitting element 6 lies in the condition for the fabrication of the light-emitting layer 1113. The methods for fabricating the light-emitting element 5 and the comparative light-emitting element 6 are specifically described below.

<Methods for Fabricating Light-Emitting Element 5 and Comparative Light-Emitting Element 6>

First, an indium oxide-tin oxide compound containing silicon or silicon oxide (ITSO) was deposited by a sputtering method over a substrate 1100 that was a glass substrate to form a first electrode 1101. Note that the composition ratio of $In_2O_3$ to $SnO_2$ and $SiO_2$ in the target used was 85:10:5 [wt %]. The thickness of the first electrode 1101 was 110 nm. The electrode area was 2 mm×2 mm. Here, the first electrode 1101 functioned as an anode of the light-emitting element.

Next, as pretreatment, after a substrate surface was cleaned, dry treatment was performed at 200° C. in a nitrogen atmosphere for 1 hour.

After that, the substrate was transferred into a vacuum evaporation apparatus where the pressure had been reduced to approximately $10^{-4}$ Pa, and subjected to vacuum baking at 150° C. for 30 minutes in a heating chamber of the vacuum evaporation apparatus, and then, the substrate was cooled down to room temperature.

Next, the substrate 1100 was fixed to a substrate holder in the vacuum evaporation apparatus so that a surface of the substrate 1100 on which the first electrode 1101 was formed faced downward. The pressure in the vacuum evaporation apparatus was reduced to about $10^{-4}$ Pa. Then, 4,4',4''-(benzene-1,3,5-triyl)tri(dibenzothiophene) (abbreviation: DBT3P-II) and molybdenum oxide were deposited by co-evaporation to form the hole-injection layer 1111. The thickness of the hole-injection layer 1111 was 40 nm. The mass ratio of DBT3P-II to molybdenum oxide was adjusted to 2:1 (=DBT3P-II:molybdenum oxide).

Next, on the hole-injection layer 1111, 4-phenyl-4'-(9-phenylfluoren-9-yl)triphenylamine (abbreviation: BPAFLP) was deposited to a thickness of 20 nm to form the hole-transport layer 1112.

Next, on the hole-transport layer 1112, 2-[3'-(dibenzothiophen-4-yl)biphenyl-3-yl]dibenzo[f,h]quinoxaline (abbreviation: 2mDBTBPDBq-II), 4'-di(1-naphthyl)-4''-(9-phenyl-9H-carbazol-3-yl)triphenylamine (abbreviation: PCBNBB), and (acetylacetonato)bis(4,6-diphenylpyrimidinato)iridium(III) (abbreviation: Ir(tBuppm)$_2$(acac)) were deposited by co-evaporation to form the light-emitting layer 1113. The thickness of the light-emitting layer 1113 was 40 nm. The mass ratio of 2mDBTBPDBq-II to PCBNBB and Ir(tBuppm)$_2$(acac) was adjusted to 0.8:0.2:0.05 (=2mDBTBPDBq-II:PCBNBB:Ir(tBuppm)$_2$(acac)).

In the light-emitting layer 1113, 2mDBTBPDBq-II is an electron-transport material and functions as a host material. In addition, PCBNBB is a hole-transport material and functions as an assist material. In addition, Ir(tBuppm)$_2$(acac) is a phosphorescent substance and functions as a guest material.

In the case where the light-emitting layer 1113 of the light-emitting element 5 was formed, the co-evaporation was carried out when the partial pressure of a component with m/z (mass-to-charge ratio) of 84 in a film formation chamber was higher than or equal to $1\times10^{-12}$ Pa and lower than $1\times10^{-9}$ Pa. In contrast, in the case where the light-emitting layer 1113 of the comparative light-emitting element 6 was formed, the co-evaporation was carried out when the partial pressure was higher than or equal to $1\times10^{-9}$ Pa.

Figure 31:
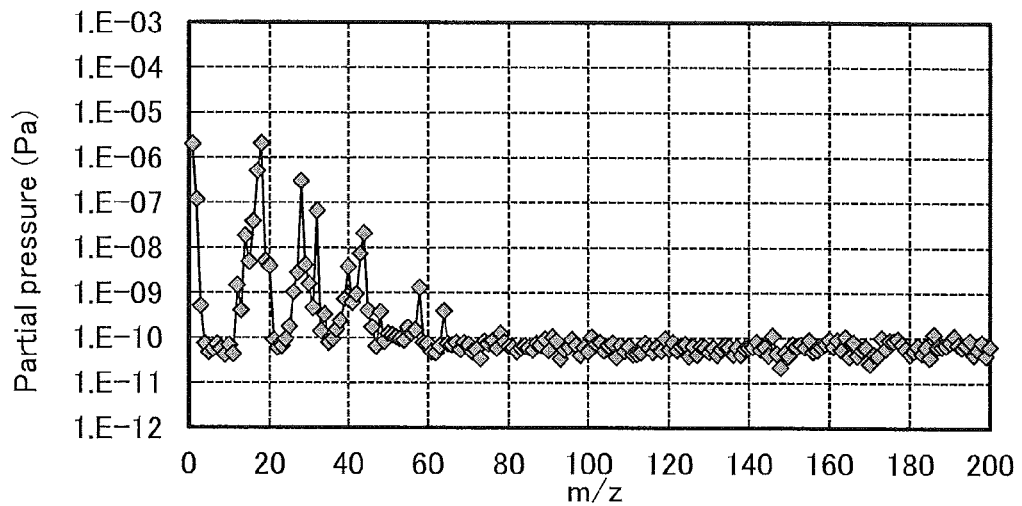
FIG. 31 shows analysis results of gases in a film-formation chamber before heating materials used in a light-emitting layer of a light-emitting element 5.
Figure 32:
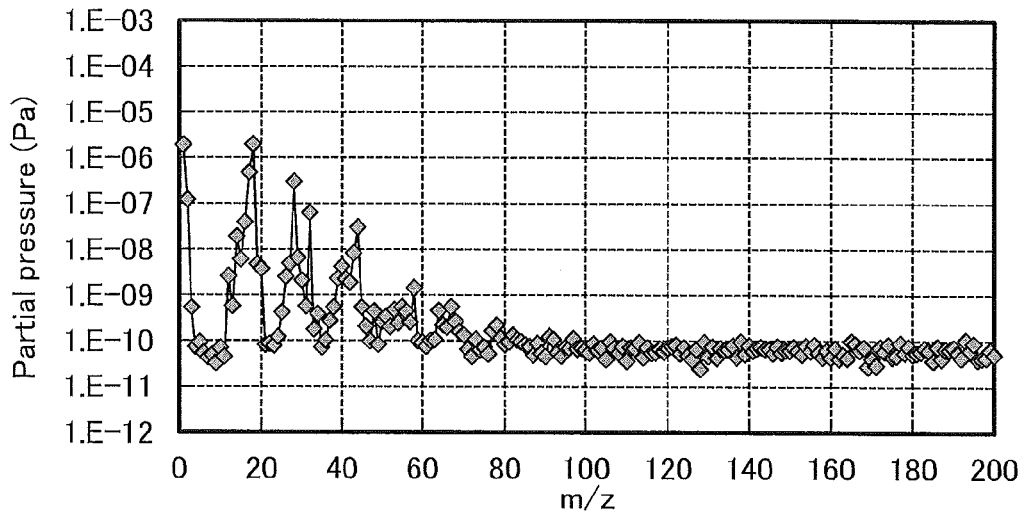
FIG. 32 shows analysis results of gases in the film-formation chamber in heating the materials used in the light-emitting layer of the light-emitting element 5.
Figure 33:
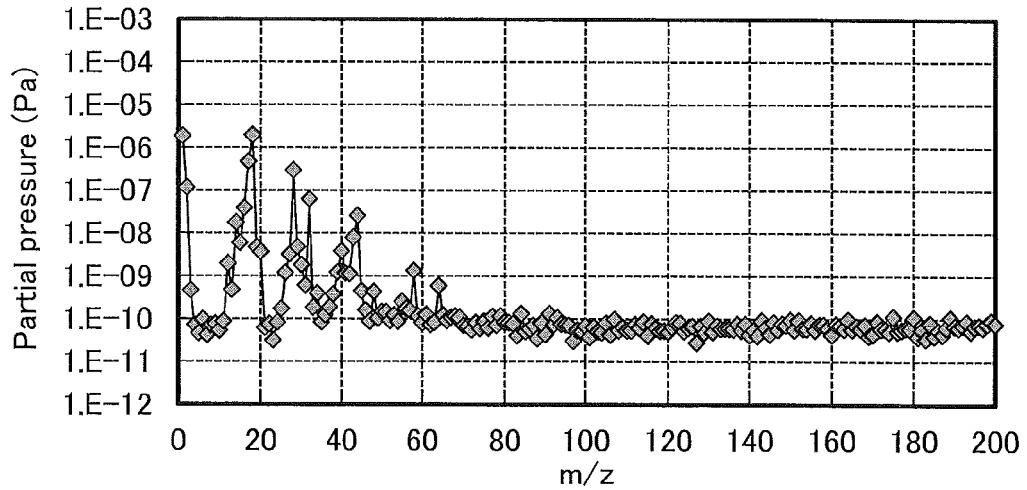
FIG. 33 shows analysis results of gases in the film-formation chamber at the time of evaporation of the materials used in the light-emitting layer of the light-emitting element 5.

FIG. 31, FIG. 32, and FIG. 33 each show analysis results of the gases in the film formation chamber at the time when the light-emitting layer 1113 of the light-emitting element 5 was formed by co-evaporation. Note that FIG. 31, FIG. 32, and FIG. 33 show measurement results before heating of the materials, during heating of the materials, and at the time of evaporation, respectively. The horizontal axis represents m/z and the vertical axis represents partial pressure of each component.

Figure 34:
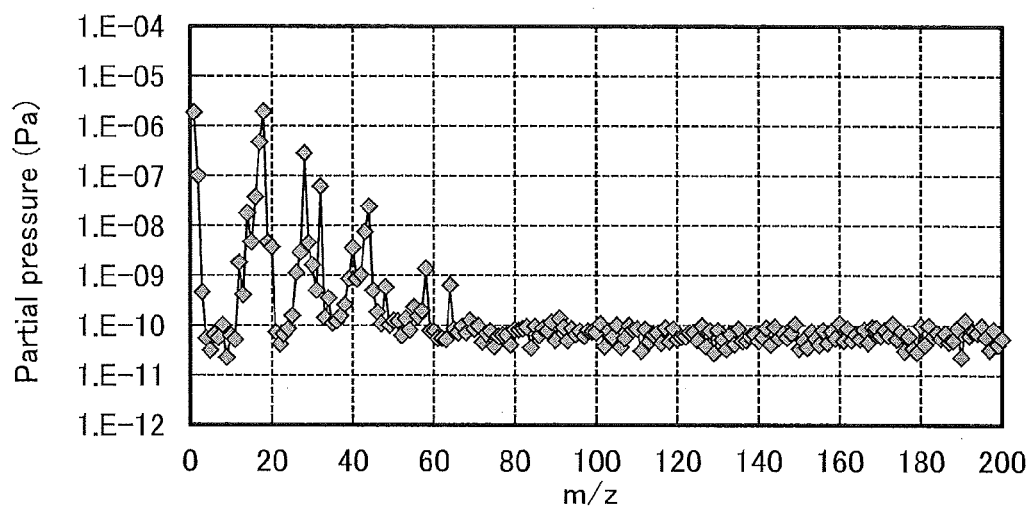
FIG. 34 shows analysis results of gases in a film-formation chamber before heating of materials used in a light-emitting layer of a comparative light-emitting element 6 (reference element 6).
Figure 35:
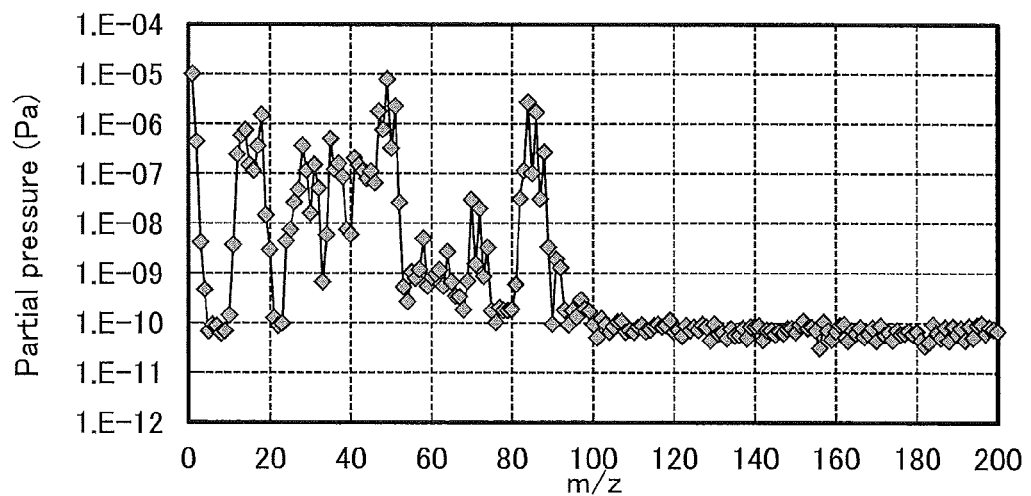
FIG. 35 shows analysis results of gases in the film-formation chamber in heating of materials used in the light-emitting layer of the comparative light-emitting element 6.
Figure 36:
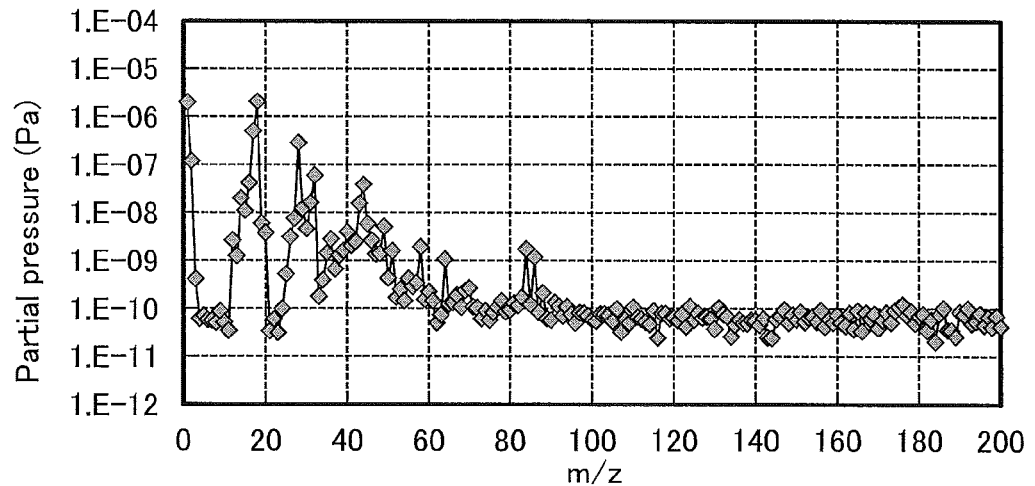
FIG. 36 shows analysis results of gases in the film-formation chamber at the time of evaporation of materials used in the light-emitting layer of the comparative light-emitting element.

FIG. 34, FIG. 35, and FIG. 36 each show analysis results of the gases in the film formation chamber at the time when the light-emitting layer 1113 of the comparative light-emitting element 6 was formed by co-evaporation. The analysis was performed by the same instrument as that used for the light-emitting element 5. Note that FIG. 34, FIG. 35, and FIG. 36 show measurement results of the residual gases before heating of the material, during heating of the material, and at the time of evaporation, respectively. The horizontal axis represents m/z and the horizontal axis represents partial pressure of each component.

In the case where Ir(tBuppm)$_2$(acac) was evaporated for the light-emitting element 5, no distinctive peak was detected before the heating, in the heating, and at the time of evaporation, and the partial pressure of each component with m/z ranging from 46 to 200 was higher than or equal to $1 \times 10^{-12}$ Pa and lower than $1 \times 10^{-9}$ P. In contrast, in the case of the comparative light-emitting element 6, the partial pressure of the component with m/z of 84 was higher than or equal to $1 \times 10^{-9}$ Pa in the heating and at the time of evaporation. The results indicate that a component with m/z of 84 is contained in a light-emitting layer 1113.

Table 7 shows measurement results of the total pressure in the film formation chamber, the partial pressure of the component with m/z of 84, and the ratio (%) of the partial pressure to the total pressure before the heating and at the time of evaporation in the case where the light-emitting layer 1113 of each of the light-emitting element 5 and the comparative light-emitting element 6 was formed.

TABLE 7

Total pressure, partial pressure of a component with m/z of 92, and their ratios.

| Devices | run | Total pressure (Pa) | Partial pressure[c] (Pa) | Ratio[d] (%) |
|---|---|---|---|---|
| Light-emitting element 7 | [a] | 4.45E−05 | 6.47E−11 | 0.0001 |
| Light-emitting element 7 | [b] | 4.30E−05 | 9.73E−11 | 0.0002 |
| Light-emitting element 7 | [c] | 4.20E−05 | 1.34E−10 | 0.0003 |
| Reference element 8 | [a] | 4.45E−05 | 3.62E−11 | 0.0001 |
| Reference element 8 | [b] | 4.30E−05 | 2.75E−06 | 6.3953 |
| Reference element 8 | [c] | 4.20E−05 | 1.75E−09 | 0.0042 |

[a]Before heating.
[b]During heating.
[c]Partial Pressure of a component with m/z of 92.
[d]Partial pressure/total pressure The above results demonstrate that the partial pressure of an impurity with m/z of 84 (corresponding to dichloromethane) was higher than or equal to $1 \times 10^{-12}$ Pa and lower than $1 \times 10^{-9}$ Pa during the evaporation (including the steps before the heating, in the heating, and at the time of evaporation) when the light-emitting layer 1113 of the light-emitting element 5 was formed. In contrast, the partial pressure of the impurity with m/z of 84 was as high as $1 \times 10^{-9}$ Pa or higher in the heating and at the time of evaporation in the case of the comparative light-emitting element 6.

From the aforementioned results, the light-emitting element 5 is a light-emitting element fabricated by the fabrication method of one embodiment of the present invention, in which a light-emitting substance is evaporated when the partial pressure of each component with a mass number of 46 or more and 200 or less in a film formation chamber is higher than or equal to $1 \times 10^{-12}$ Pa and lower than $1 \times 10^{-9}$ Pa. In contrast, the comparative light-emitting element 6 is considered to be a light-emitting element that contains a large amount of impurity in the light-emitting substance film formed by evaporating the light-emitting substance as compared to the light-emitting element fabricated by the fabrication method of one embodiment of the present invention.

Next, 2mDBTBPDBq-II was deposited to a thickness of 10 nm on the light-emitting layer 1113 to form a first electron-transport layer 1114a.

Next, Bphen was deposited to a thickness of 20 nm on the first electron-transport layer 1114a to form a second electron-transport layer 1114b.

Next, lithium fluoride (LiF) was deposited to a thickness of 1 nm on the second electron-transport layer 1114b to form an electron-injection layer 1115.

Lastly, aluminum was deposited to a thickness of 200 nm to form a second electrode 1103 serving as a cathode. Thus, the light-emitting element 5 and the comparative light-emitting element 6 of this example were fabricated.

Note that in all the above evaporation steps, evaporation was performed by a resistance-heating method.

Table 8 shows element structures of the light-emitting element 5 and the comparative light-emitting element 6 that were fabricated as described above.

TABLE 8

Structure of light-emitting element 5 and comparative light-emitting element 6 (reference element 6)

| | Material | Thickness (nm) | Weight ratio |
|---|---|---|---|
| 2nd electrode | Al | 200 | |
| Electron-injection layer | LiF | 1 | |
| 2nd Electron-transport layer | Bphen | 20 | |
| 1st Electron-transport layer | 2mDBTBPDBq-II | 10 | |
| Light-emitting layer | 2mDBTBPDBq-II:PCBNBB:Ir(tBuppm)$_2$(acac) | 40 | 0.8:0.2:0.05 |
| Hole-transport layer | BPAFLP | 20 | |
| Hole-injection layer | DBT3P-II:MoOx | 40 | 2:1 |
| 1st electrode | ITSO | 110 | |

Next, the light-emitting element 5 and the comparative light-emitting element 6 were each sealed using a glass substrate in a glove box containing nitrogen so as not to be exposed to the air (specifically, a sealing material was applied onto an outer edge of the element and heat treatment was performed at 80° C. for 1 hour at the time of sealing). Then, the operation characteristics of the light-emitting elements were measured. The measurement was carried out at room temperature (in an atmosphere kept at 25° C.

Figure 37:
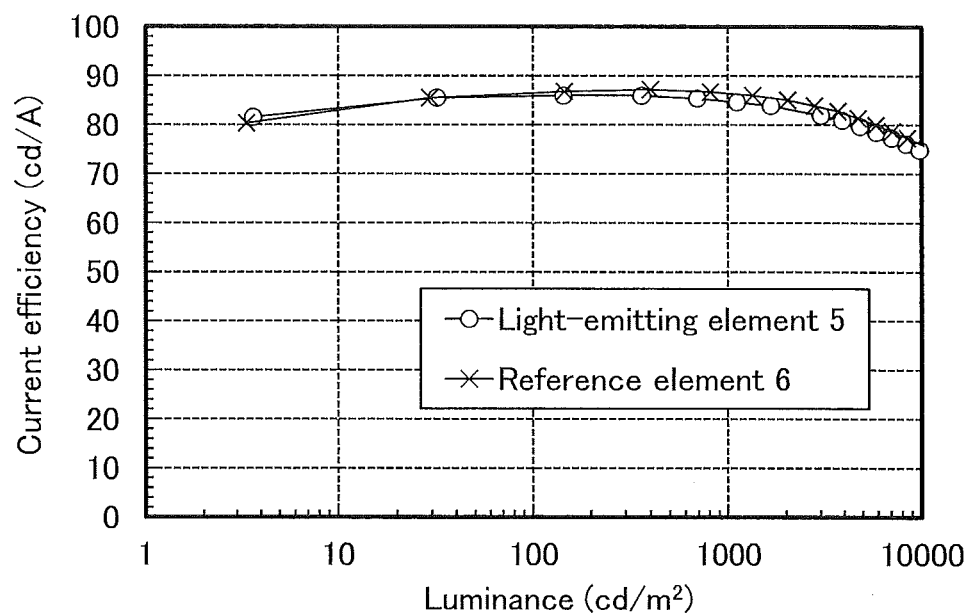
FIG. 37 shows luminance-current efficiency characteristics of the light-emitting element 5 and the comparative light-emitting element 6.
Figure 38:
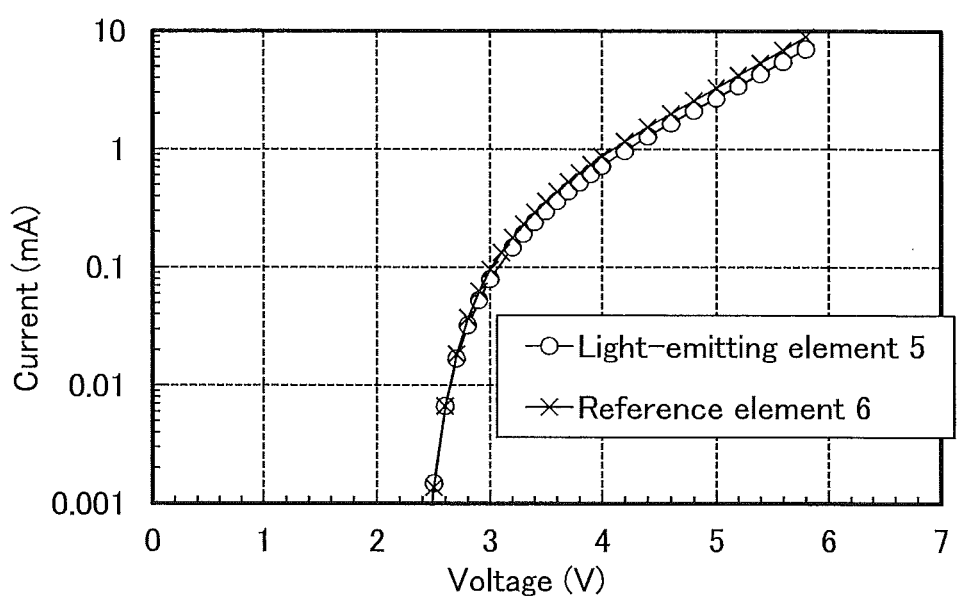
FIG. 38 shows voltage-current characteristics of the light-emitting element 5 and the comparative light-emitting element 6.
Figure 39:
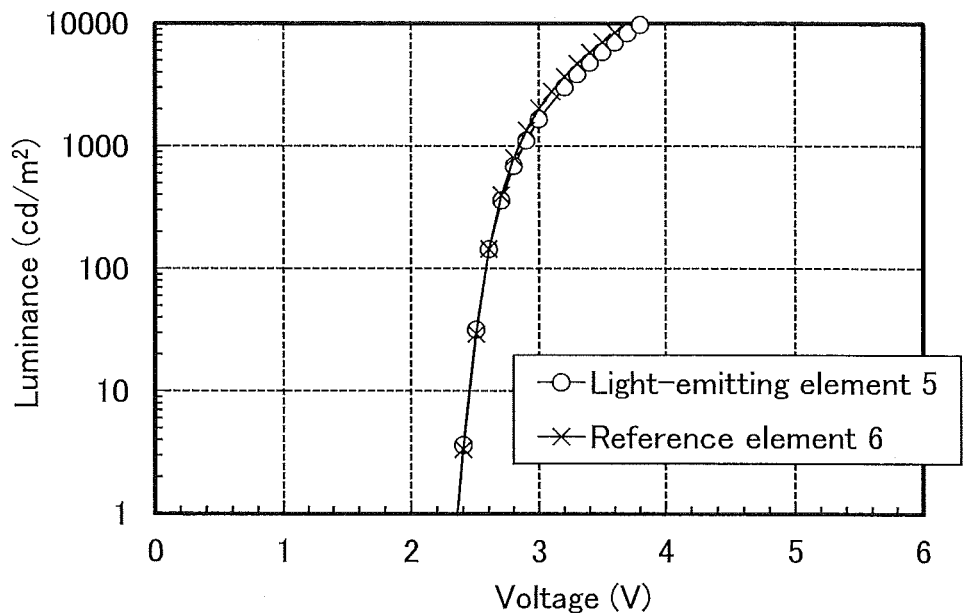
FIG. 39 shows voltage-luminance characteristics of the light-emitting element 5 and the comparative light-emitting element 6.
Figure 40:
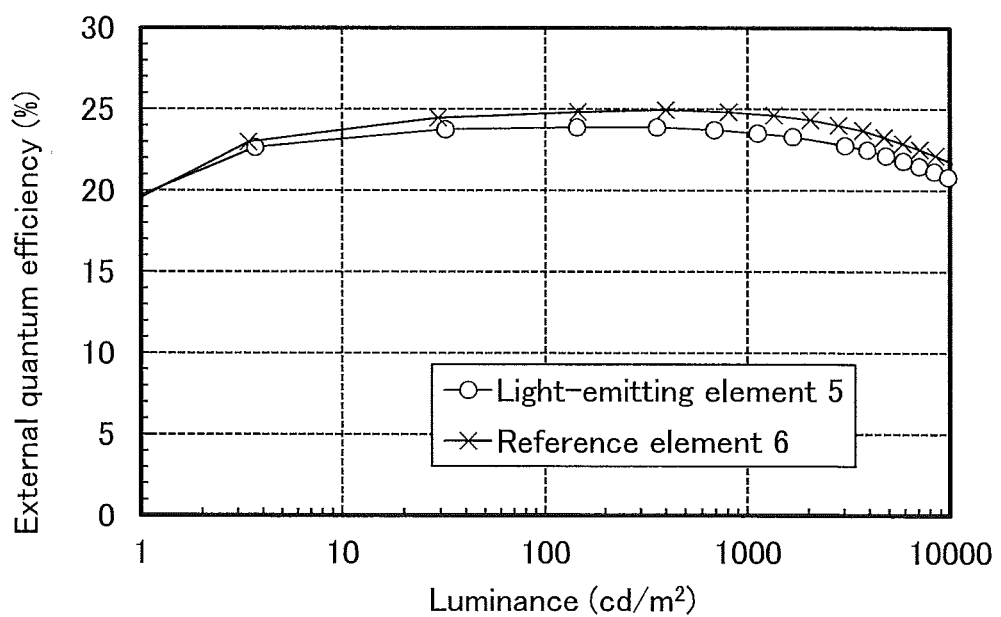
FIG. 40 shows luminance-external quantum efficiency characteristics of the light-emitting element 5 and the comparative light-emitting element 6.
Figure 41:
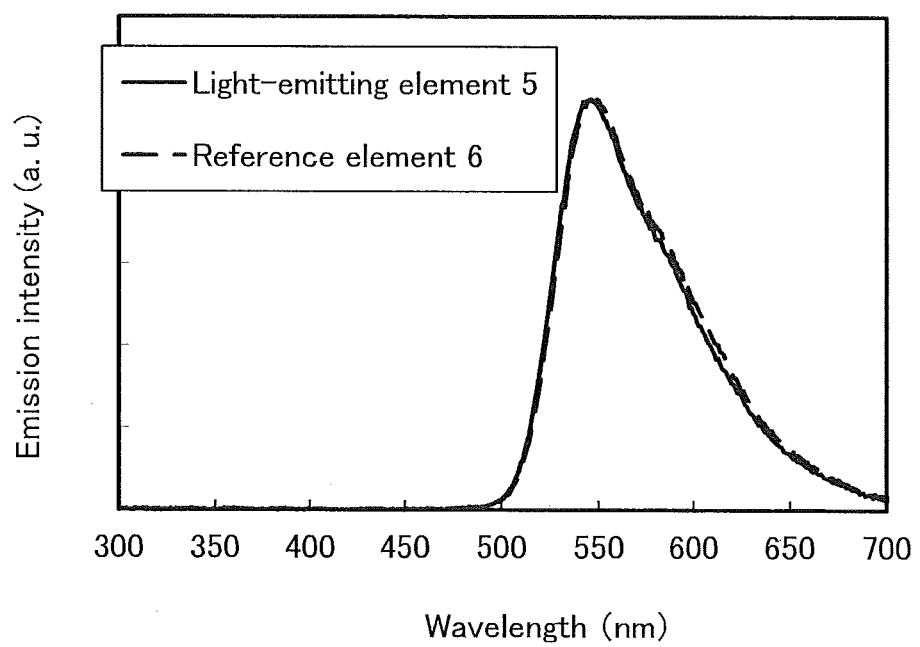
FIG. 41 shows emission spectra of the light emitting element 5 and the comparative light emitting element 6.

FIG. 37 shows luminance-current efficiency characteristics of the light-emitting element 5 and the comparative light-emitting element 6. In FIG. 37, the horizontal axis represents luminance (cd/m²) and the vertical axis represents current efficiency (cd/A). FIG. 38 shows voltage-current characteristics of the light-emitting element 5 and the comparative light-emitting element 6. In FIG. 38, the horizontal axis represents voltage (V) and the vertical axis represents current (mA). FIG. 39 shows the voltage-luminance characteristics of the light-emitting element 5 and the comparative light-emitting element 6. In FIG. 39, the horizontal axis represents voltage (V) and the vertical axis represents luminance (cd/m²). FIG. 40 shows luminance-external quantum efficiency characteristics of the light-emitting element 5 and the comparative light-emitting element 6. In FIG. 40, the horizontal axis represents luminance (cd/m²) and the vertical axis represents external quantum efficiency (%). FIG. 41 shows emission spectra of the light-emitting element 5 and the comparative light-emitting element 6 that were obtained when a current of 0.1 mA was applied to the light-emitting elements. In FIG. 41, the horizontal axis represents wavelength (nm) and the vertical axis represents light emission intensity (arbitrary unit).

Table 9 shows the voltage (V), current density (mA/cm²), CIE chromaticity coordinates (x, y), luminance (cd/m²), current efficiency (cd/A), power efficiency (lm/W), and external quantum efficiency (%) of each light-emitting element at a luminance of around 1000 cd/m².

TABLE 9

Initial performance of light-emitting element 7 and comparative light-emitting element 8 (reference element 8)

| | Voltage (V) | Current density (mA/cm²) | Chromaticity (x, y) | Luminance (cd/m²) | Current efficiency (cd/A) | External quantum efficiency (%) |
|---|---|---|---|---|---|---|
| Light-emitting element 7 | 2.9 | 1.3 | (0.43, 0.56) | 1118 | 84.6 | 23.5 |
| Reference element 8 | 2.8 | 0.9 | (0.44, 0.55) | 808 | 86.7 | 24.8 |

As shown in FIG. 37, FIG. 38, FIG. 39, FIG. 40, and Table 9, the luminance-current efficiency characteristics, the voltage-current characteristics, the voltage-luminance characteristics, and the luminance-external quantum efficiency characteristics of the light-emitting element 5 are almost the same as those of the comparative light-emitting element 6. In addition, as shown in FIG. 41, the light-emitting element 5 and the comparative light-emitting element 6 have almost the same emission spectra.

Figure 42A:
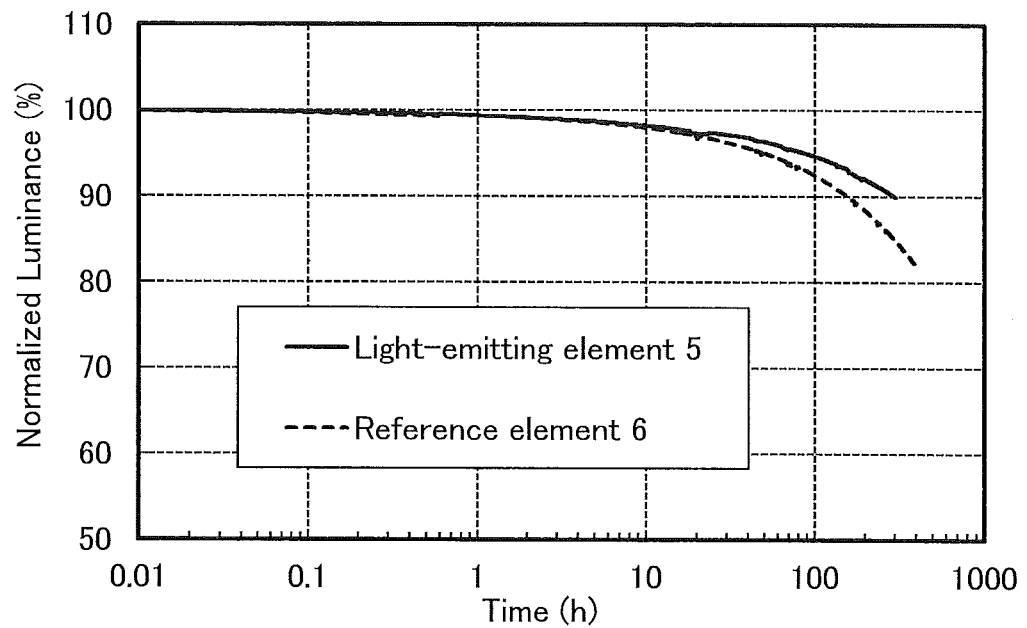
FIGS. 42A and 42B show reliability of the light emitting element 5 and the comparative light emitting element 6.
Figure 42B:
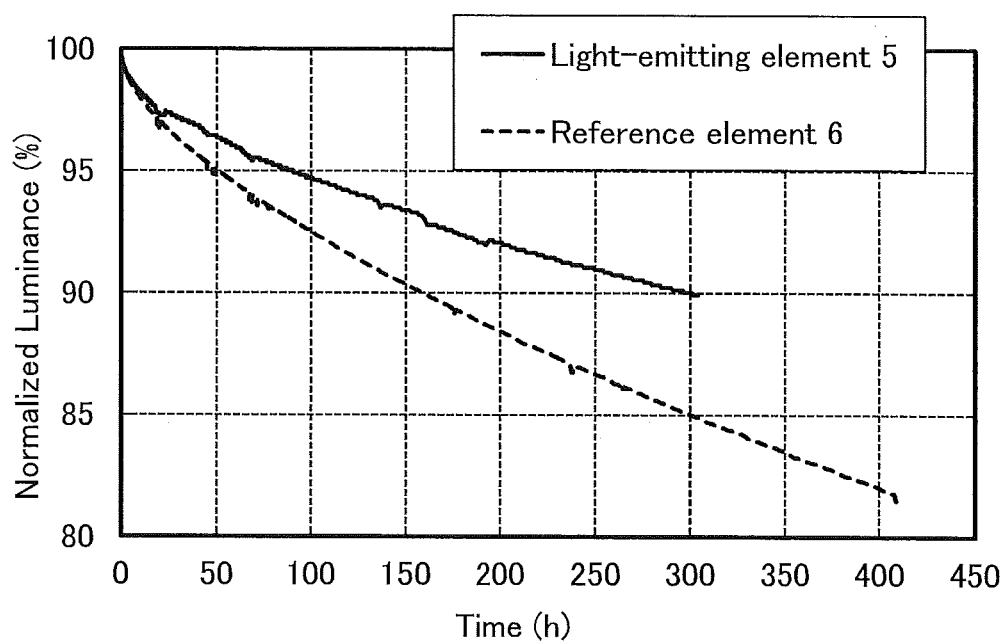

Next, the light-emitting element 5 and the comparative light-emitting element 6 were subjected to reliability tests. FIGS. 42A and 42B show results of the reliability tests. In FIGS. 42A and 42B, the vertical axis represents normalized luminance (%) with an initial luminance of 100% and the horizontal axis represents driving time (h) of the elements. In FIG. 42A, the horizontal axis is on a logarithmic scale. In FIG. 42B, the scales of the vertical and horizontal axes of FIG. 42A are expanded and the horizontal axis is on a linear scale.

In the reliability tests, the light-emitting element 5 and the comparative light-emitting element 6 of this example were driven under the conditions where the temperature was room temperature, the initial luminance was set to 5000 cd/m², and the current density was constant. According to the results shown in FIG. 42A, the light-emitting element 5 keeps 89.9% of the initial luminance after being driven for 304 hours, while the luminance of the comparative light-emitting element 6 decreases to 84.9% of the initial value after being driven for 304 hours. According to the results shown in FIG. 42B, the luminance of the light-emitting element 5 after 240 hours was 91.2% of the initial luminance; in contrast, the luminance of the comparative light-emitting element 6 after 240 hours was 87.0% of the initial luminance. As described above, a light-emitting element that keeps 90% or more of the initial luminance of 5000 cd/m² after 240 hours can be obtained by the method for fabricating a light-emitting element of one embodiment of the present invention.

The results of the reliability tests revealed that the light-emitting element 5 has a longer lifetime than the comparative light-emitting element 6. This example demonstrates that the light-emitting element having a long lifetime can be fabricated by the method for fabricating a light-emitting element of one embodiment of the present invention.

The difference in reliability between the light-emitting element 5 and the comparative light-emitting element 6 probably results from the fact that as shown in Table 7, the partial pressure of the impurity with m/z of 84 (corresponding to dichloromethane) in the film formation chamber was higher than or equal to $1\times10^{-12}$ Pa and lower than $1\times10^{-9}$ Pa during evaporation (including the steps before the heating, in the heating, and at the time of evaporation) when the light-emitting layer 1113 of the light-emitting element 5 was formed, whereas that of the comparative light-emitting element 6 was higher than or equal to $1\times10^{-9}$ Pa. In other words, the reliability is influenced by the larger amount of the impurity in the light-emitting layer 1113 of the comparative light-emitting element 6 than that in the light-emitting layer 1113 of the light-emitting element 5.

The above results indicate that in fabrication of the light-emitting element, the partial pressure of the residual gas with m/z of 84 is preferably higher than or equal to $1\times10^{-12}$ Pa and lower than $1\times10^{-9}$ Pa in heating of the material when the organic compound is evaporated.

This application is based on Japanese Patent Application serial no. 2013-135919 filed with the Japan Patent Office on Jun. 28, 2013, Japanese Patent Application serial no. 2013-179326 filed with the Japan Patent Office on Aug. 30, 2013, Japanese Patent Application serial no. 2013-179343 filed with the Japan Patent Office on Aug. 30, 2013, and Japanese Patent Application serial no. 2013-179351 filed with the Japan Patent Office on Aug. 30, 2013, the entire contents of which are hereby incorporated by reference.

What is claimed is:

1. A method for fabricating a semiconductor device, the method comprising:
   forming a film by evaporating an organic compound in a film-formation chamber,
   wherein a partial pressure of a component in the film-formation chamber is monitored during the evaporation by using a mass spectrometer, and wherein the component exhibits a m/z in a range from 46 to 200.

2. The method according to claim 1,
wherein the component exhibits the m/z in a range from 46 to 130.

3. The method according to claim 1,
wherein the component exhibits the m/z of 46, 84, 86, or 92.

4. The method according to claim 1,
wherein the organic compound is deposited when the partial pressure is in a range from $1.0 \times 10^{-12}$ Pa to $5.0 \times 10^{-8}$ Pa.

5. The method according to claim 4,
wherein the deposition is stopped when the partial pressure is higher than $5.0 \times 10^{-8}$ Pa.

6. The method according to claim 1,
wherein the semiconductor device is a light-emitting element.

7. A method for fabricating a semiconductor device, the method comprising:
   forming a film by co-evaporating a plurality of organic compounds in a film-formation chamber,
   wherein a partial pressure of a component in the film-formation chamber is monitored during the evaporation by using a mass spectrometer, and
   wherein the component exhibits a m/z in a range from 46 to 200.

8. The method according to claim 7,
wherein the component exhibits the m/z in a range from 46 to 130.

9. The method according to claim 7,
wherein the component exhibits the m/z of 46, 84, 86, or 92.

10. The method according to claim 7,
wherein the plurality of organic compounds are deposited when the partial pressure is in a range from $1.0 \times 10^{-12}$ Pa to $5.0 \times 10^{-8}$ Pa.

11. The method according to claim 10,
wherein the deposition is stopped when the partial pressure is higher than $5.0 \times 10^{-8}$ Pa.

12. The method according to claim 7,
wherein the plurality of organic compounds includes a first organic compound and a second organic compound, and
wherein the co-evaporation is performed so that the first organic compound is dispersed in the second organic compound in the film.

13. The method according to claim 12,
wherein the first organic compound exhibits a thermally activated delayed fluorescence.

14. The method according to claim 12,
wherein the plurality of organic compounds further includes a third organic compound which forms an exciplex with the second organic compound, and
wherein the first organic compound is a phosphorescent substance.

15. The method according to claim 7,
wherein the semiconductor device is a light-emitting element.

* * * * *